US010811535B2

(12) United States Patent
Masuoka et al.

(10) Patent No.: US 10,811,535 B2
(45) Date of Patent: Oct. 20, 2020

(54) SEMICONDUCTOR DEVICE INCLUDING SURROUNDING GATE TRANSISTOR HAVING A GATE ELECTRODE WITH INCLINED SIDE SURFACE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/143,725

(22) Filed: May 2, 2016

(65) Prior Publication Data

US 2016/0247938 A1 Aug. 25, 2016

Related U.S. Application Data

(63) Continuation of application No. PCT/JP2014/053745, filed on Feb. 18, 2014.

(51) Int. Cl.
*H01L 23/535* (2006.01)
*H01L 29/78* (2006.01)
(Continued)

(52) U.S. Cl.
CPC ......... *H01L 29/785* (2013.01); *H01L 23/535* (2013.01); *H01L 29/42392* (2013.01);
(Continued)

(58) Field of Classification Search
CPC ............. H01L 23/525; H01L 29/42392; H01L 23/535; H01L 29/785; H01L 29/66666
See application file for complete search history.

(56) References Cited

U.S. PATENT DOCUMENTS 4,630,088 A * 12/1986 Ogura ............... H01L 27/10823
257/302
5,627,390 A * 5/1997 Maeda ..................... H01L 21/84
257/302
(Continued)

FOREIGN PATENT DOCUMENTS

JP H0271556 A 3/1990
JP H02188966 A 7/1990
(Continued)

OTHER PUBLICATIONS

Sze et al., Physics of Semiconductor Devices, Third Edition, John Wiley & Sons, Inc., pp. 297-298 (Year: 2007).*
(Continued)

*Primary Examiner* — Cuong Q Nguyen
*Assistant Examiner* — Shih Tsun A Chou
(74) *Attorney, Agent, or Firm* — Brinks Gilson & Lione

(57) ABSTRACT

An SGT production method includes a first step of forming a fin-shaped semiconductor layer and a first insulating film; a second step of forming a second insulating film, depositing a first polysilicon, planarizing the first polysilicon, forming a third insulating film, forming a second resist, and etching the third insulating film, the first polysilicon, the second insulating film, and the fin-shaped semiconductor layer to form a pillar-shaped semiconductor layer, a first dummy gate, and a first hard mask; and a third step of forming a fourth insulating film, depositing a second polysilicon, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon to form a second dummy gate.

2 Claims, 44 Drawing Sheets

(51) Int. Cl.
*H01L 29/66* (2006.01)
*H01L 29/423* (2006.01)
*H01L 29/786* (2006.01)
*H01L 29/775* (2006.01)
*H01L 29/06* (2006.01)

(52) U.S. Cl.
CPC .. *H01L 29/66545* (2013.01); *H01L 29/66666* (2013.01); *H01L 29/66772* (2013.01); *H01L 29/7827* (2013.01); *H01L 29/78642* (2013.01); *H01L 29/78654* (2013.01); *H01L 29/78696* (2013.01); *H01L 29/0676* (2013.01); *H01L 29/66439* (2013.01); *H01L 29/775* (2013.01); *H01L 2029/7858* (2013.01)

(56) References Cited

U.S. PATENT DOCUMENTS

| | | | | |
|---|---|---|---|---|
| 5,831,899 | A * | 11/1998 | Wang | G11C 11/412 365/156 |
| 6,200,860 | B1 * | 3/2001 | Chiang | H01L 27/11521 257/E21.682 |
| 6,975,014 | B1 * | 12/2005 | Krivokapic | H01L 29/42384 257/506 |
| 7,595,248 | B2 * | 9/2009 | Hattendorf | H01L 21/26586 257/E21.248 |
| 8,080,458 | B2 * | 12/2011 | Masuoka | H01L 29/42356 257/E21.41 |
| 8,143,668 | B2 * | 3/2012 | Morita | H01L 21/82381 257/330 |
| 8,378,425 | B2 * | 2/2013 | Masuoka | H01L 21/845 257/368 |
| 8,569,140 | B2 * | 10/2013 | Kim | H01L 21/28114 257/E21.444 |
| 8,647,947 | B2 * | 2/2014 | Masuoka | H01L 21/823885 438/268 |
| 9,117,908 | B2 * | 8/2015 | Xie | H01L 21/0217 |
| 9,178,040 | B2 * | 11/2015 | Ting | H01L 29/66666 |
| 9,520,474 | B2 * | 12/2016 | Chang | H01L 29/42376 |
| 2004/0262681 | A1 * | 12/2004 | Masuoka | H01L 29/42384 257/335 |
| 2007/0001173 | A1 * | 1/2007 | Brask | H01L 21/30608 257/67 |
| 2009/0170302 | A1 * | 7/2009 | Shin | H01L 29/4236 438/589 |
| 2010/0207199 | A1 * | 8/2010 | Masuoka | H01L 29/78642 257/329 |
| 2010/0219483 | A1 * | 9/2010 | Masuoka | H01L 27/0207 257/369 |
| 2010/0264485 | A1 * | 10/2010 | Masuoka | H01L 29/42356 257/329 |
| 2010/0270611 | A1 * | 10/2010 | Masuoka | H01L 21/823885 257/329 |
| 2011/0018056 | A1 * | 1/2011 | Takeuchi | H01L 21/76895 257/329 |
| 2011/0042740 | A1 * | 2/2011 | Masuoka | H01L 21/76804 257/329 |
| 2011/0115011 | A1 * | 5/2011 | Masuoka | H01L 21/82343 257/314 |
| 2011/0303985 | A1 * | 12/2011 | Masuoka | H01L 21/84 257/369 |
| 2014/0131794 | A1 * | 5/2014 | Ting | H01L 29/66666 257/334 |
| 2014/0145206 | A1 * | 5/2014 | Siemieniec | H01L 29/7808 257/77 |
| 2015/0236132 | A1 * | 8/2015 | Chang | H01L 29/66795 257/288 |

FOREIGN PATENT DOCUMENTS

| | | |
|---|---|---|
| JP | H03145761 H | 6/1991 |
| JP | 2009070975 A | 4/2009 |
| JP | 2009182317 A | 8/2009 |
| JP | 2011040682 A | 2/2011 |
| JP | 2013239622 A | 11/2013 |
| WO | 2014024266 A1 | 2/2014 |

OTHER PUBLICATIONS

Andrew R. Neureuther, Simulation of Semiconductor Lithography and Topography (Year: 1996).*

English language translation of International Preliminary Report on Patentability in corresponding International Application No. PCT/JP2014/053745, dated Sep. 1, 2016, 7 pages.

Mistry, K., et al. "A 45nm Logic Technology with High-k+Metal Gate Transistors, Strained Silicon, 9 Cu Interconnect Layers, 193nm Dry Patterning, and 100% Pb-free Packaging". Logic Technology Development, *Components Research, #QRE, %TCAD, Intel Corp., Hillsboro, OR, U.S.A.

Wu, CC., et al. "High Performance 22/20nm FinFET CMOS Devices with Advanced High-K/Metal Gate Scheme". Research & Development, Taiwan Semiconductor Manufacturing Company No. 8, Li-Hsin Rd. 6, Hsinchu Science Park, Hsinchu, Taiwan, R.O.C., Tel: +886-3-5636688, Email: CCWUD@tsmc.com.

* cited by examiner

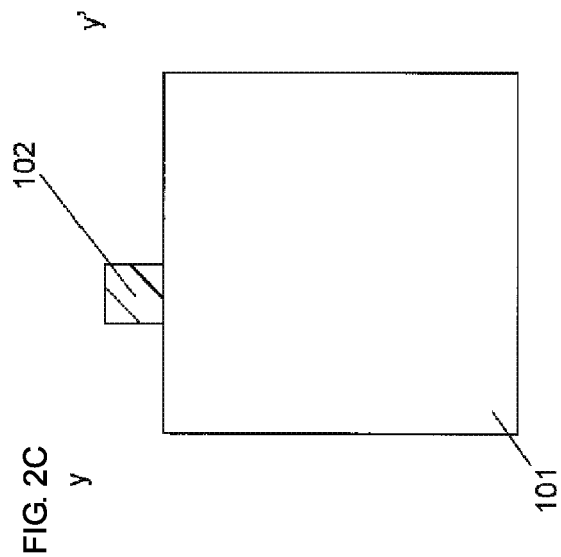
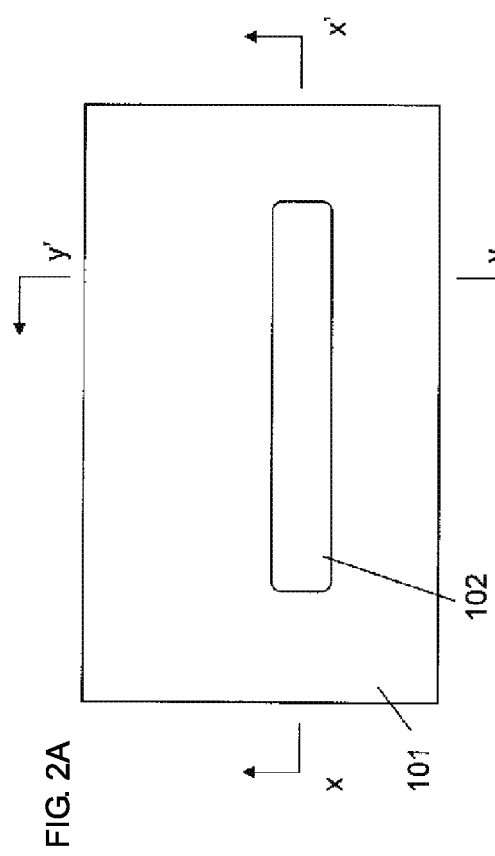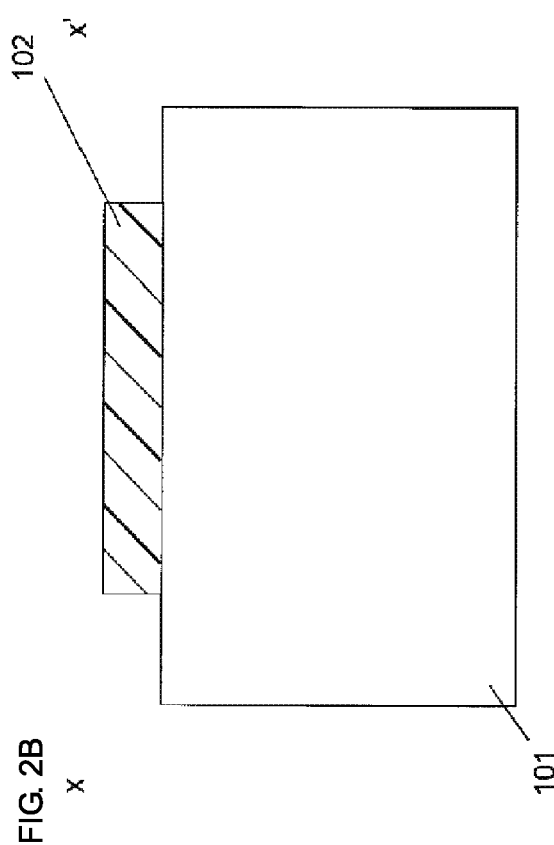

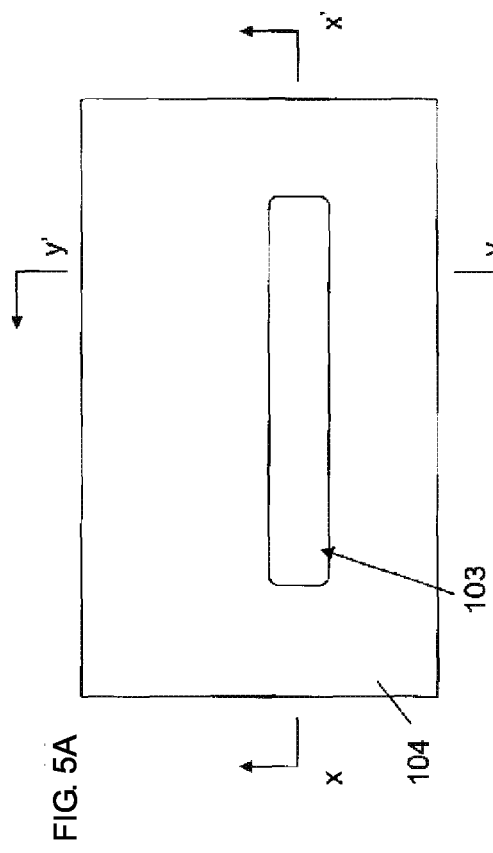
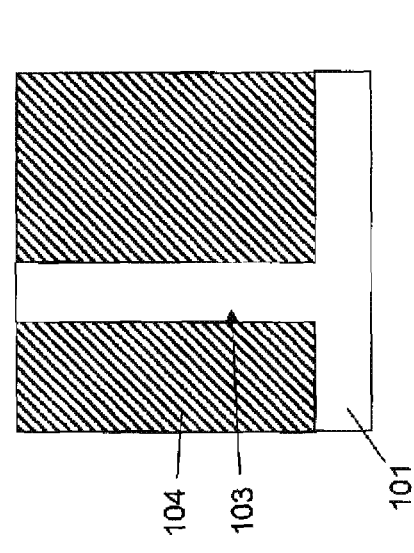
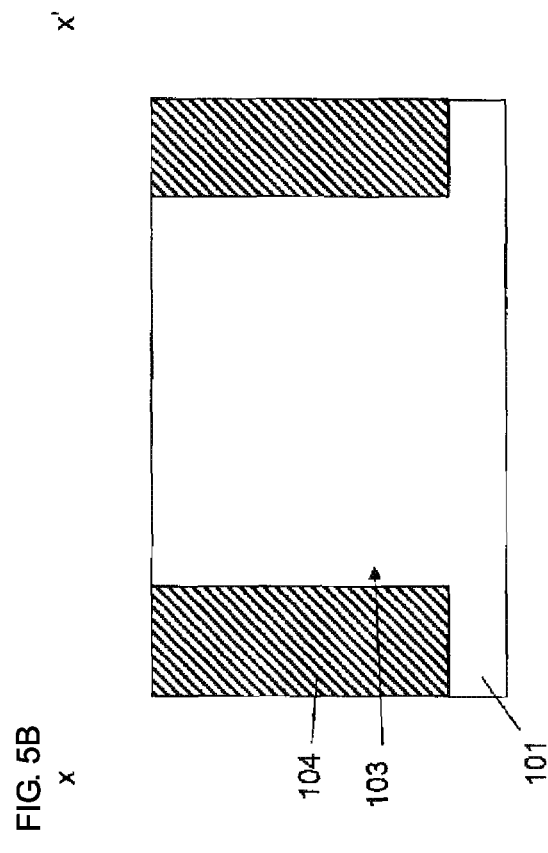
FIG. 5A
FIG. 5B
FIG. 5C

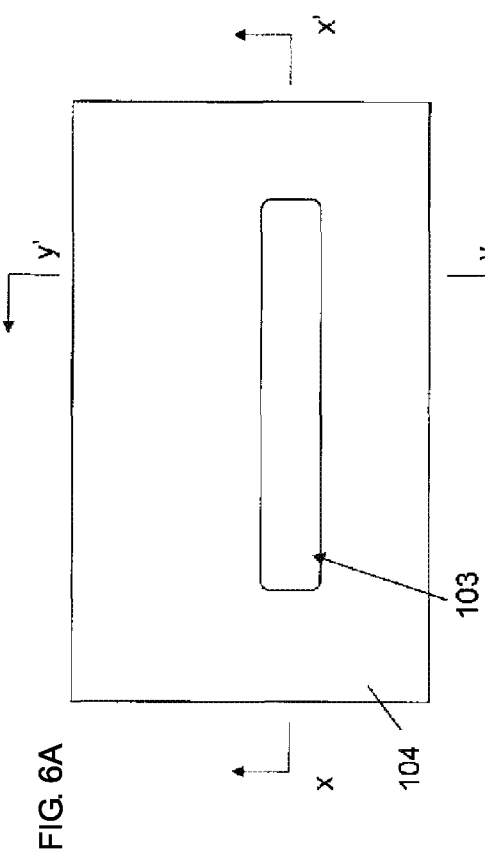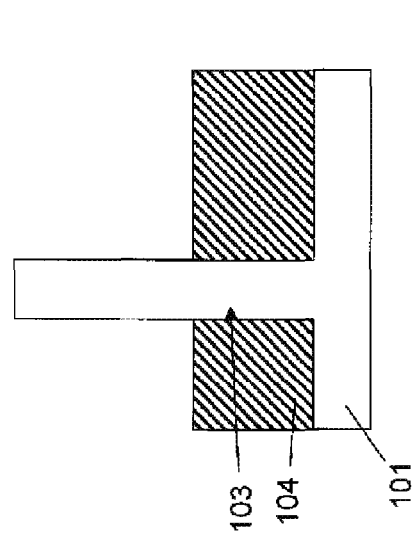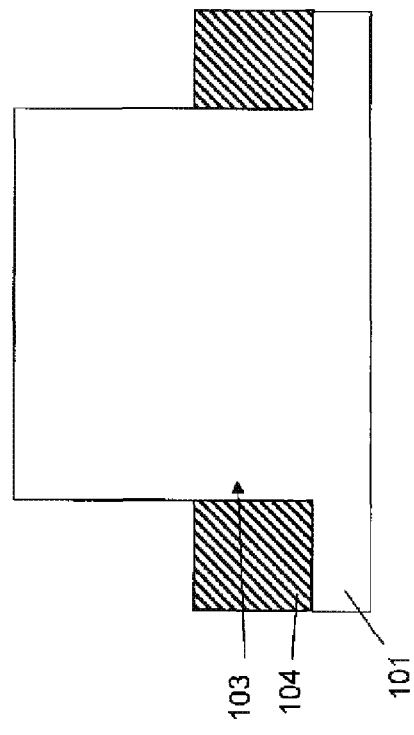

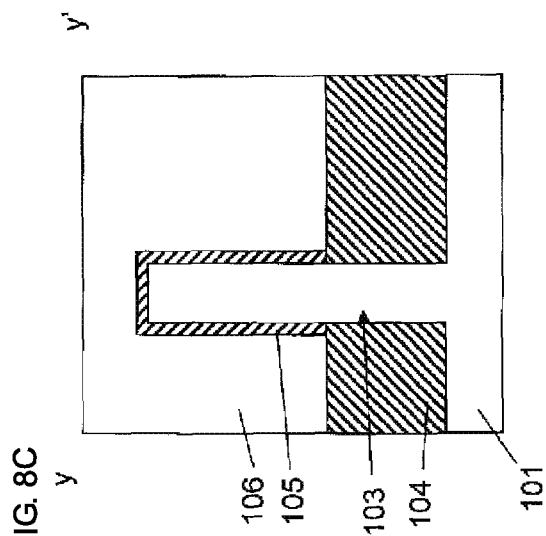
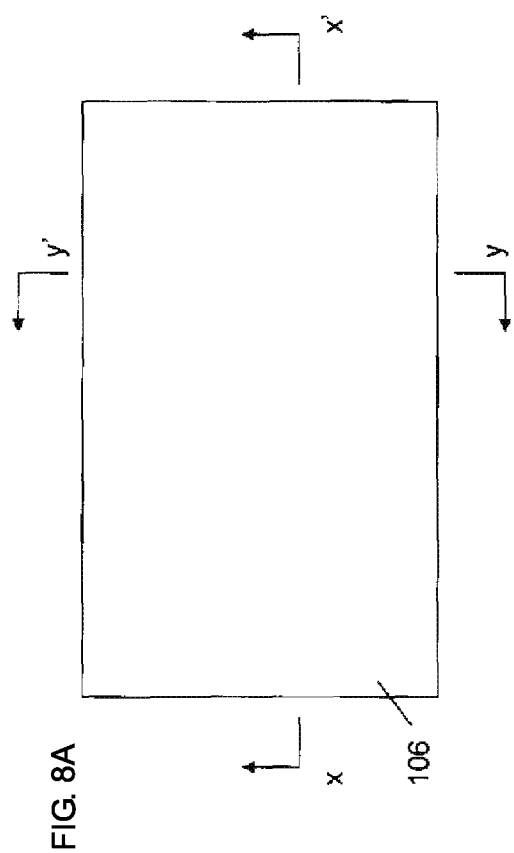
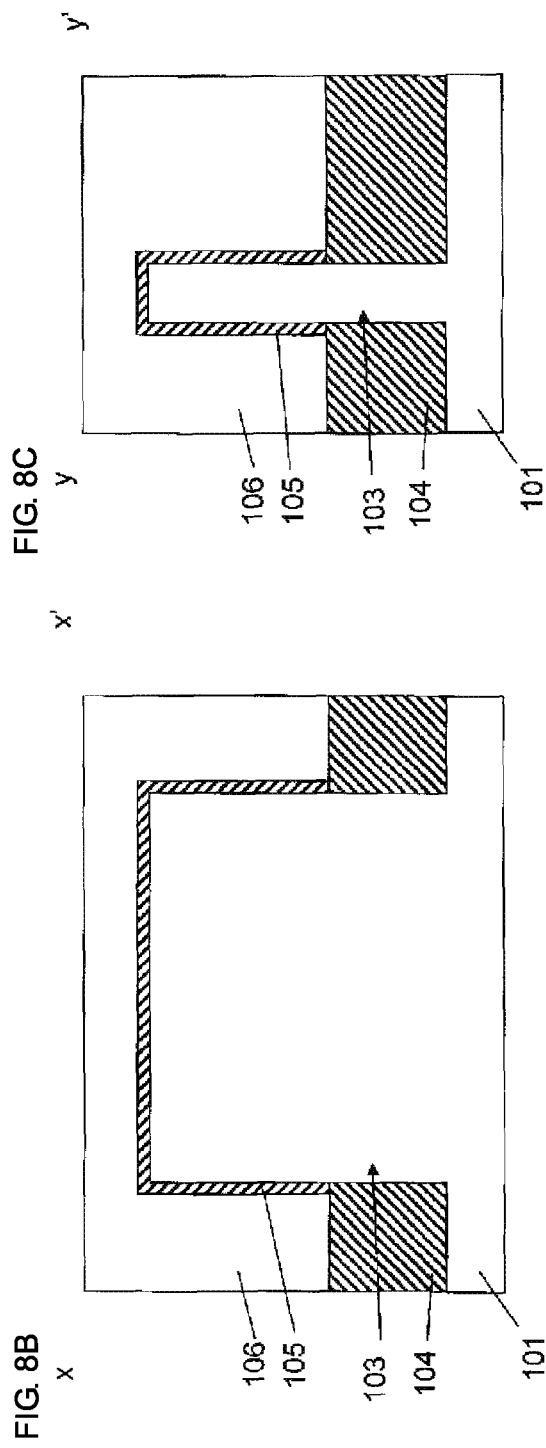

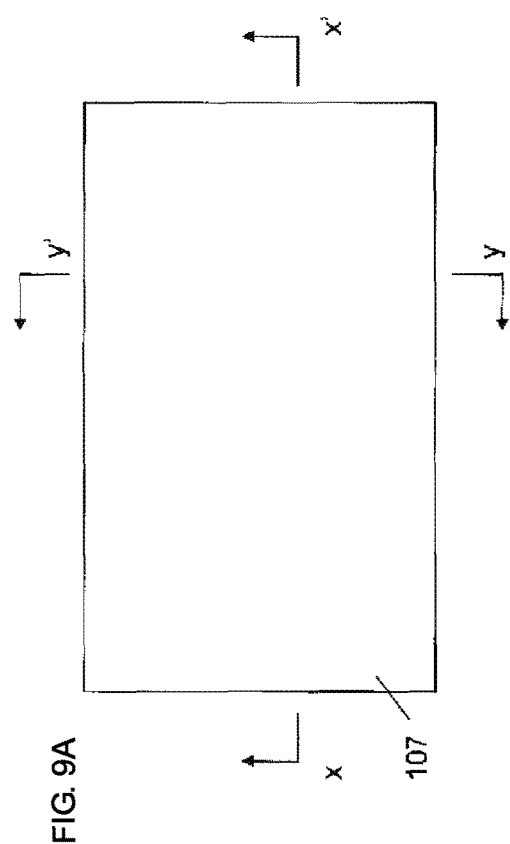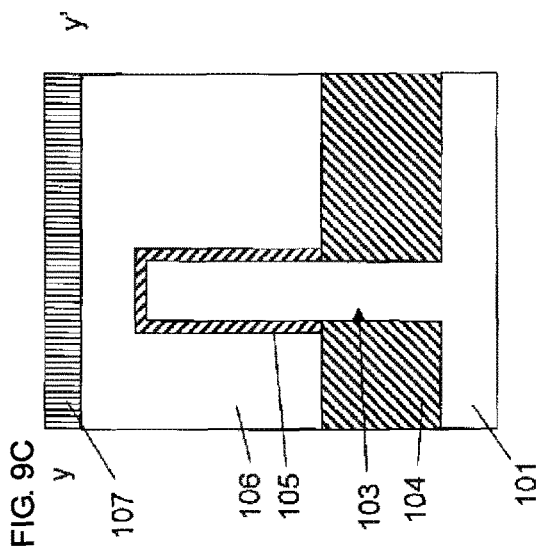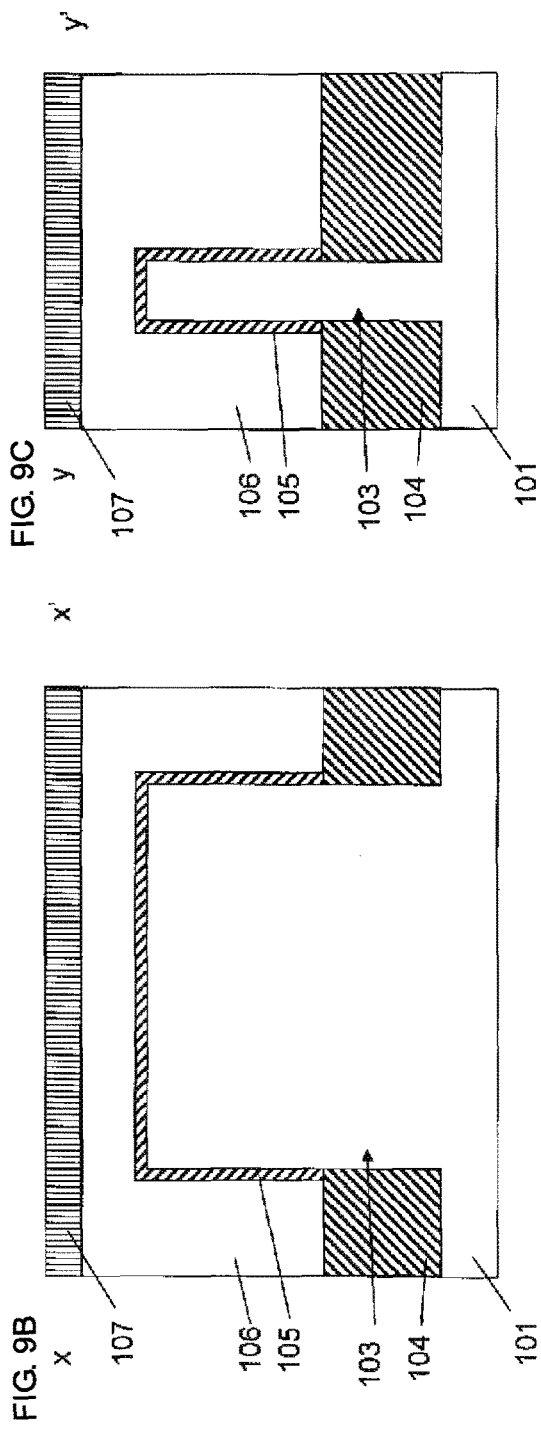

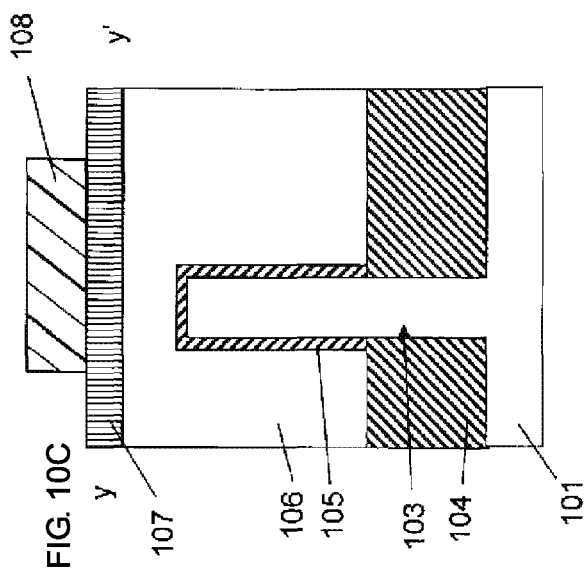
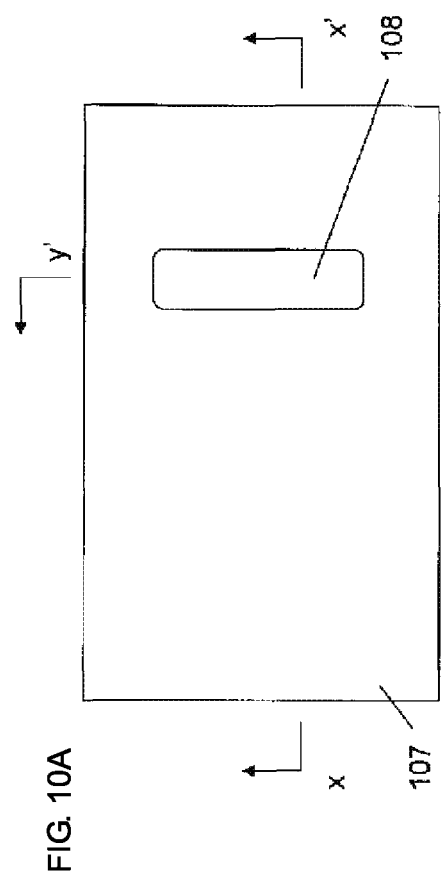
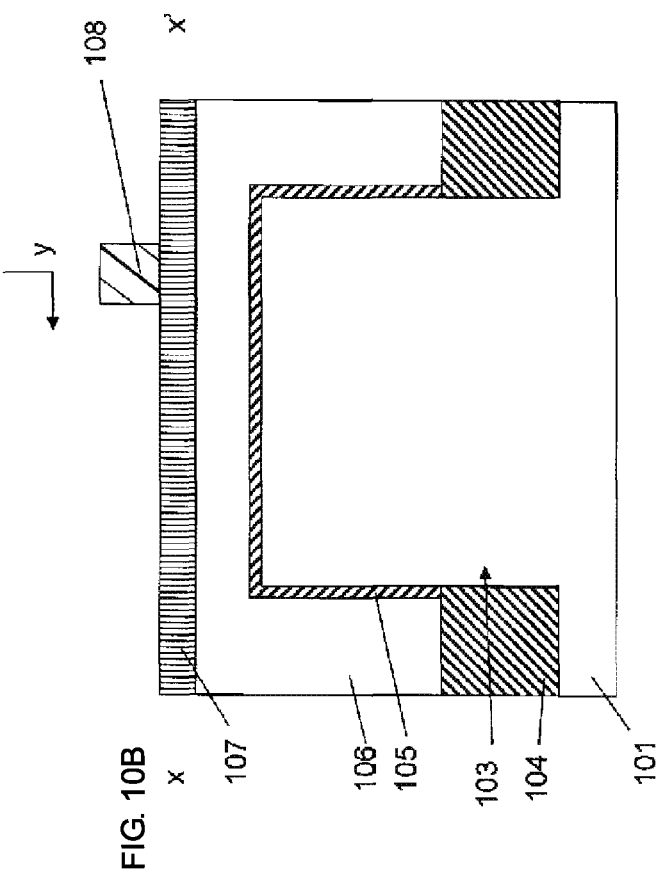
FIG. 10A
FIG. 10B
FIG. 10C

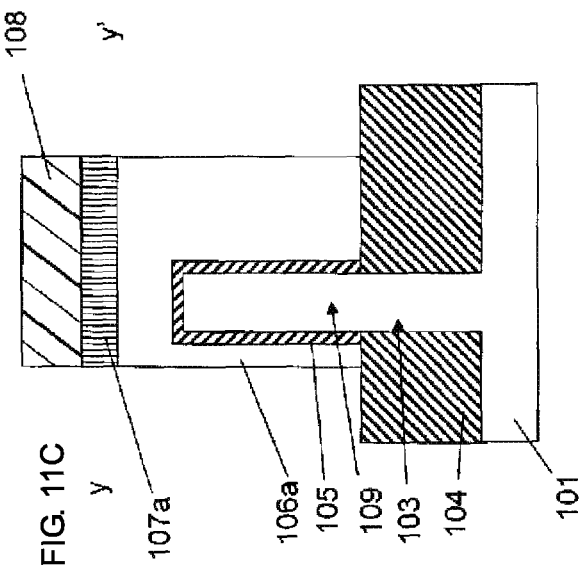
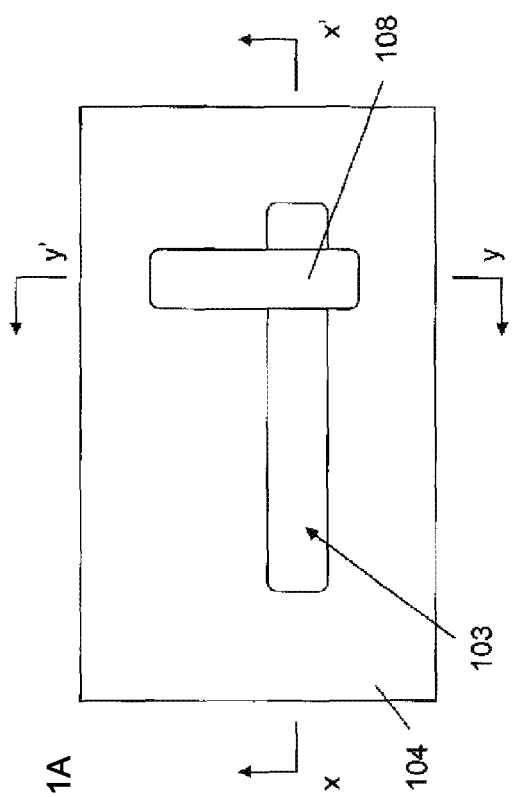
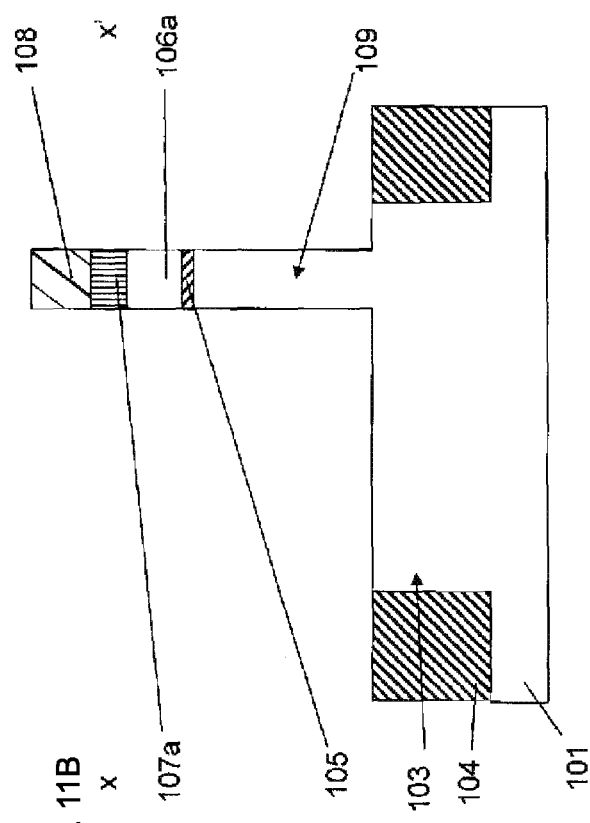

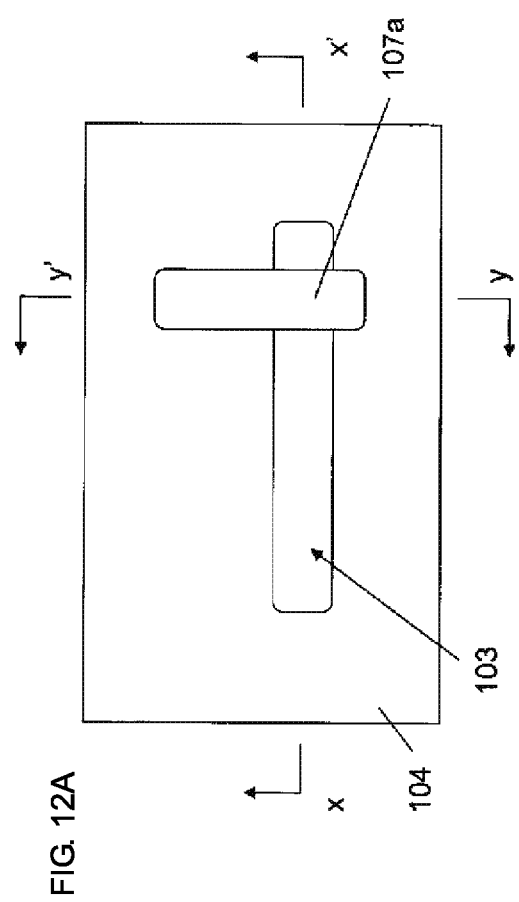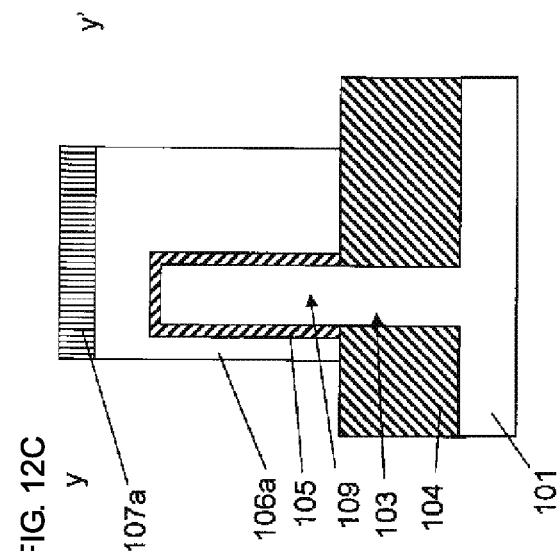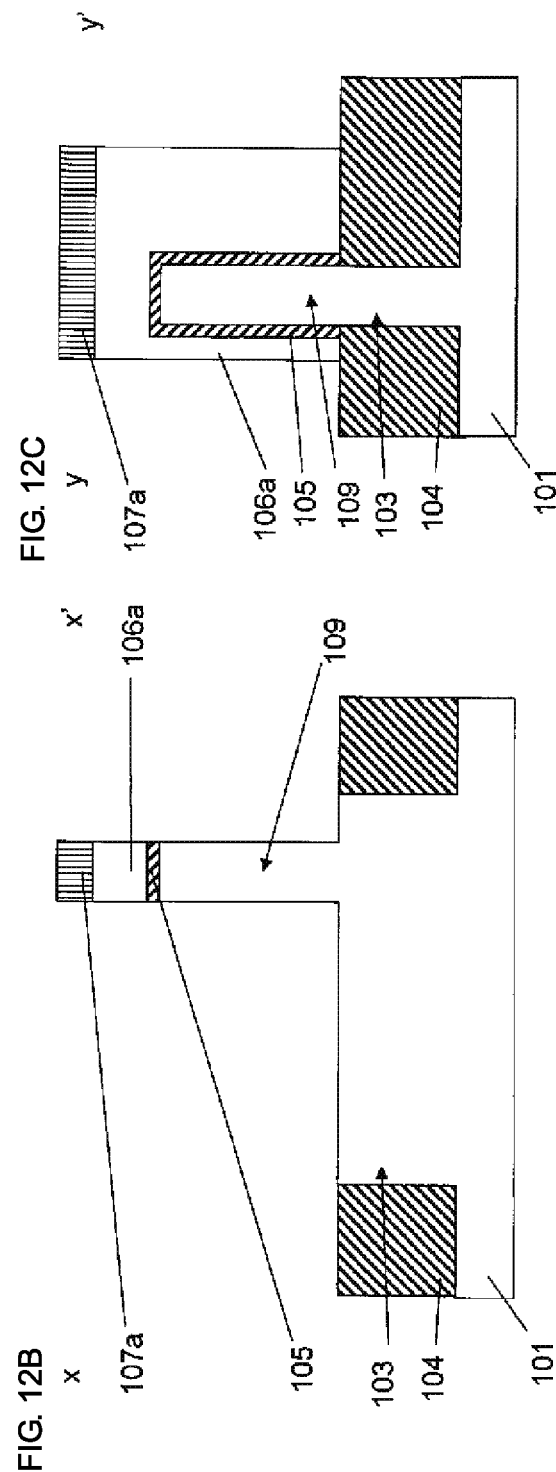
FIG. 12A
FIG. 12B
FIG. 12C

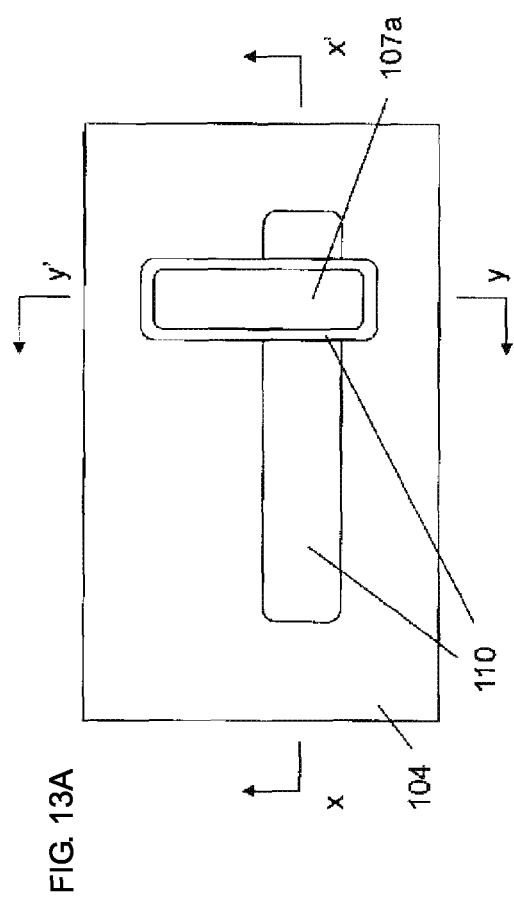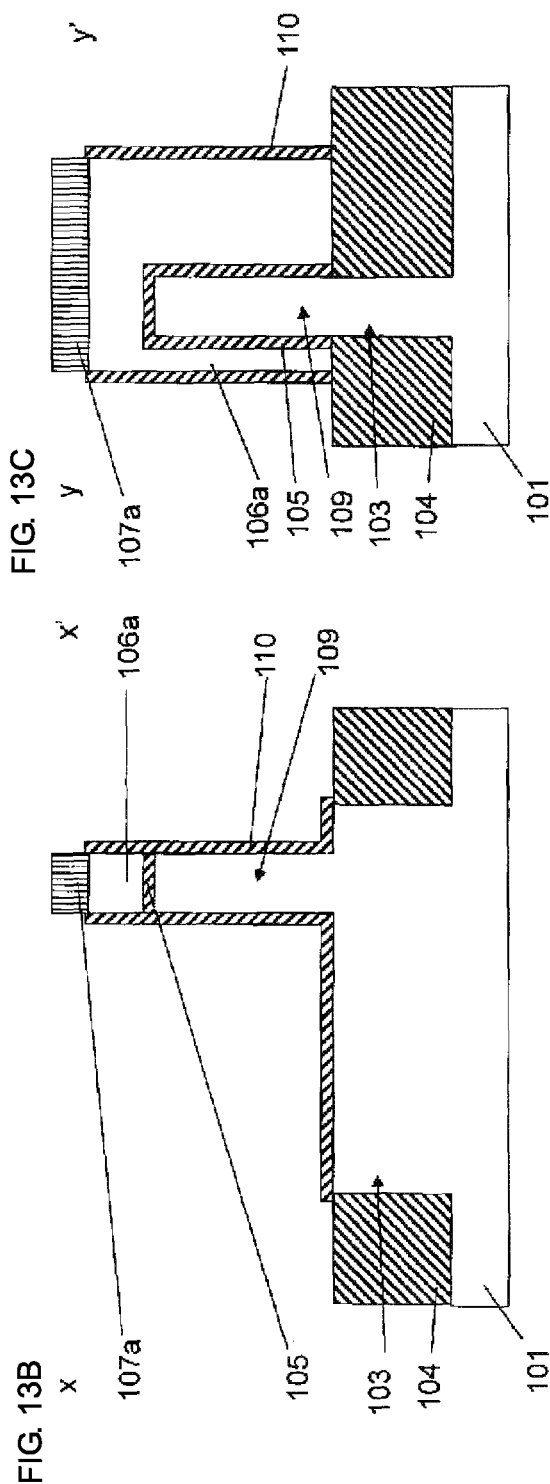
FIG. 13A
FIG. 13B
FIG. 13C

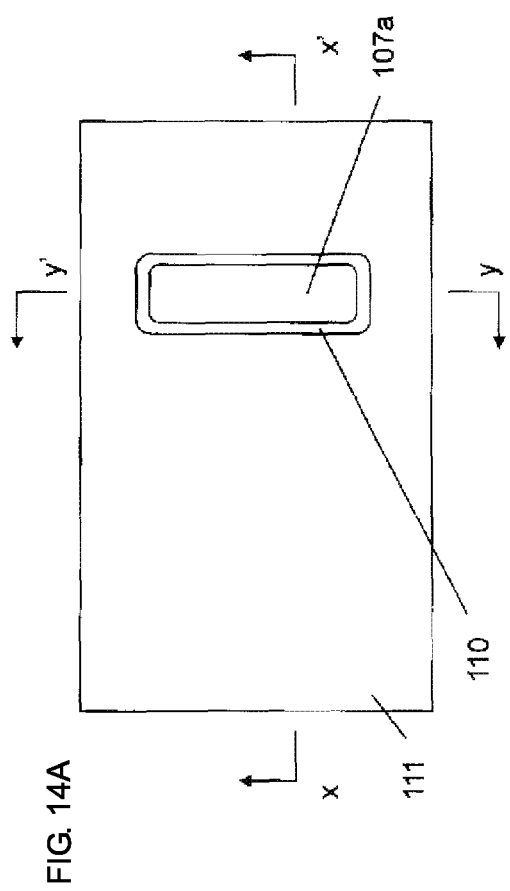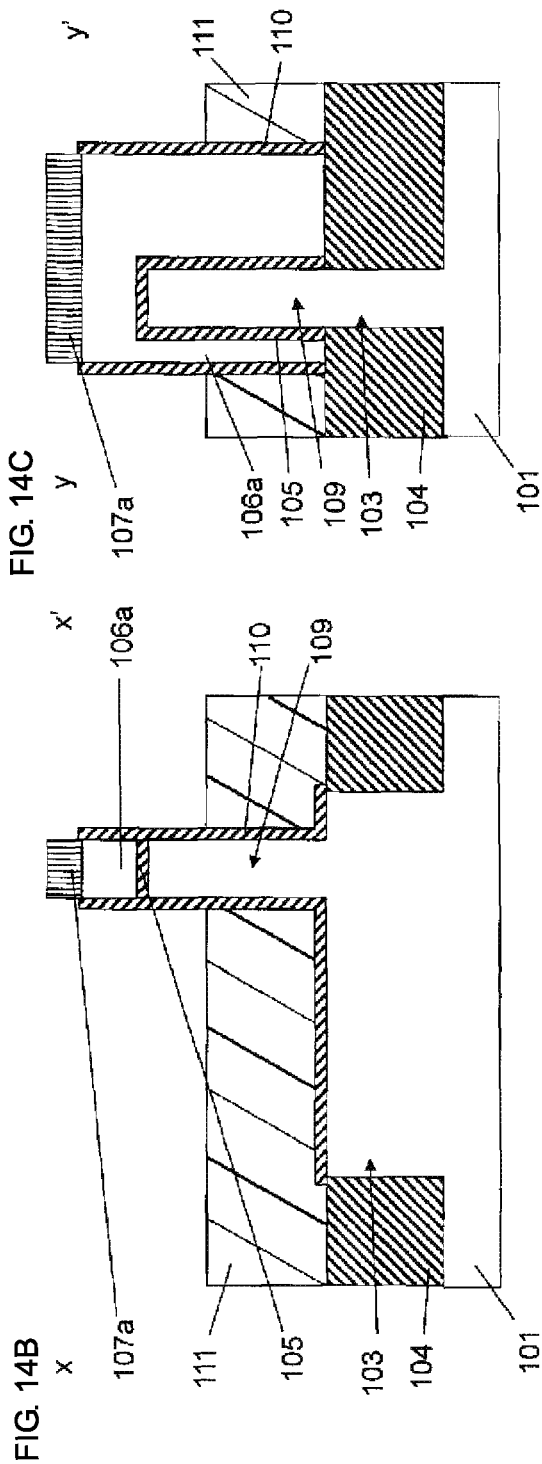

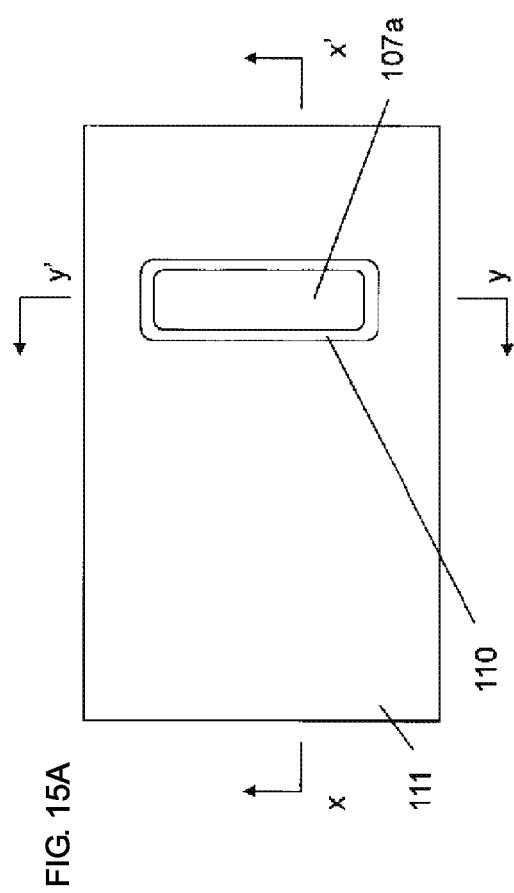
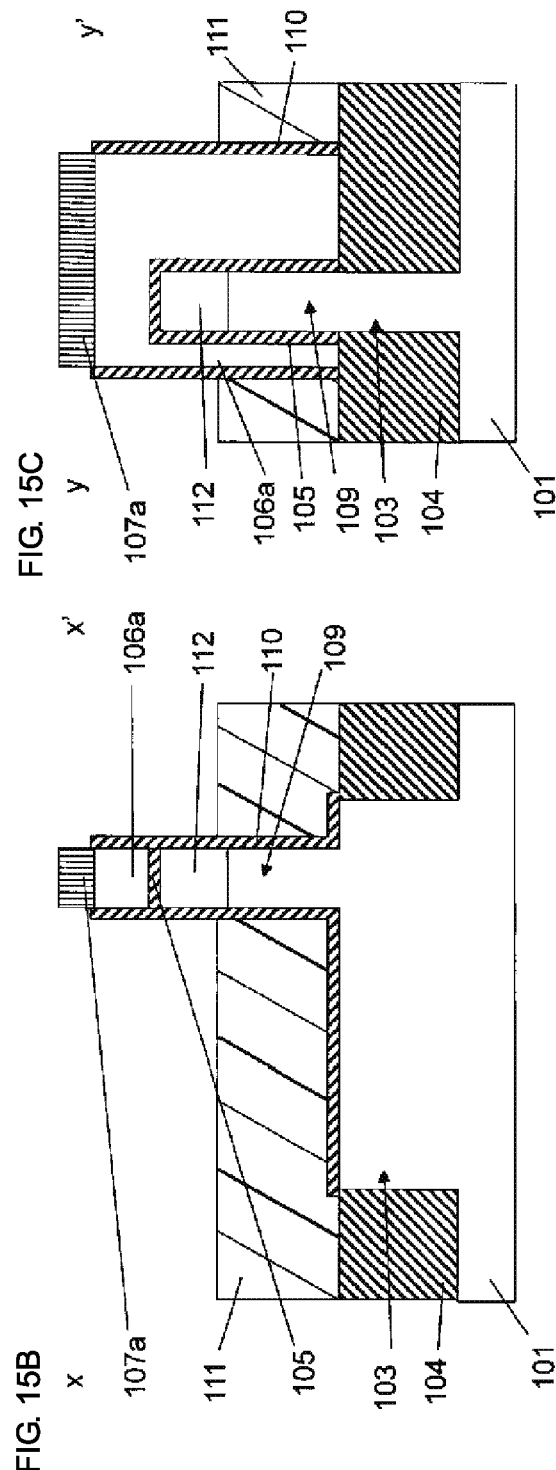

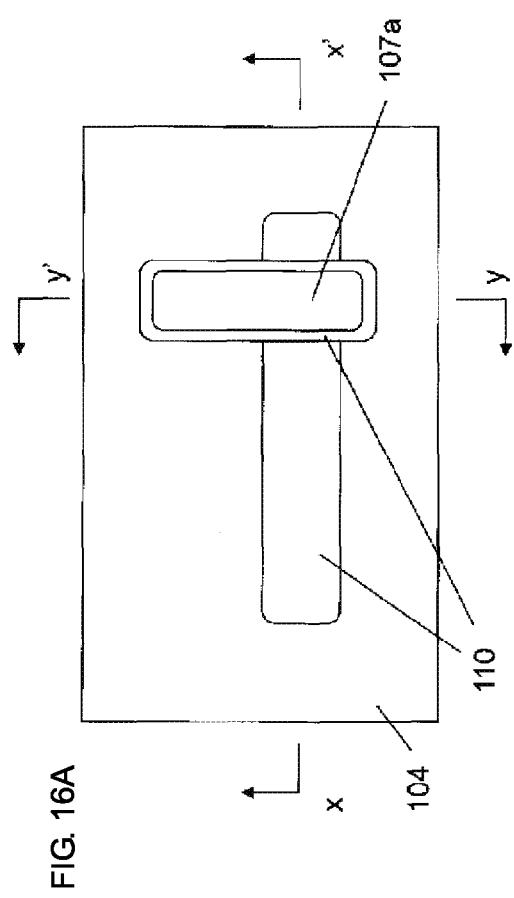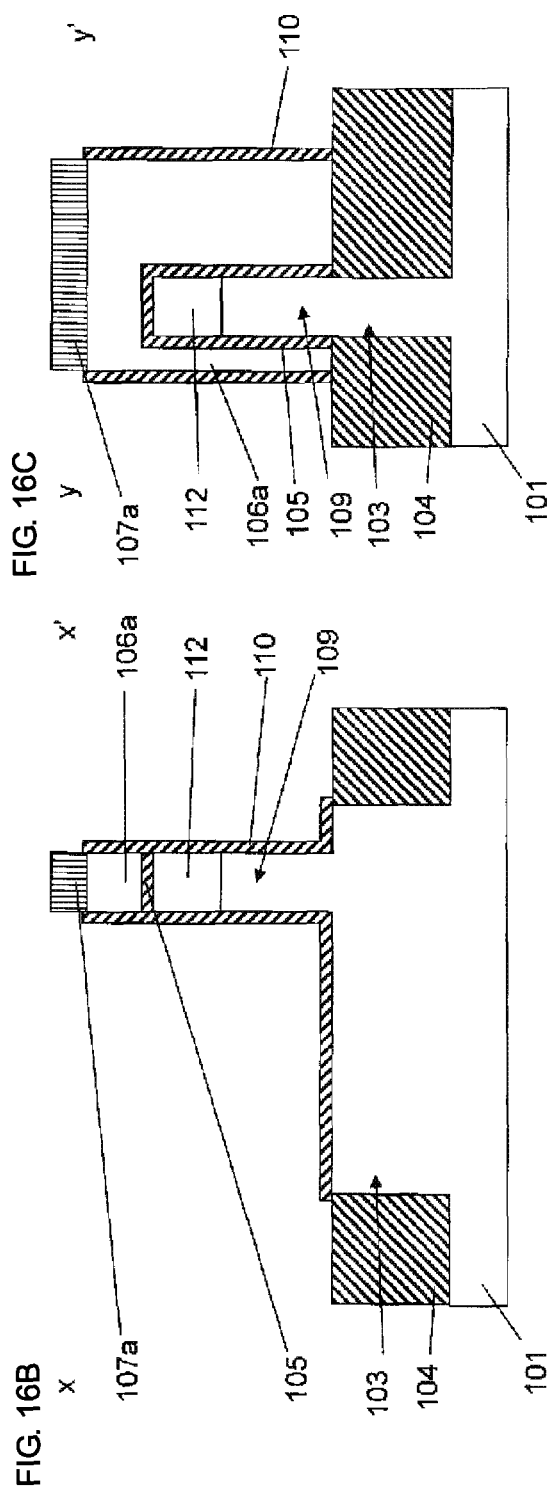

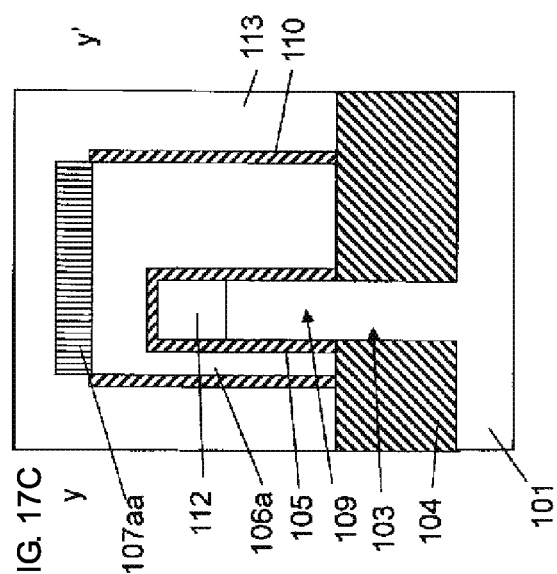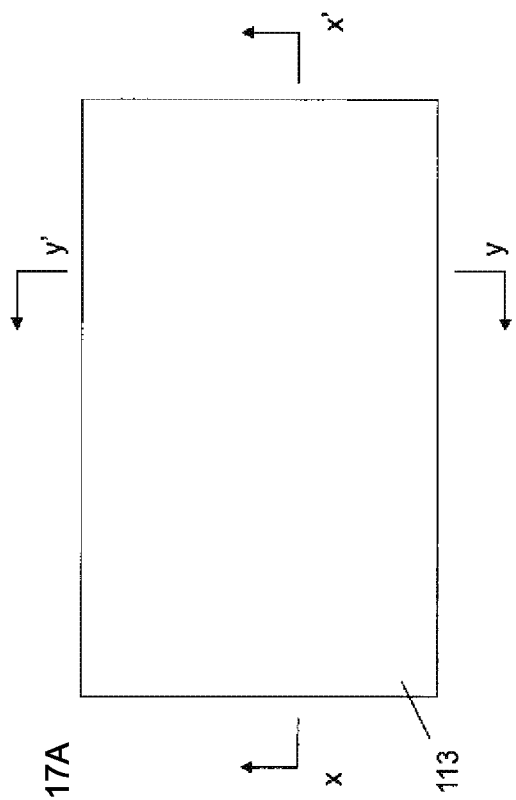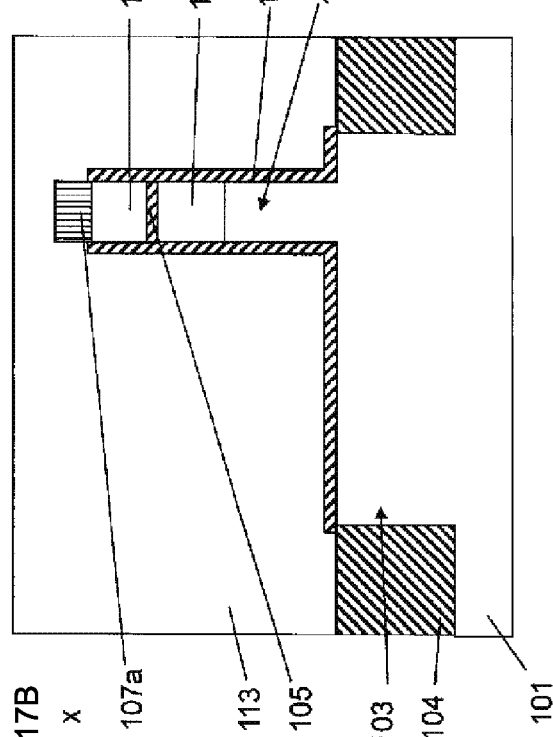

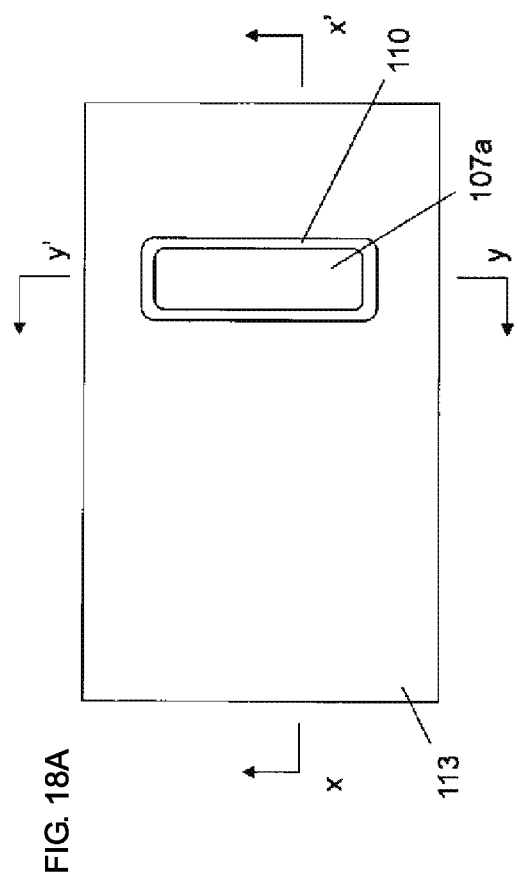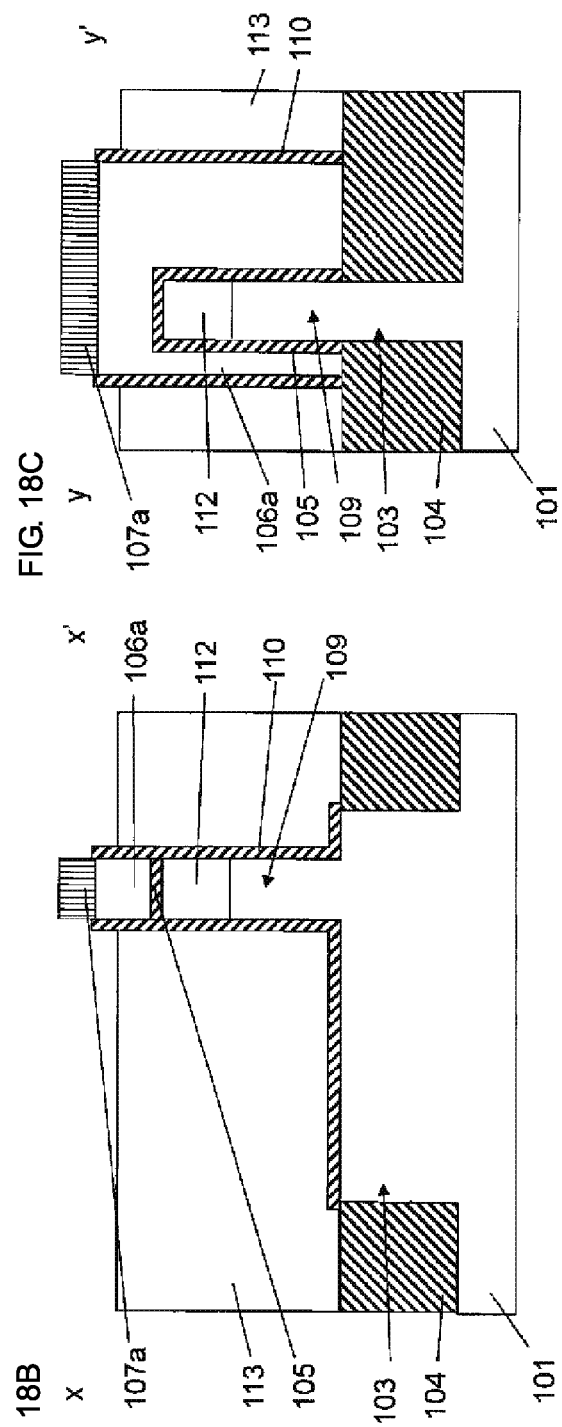

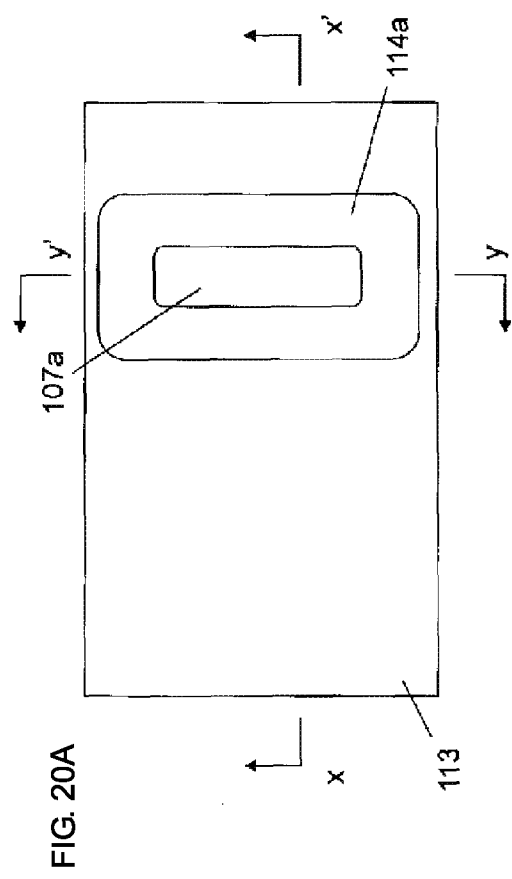
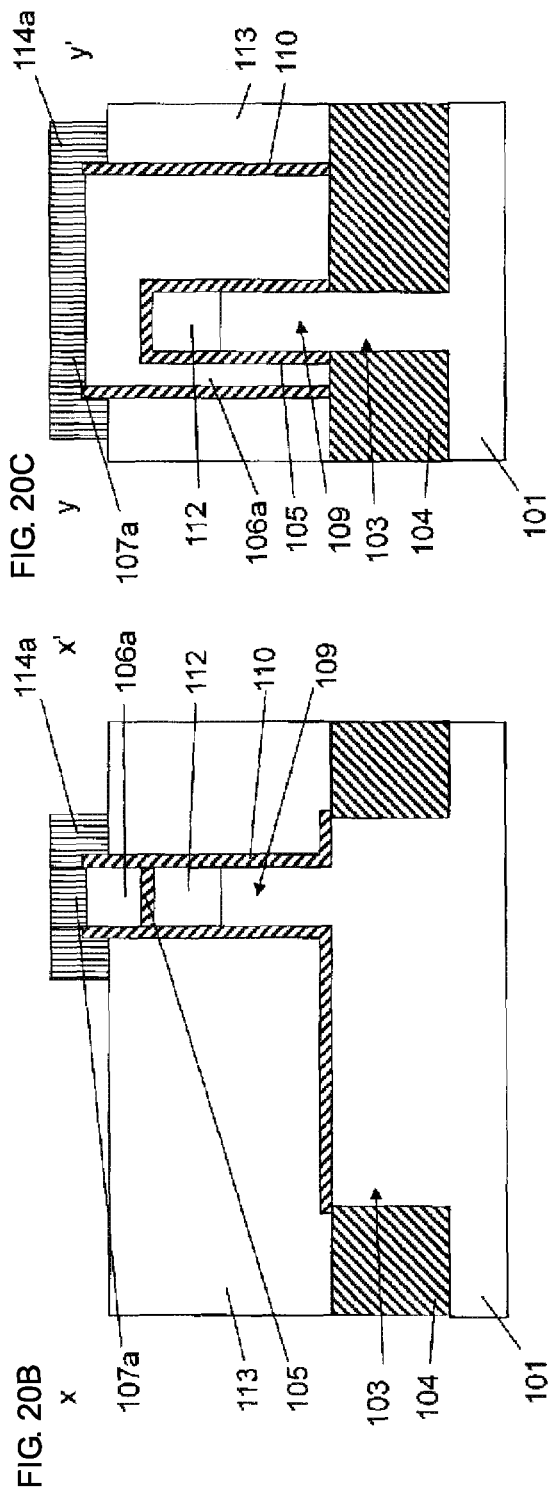

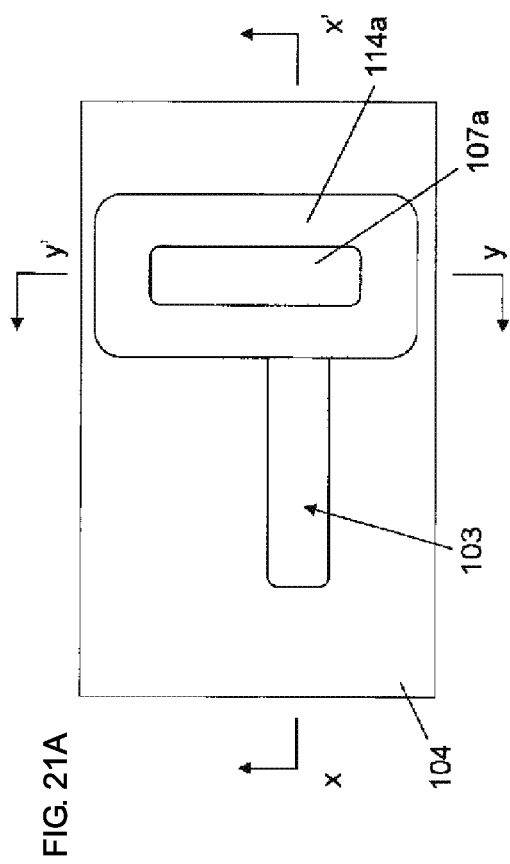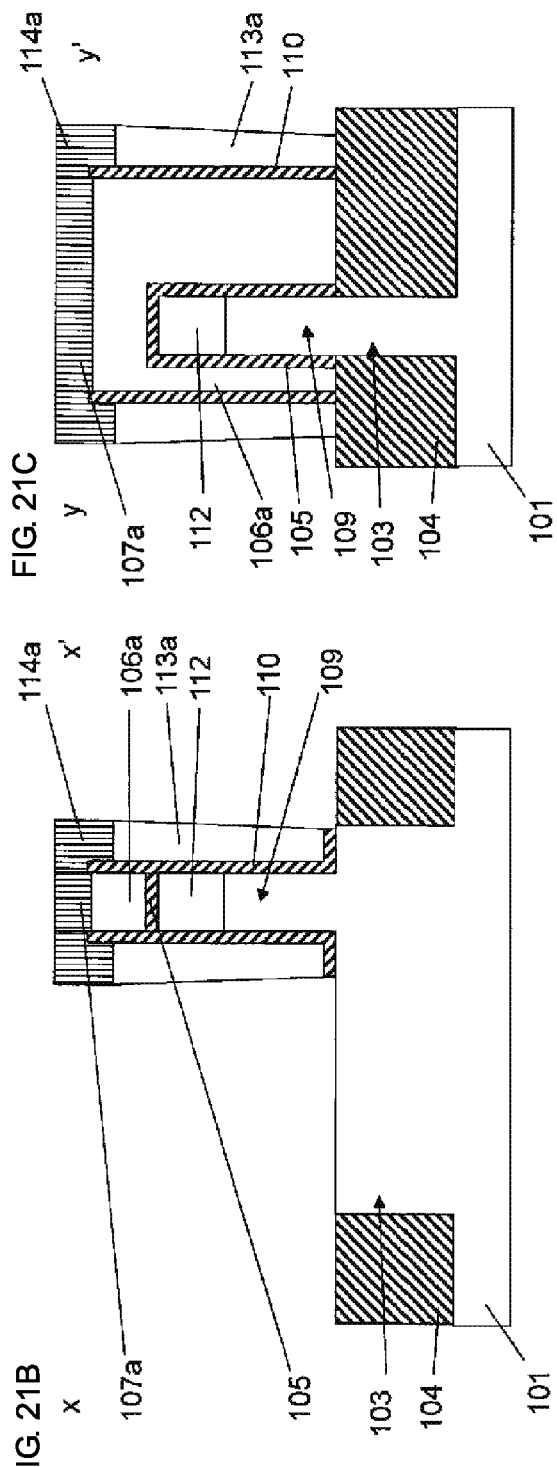

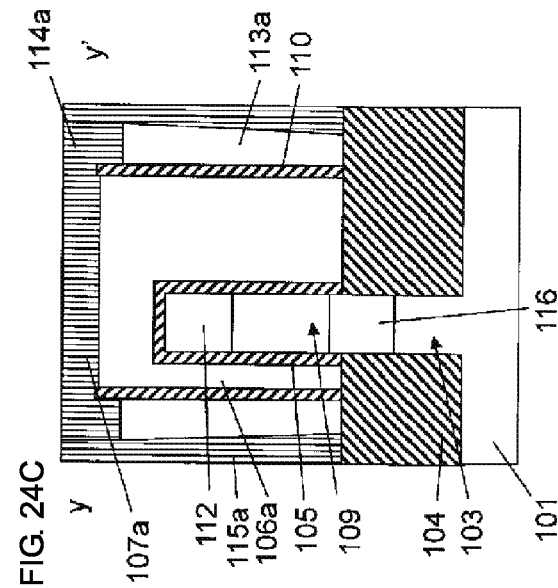
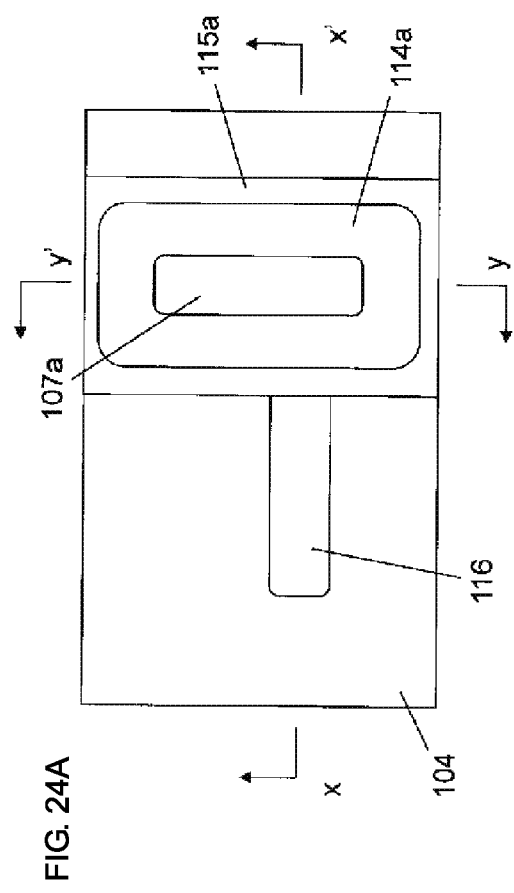
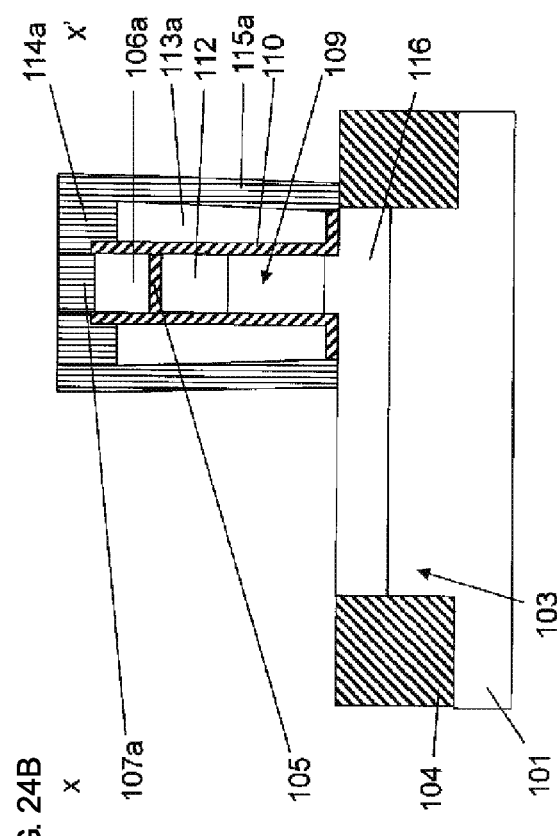

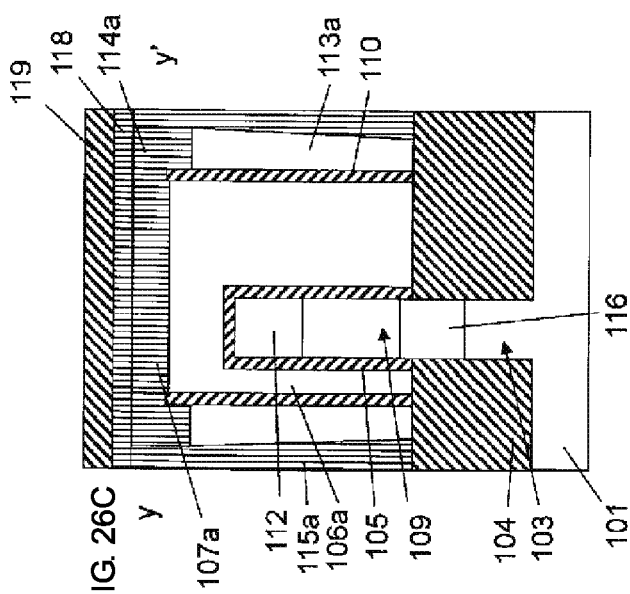
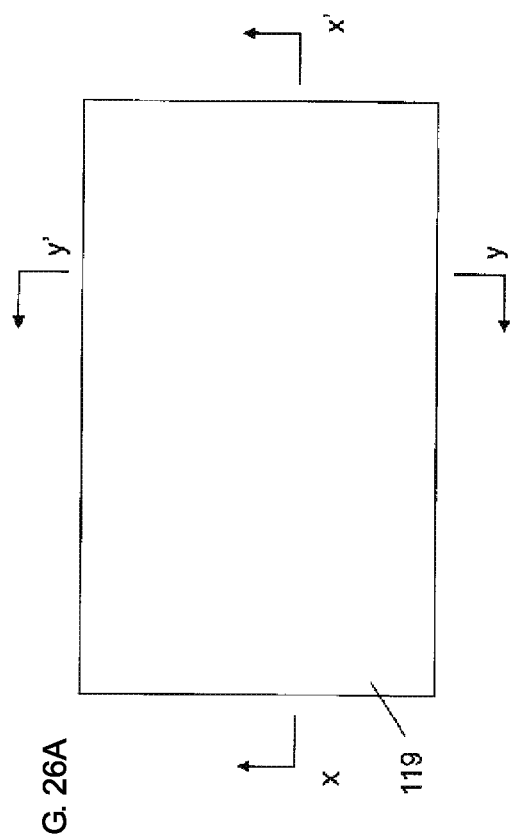
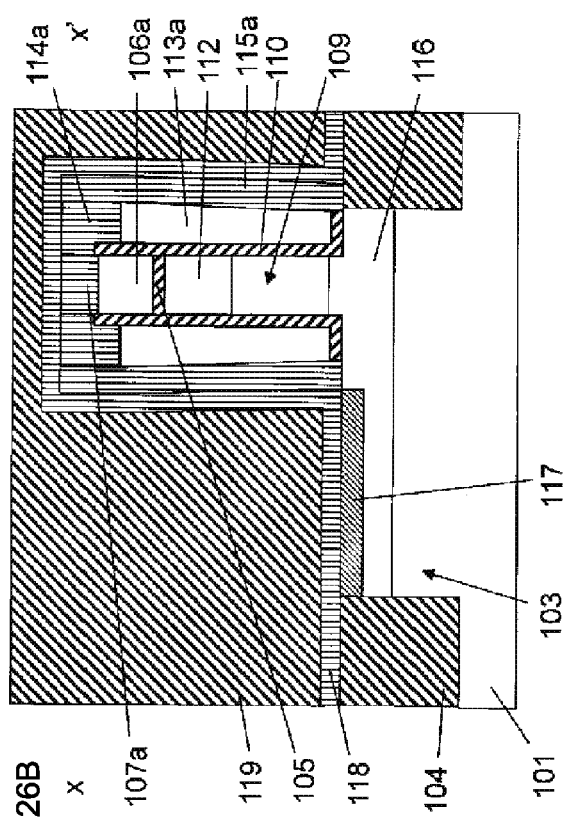

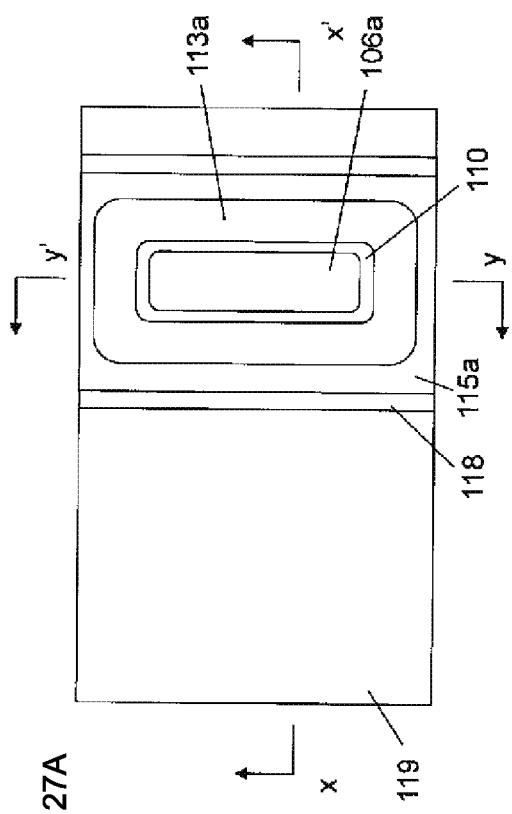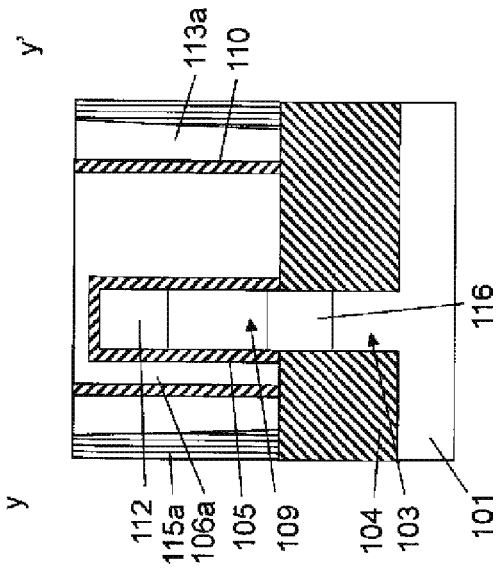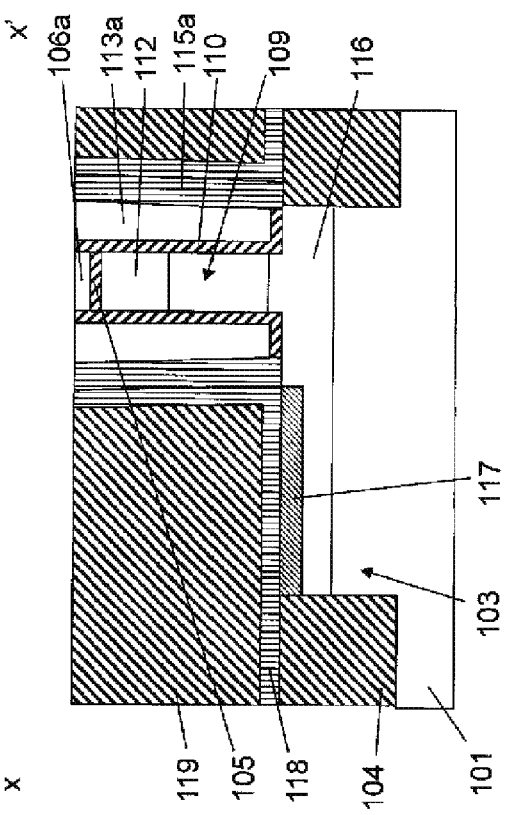
FIG. 27A
FIG. 27B
FIG. 27C

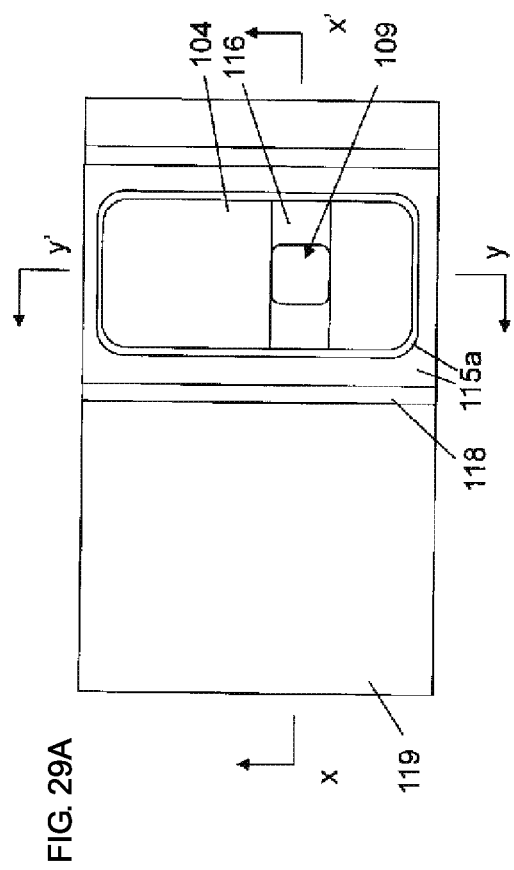
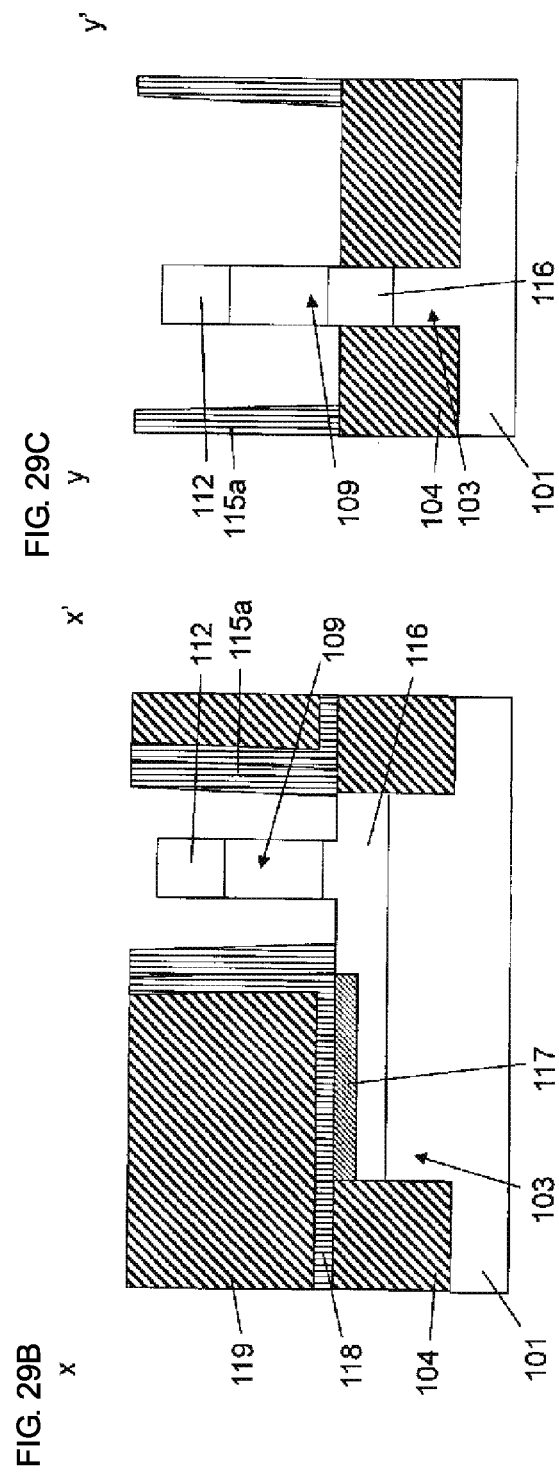
FIG. 29A
FIG. 29B
FIG. 29C

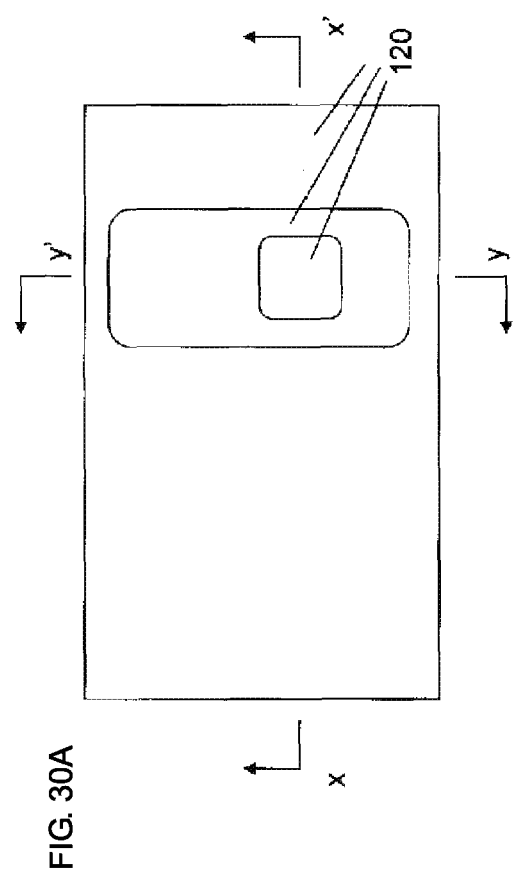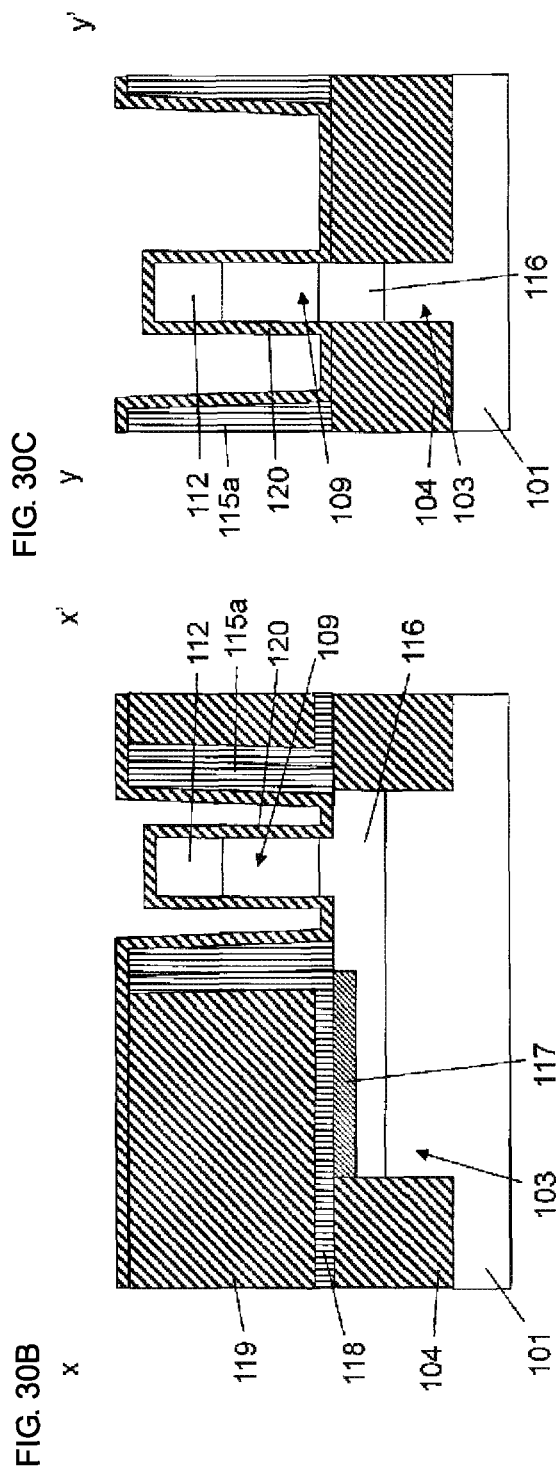

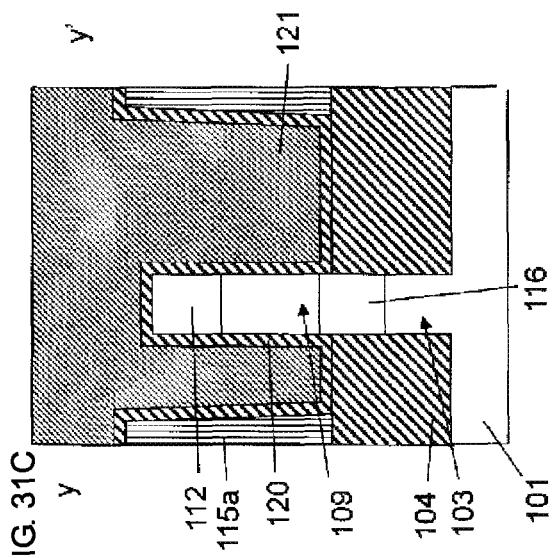
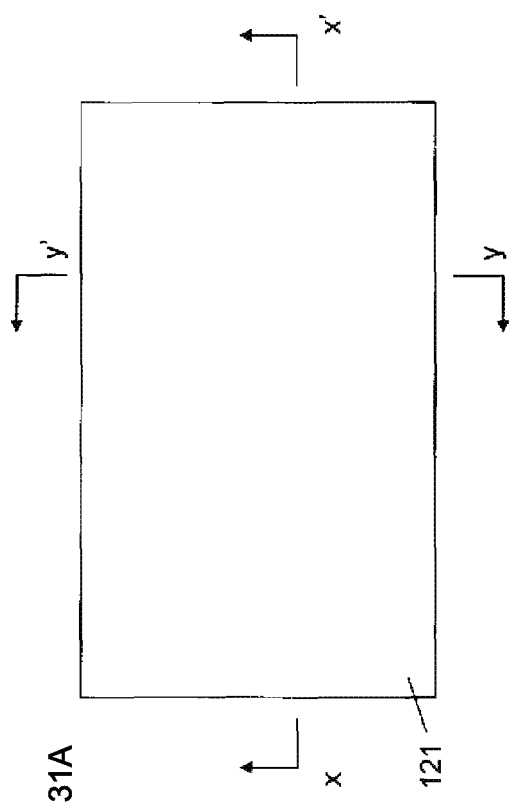
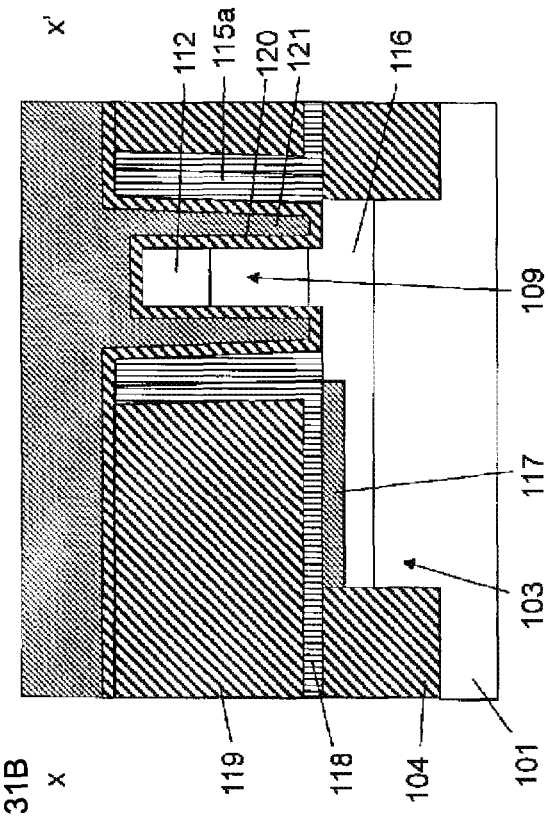

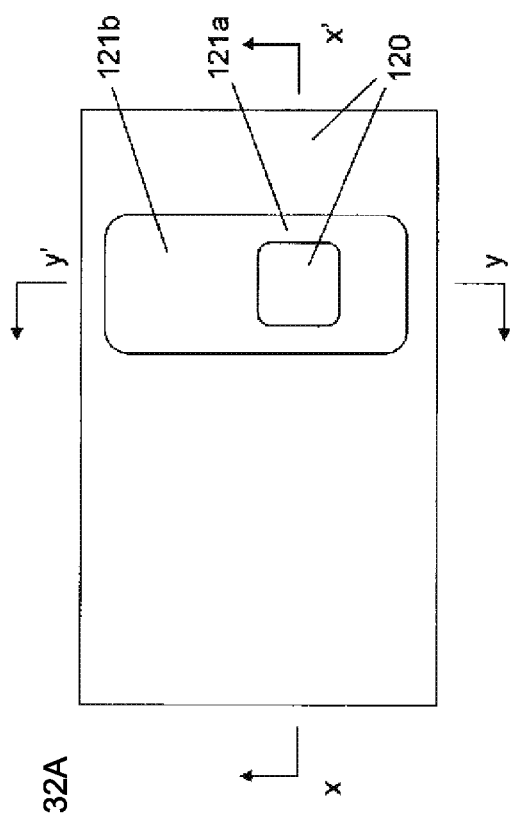
FIG. 32A
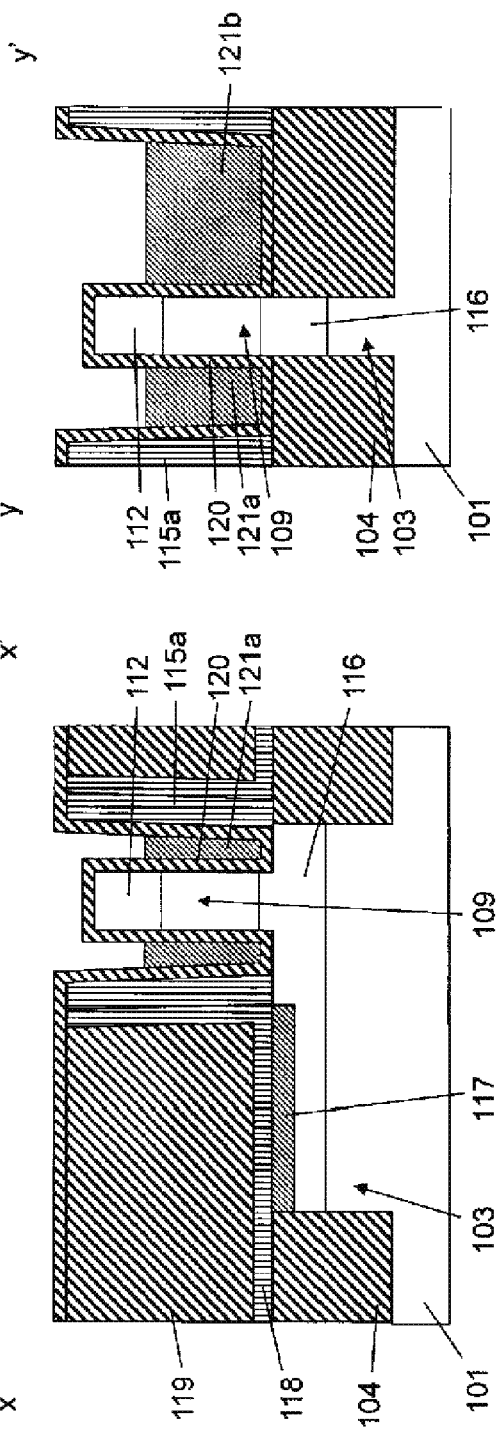
FIG. 32B
FIG. 32C

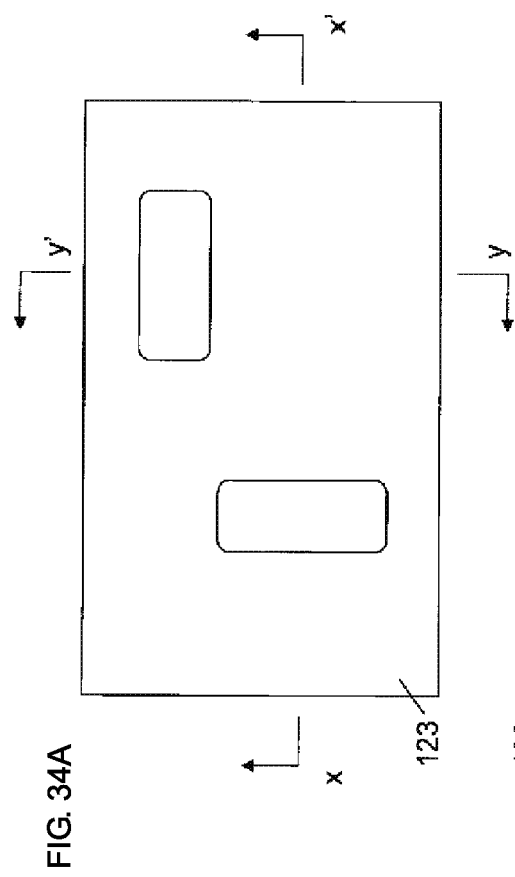
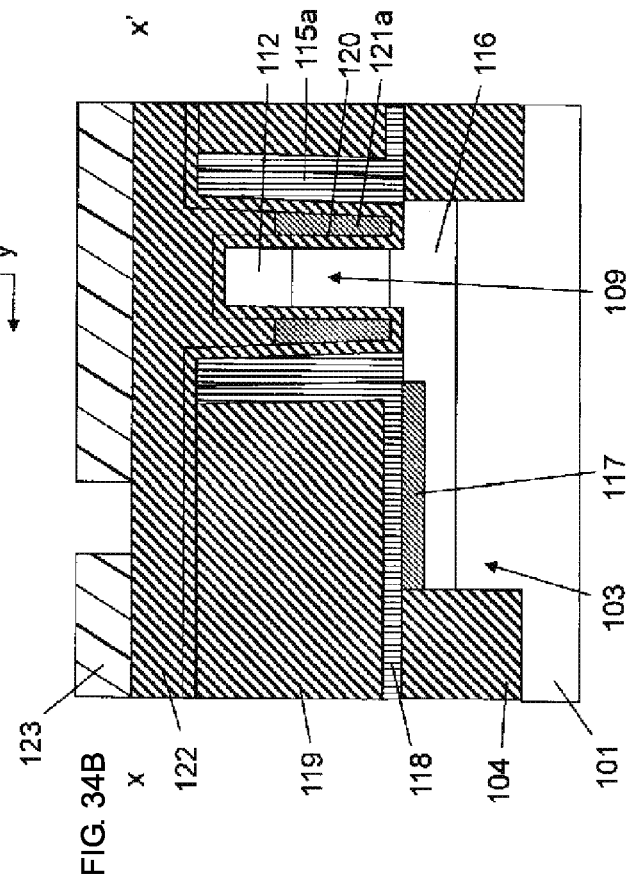
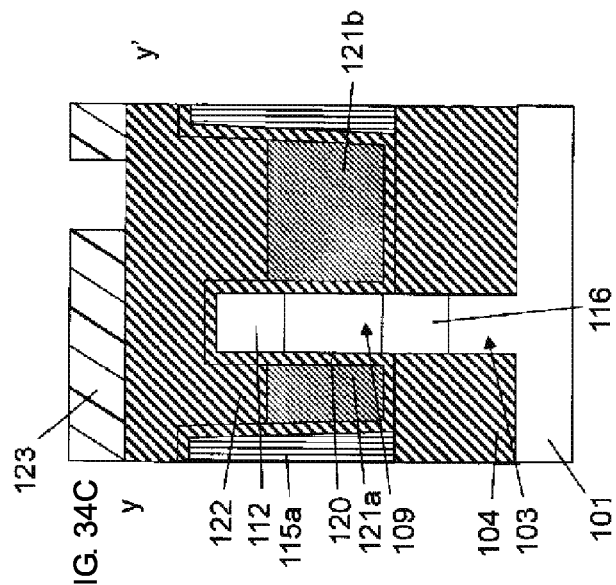
FIG. 34A
FIG. 34B
FIG. 34C

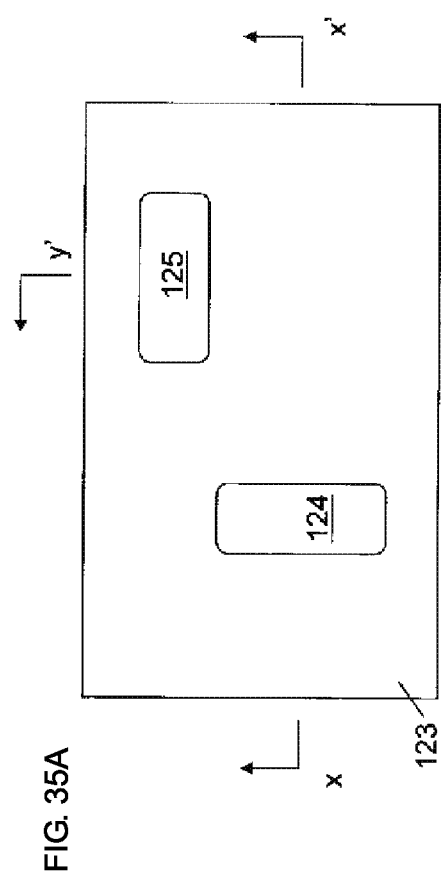
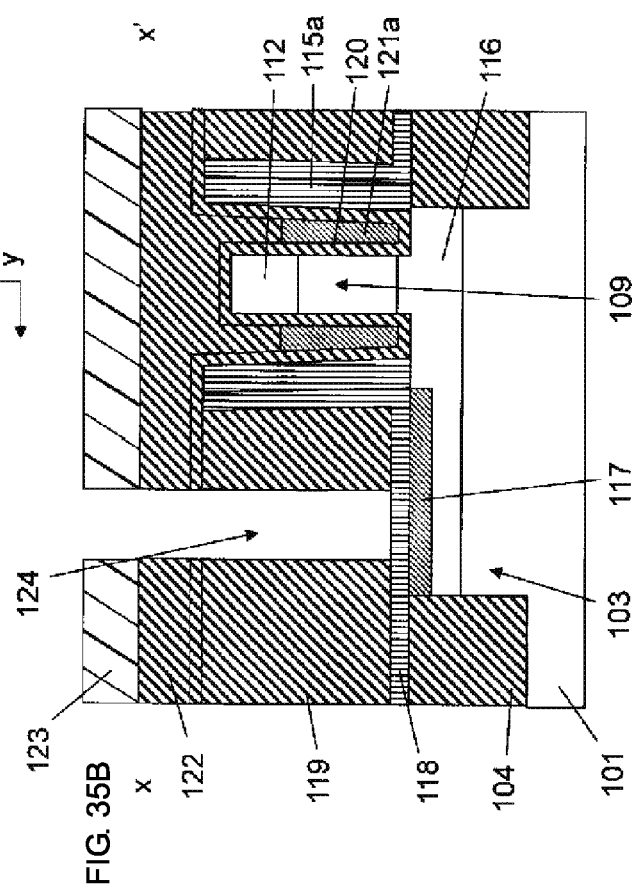
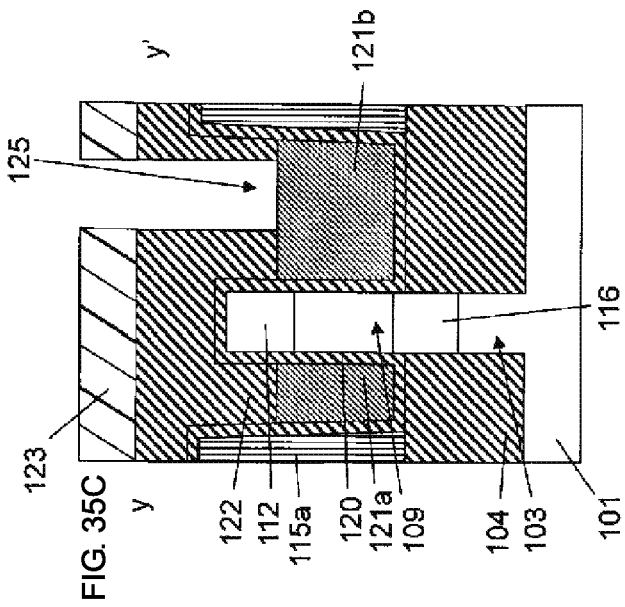
FIG. 35A
FIG. 35B
FIG. 35C

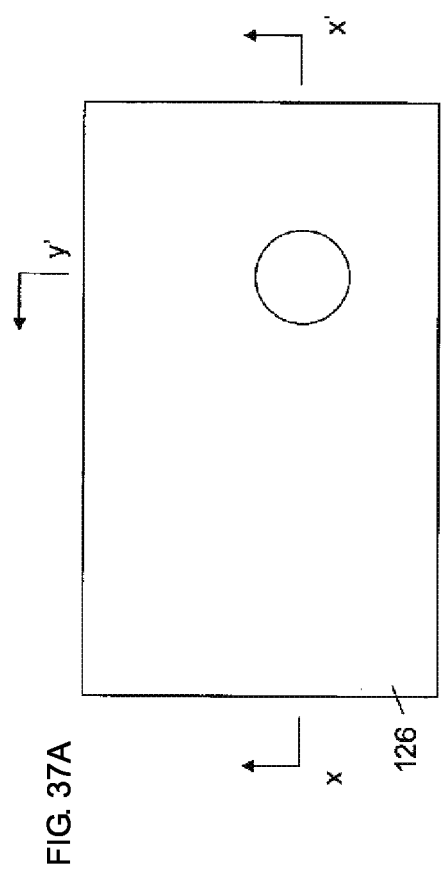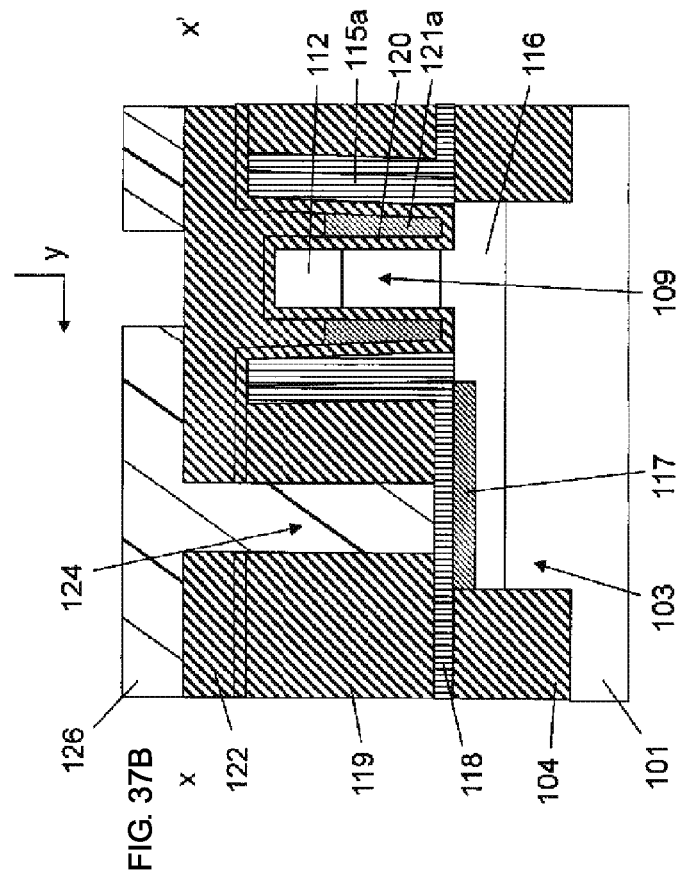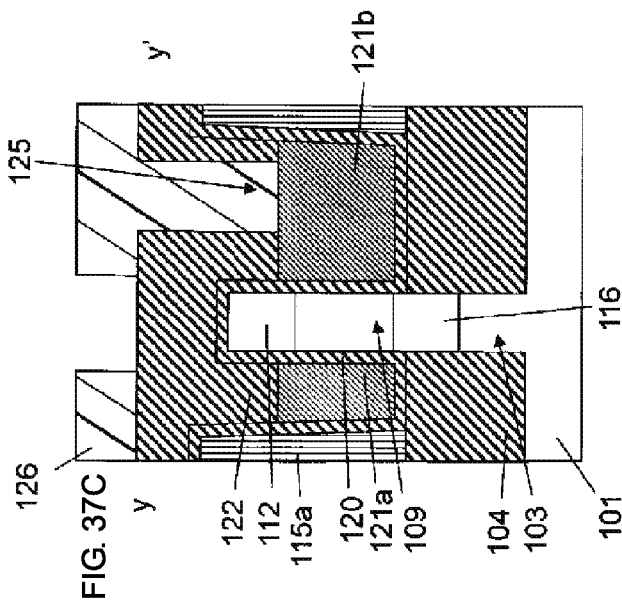

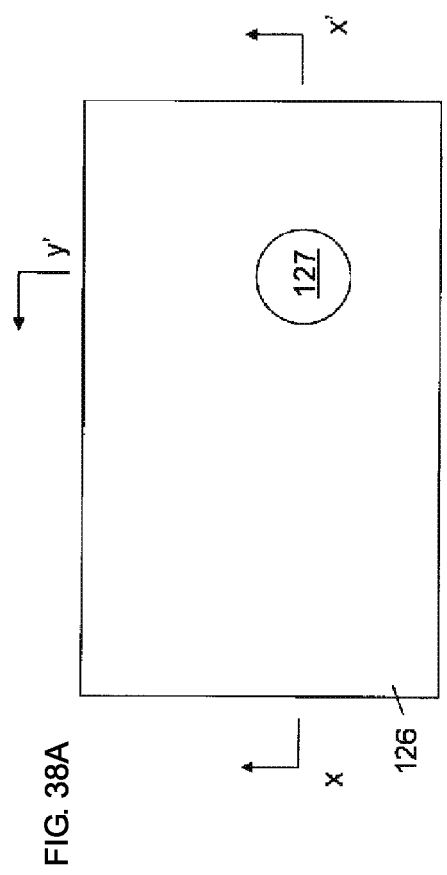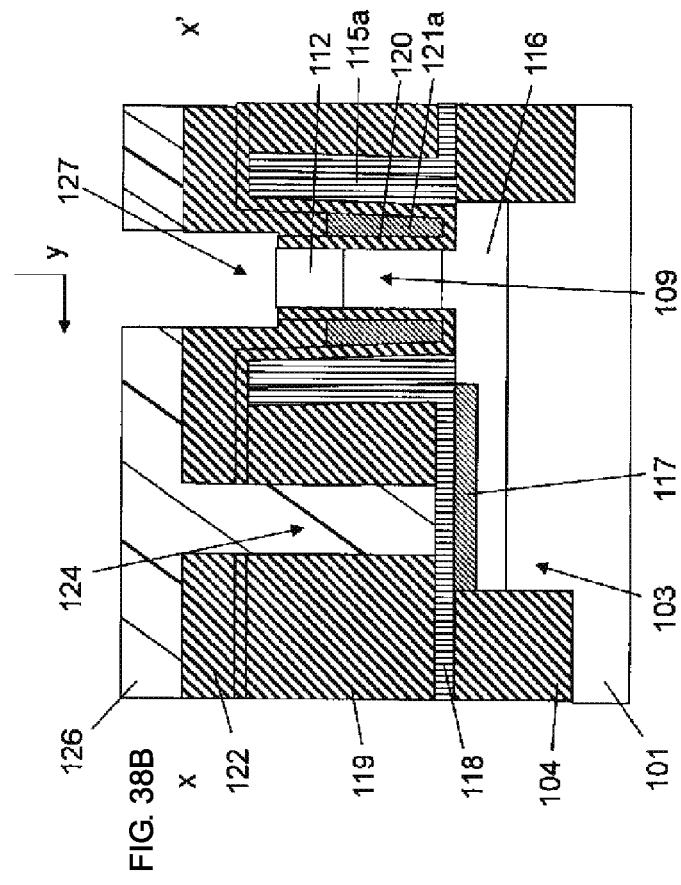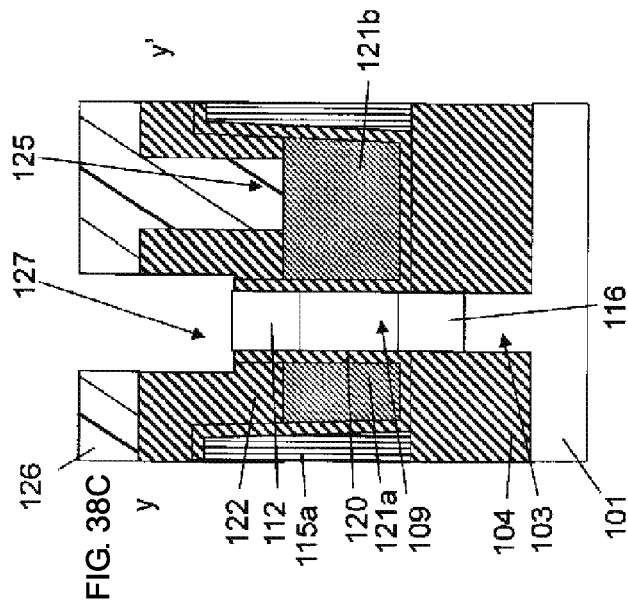

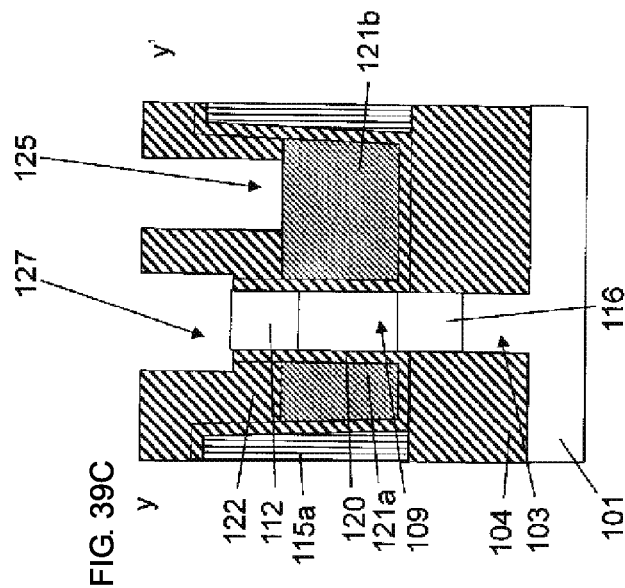
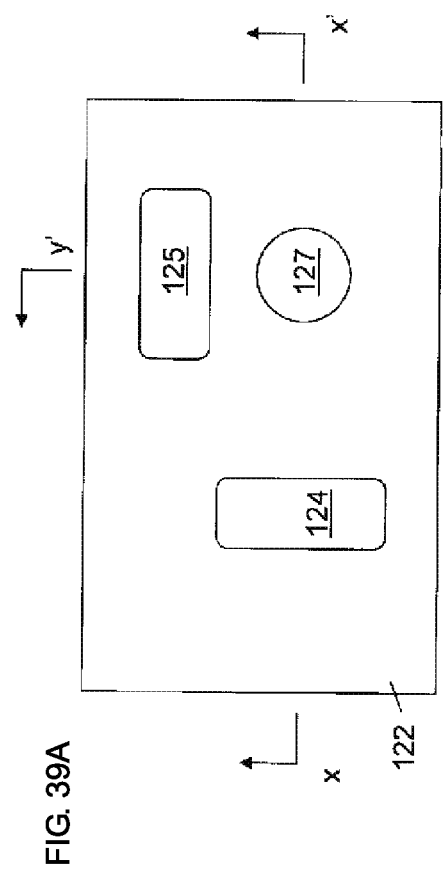
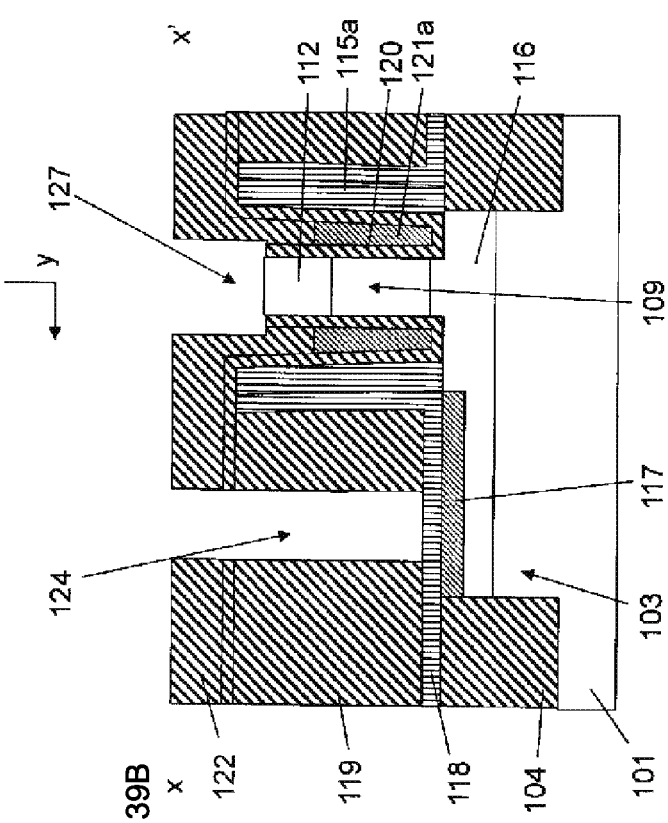
FIG. 39A
FIG. 39B
FIG. 39C

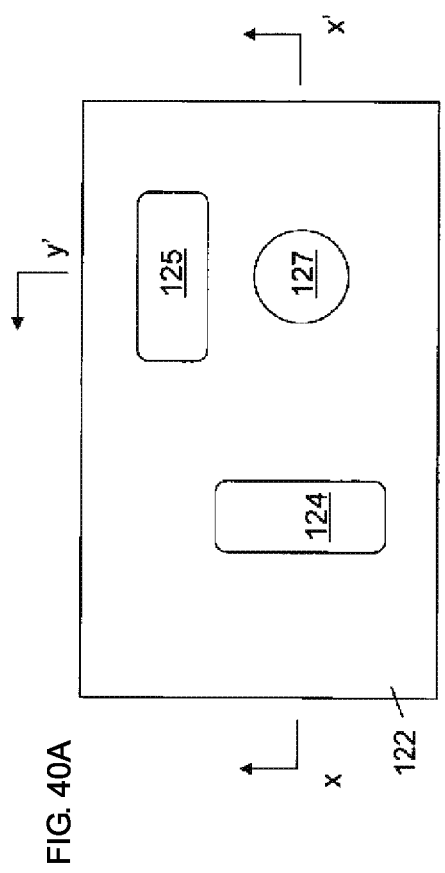
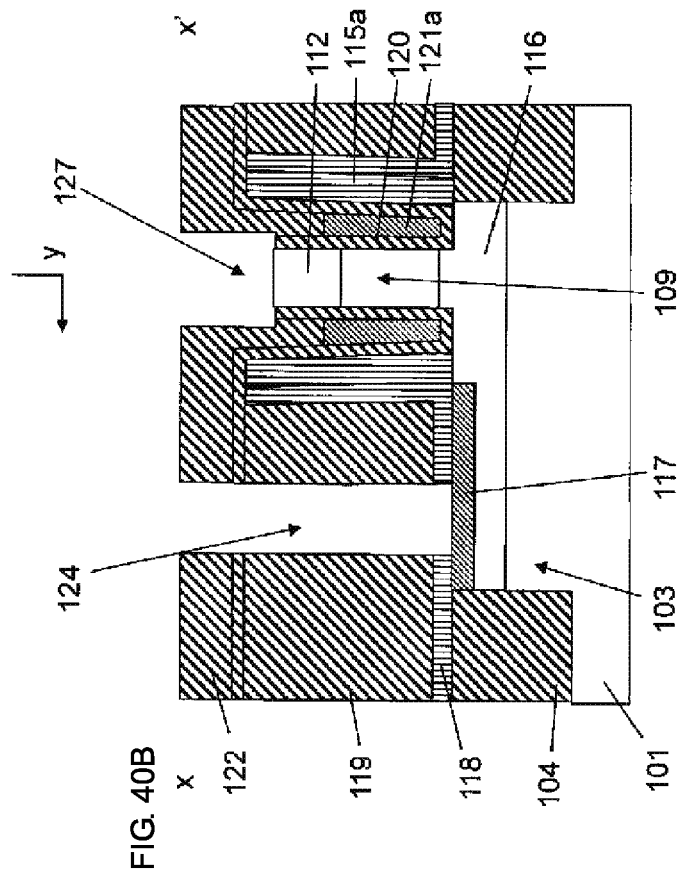
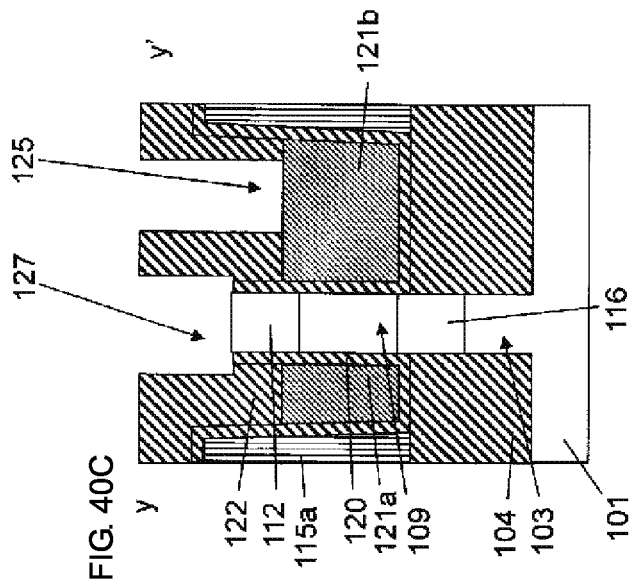
FIG. 40A
FIG. 40B
FIG. 40C

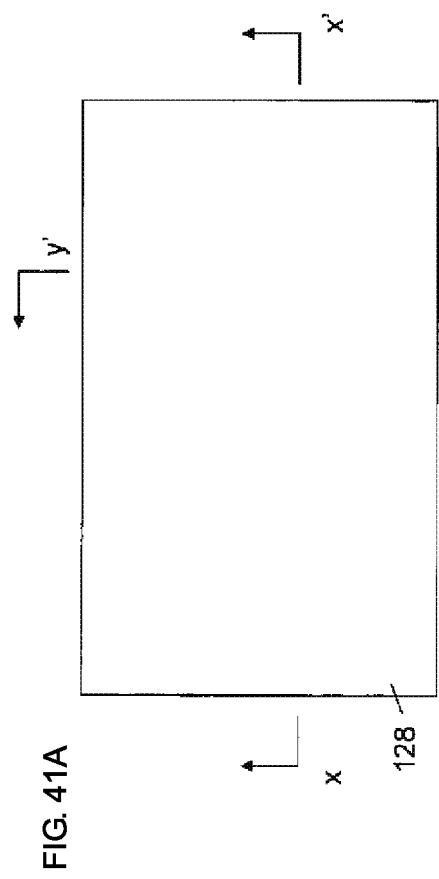
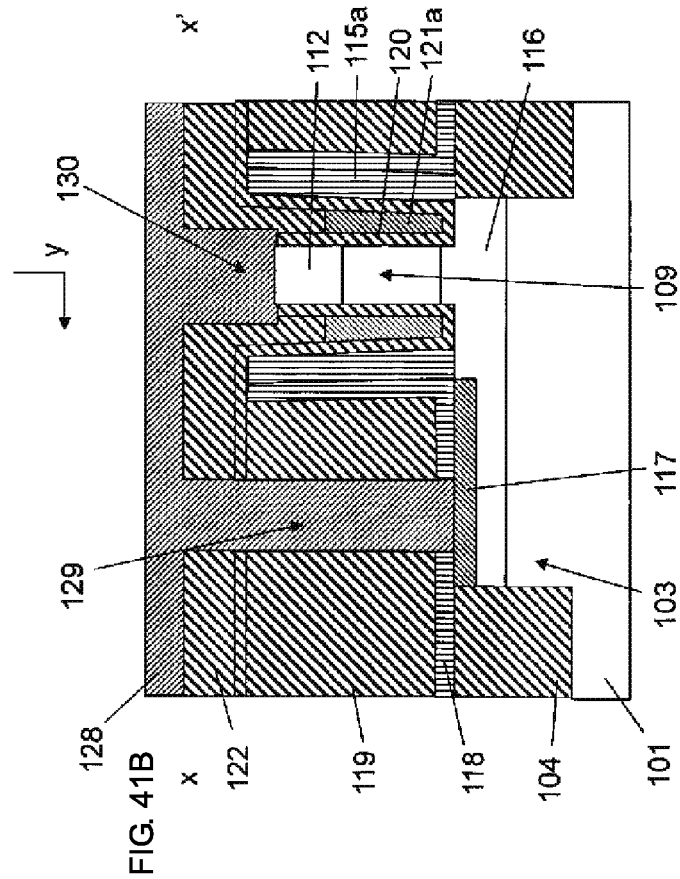
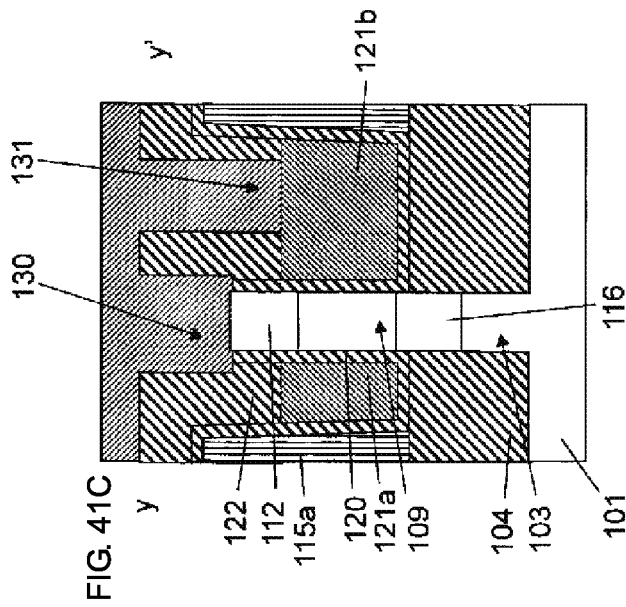
FIG. 41A
FIG. 41B
FIG. 41C

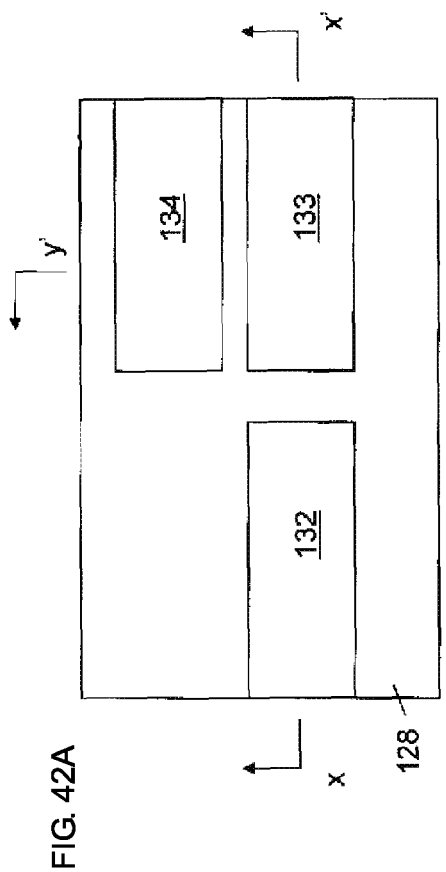
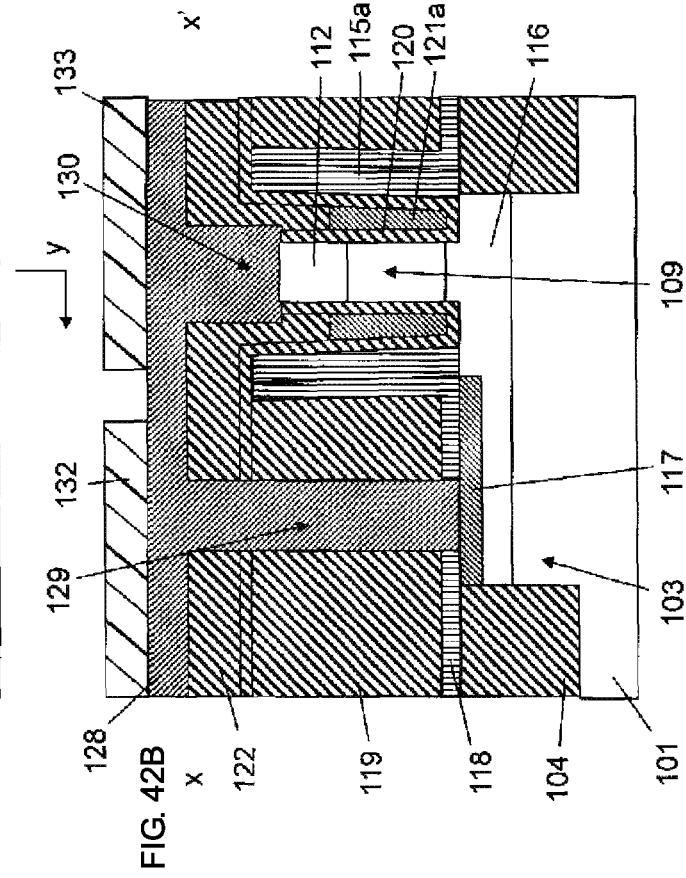
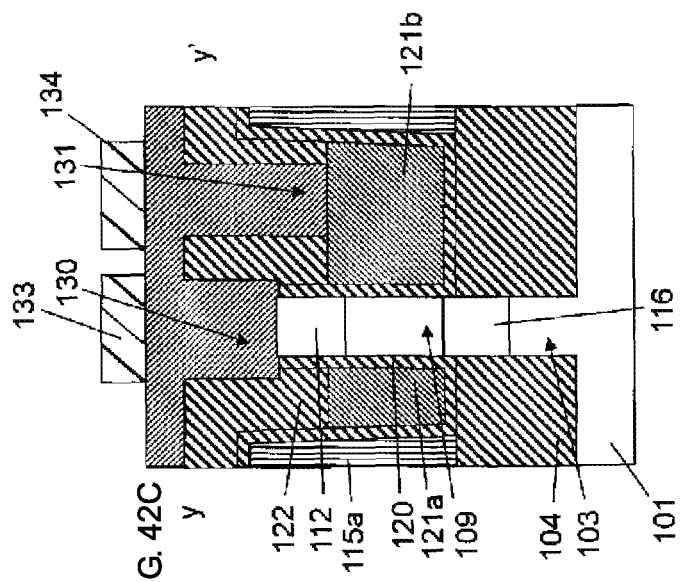
FIG. 42A
FIG. 42B
FIG. 42C

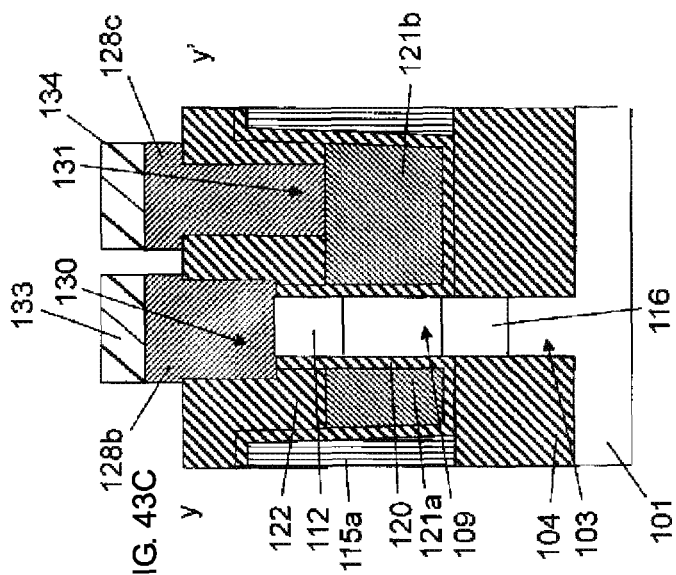
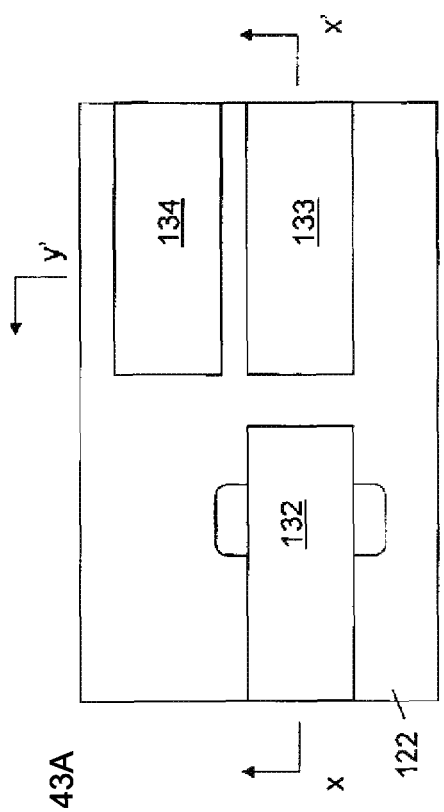
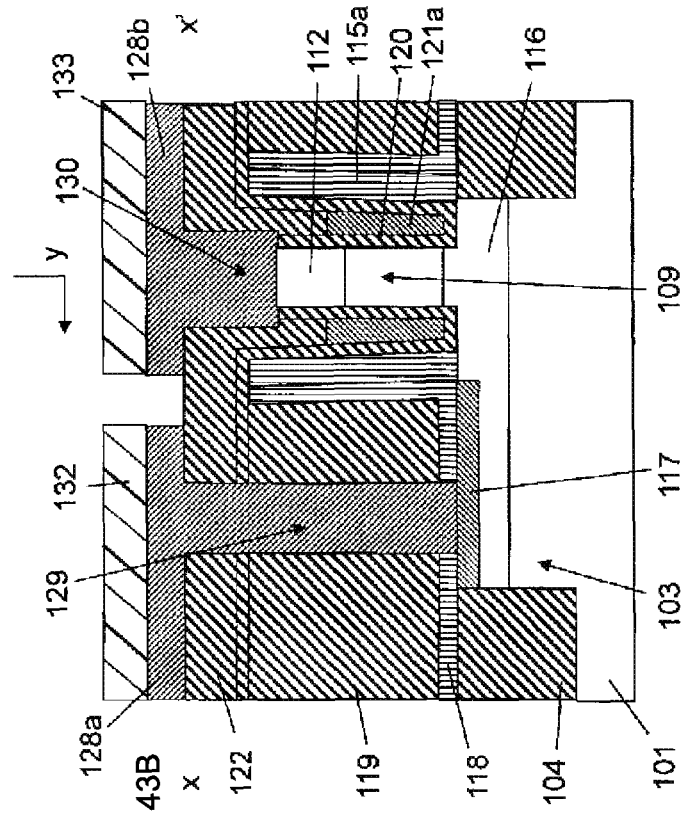

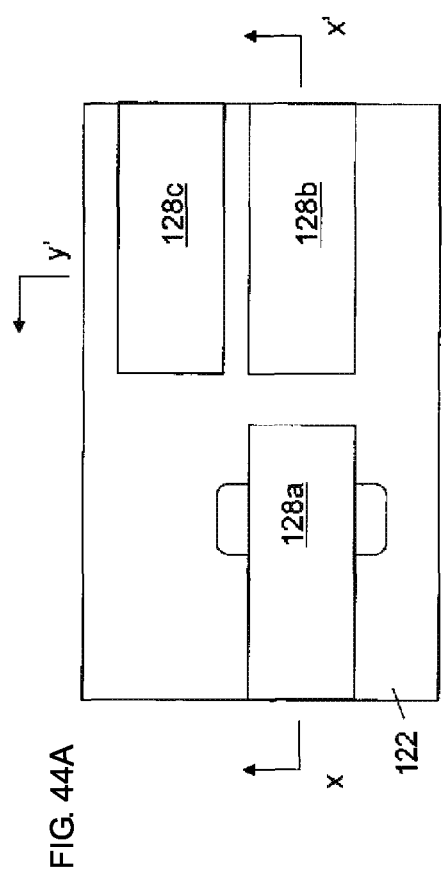
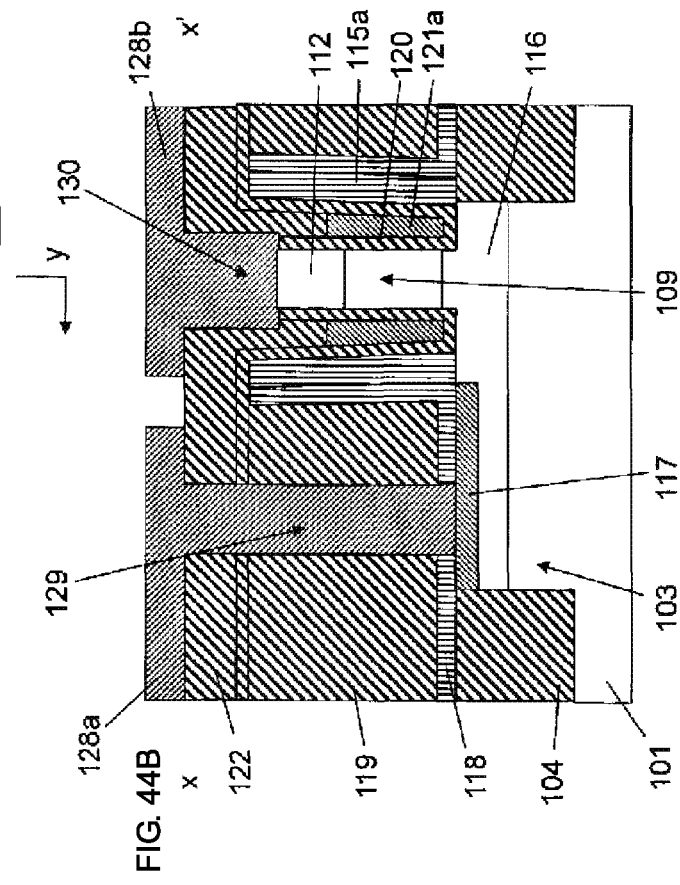
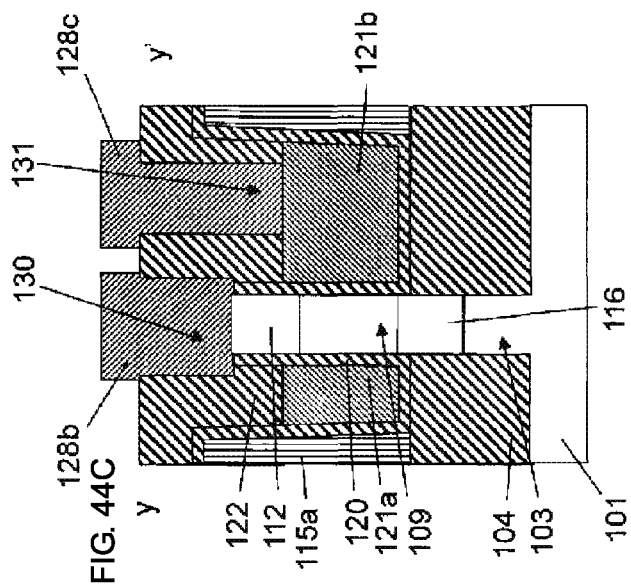

SEMICONDUCTOR DEVICE INCLUDING SURROUNDING GATE TRANSISTOR HAVING A GATE ELECTRODE WITH INCLINED SIDE SURFACE

CROSS REFERENCE TO RELATED APPLICATIONS

This application is a continuation application of international patent application PCT/JP2014/053745, filed Feb. 18, 2014, the entire contents of which are incorporated herein by reference.

BACKGROUND OF THE INVENTION

Field of the Invention

The present invention relates to a method for producing a semiconductor device and a semiconductor device.

Description of the Related Art

For semiconductor integrated circuits, in particular, integrated circuits employing MOS transistors, the degree of integration has been continuously increased. With this increase in the degree of integration, the size of MOS transistors in such integrated circuits has been reduced to the order of nanometers. In such small MOS transistors, leak current is difficult to suppress. Thus, from the standpoint of ensuring a sufficiently large current, reduction in the circuit area is difficult to achieve, which has been problematic. In order to address this problem, a Surrounding Gate Transistor (hereafter, referred to as an "SGT") has been proposed, the SGT having a structure in which a source, a gate, and a drain are disposed so as to be perpendicular to a substrate and a gate electrode is disposed so as to surround a pillar-shaped semiconductor layer (for example, refer to Japanese Unexamined Patent Application Publication Nos. 2-71556, 2-188966, and 3-145761).

In existing SGT production methods, a mask for defining a silicon pillar is used to form the silicon pillar including a pillar-shaped nitride-film hard mask; a mask for defining a planar silicon layer is used to form the planar silicon layer under the silicon pillar; and a mask for defining a gate line is used to form the gate line (for example, refer to Japanese Unexamined Patent Application Publication No. 2009-182317).

In other words, three masks are used to form the silicon pillar, the planar silicon layer, and the gate line.

In production of existing MOS transistors, in order to successfully perform a metal-gate process and a high-temperature process, a metal-gate last process of performing the high-temperature process and subsequently forming a metal gate is employed for actual products (IEDM2007 K. Mistry et. al, pp 247-250). Specifically, a gate is formed of polysilicon; an interlayer insulating film is then deposited; chemical mechanical polishing is then performed to expose the polysilicon gate; the polysilicon gate is etched; and metal is then deposited. Thus, also for SGTs, in order to successfully perform the metal-gate process and the high-temperature process, the metal-gate last process of performing the high-temperature process and subsequently forming the metal gate needs to be employed.

When metal is deposited to fill a hole in which the upper portion is narrower than the lower portion, the upper portion of the hole is first filled with the metal, so that the lower portion is left unfilled.

Prior art MOS transistors employ a first insulating film in order to decrease the parasitic capacitance between the gate line and the substrate. For example, in FINFET (IEDM2010 C C. Wu, et. al, 27.1.1-27.1.4), a first insulating film is formed around a fin-shaped semiconductor layer and the first insulating film is subjected to etch back to expose the fin-shaped semiconductor layer, so that the parasitic capacitance between the gate line and the substrate is decreased. Thus, SGTs also need to employ a first insulating film in order to decrease the parasitic capacitance between the gate line and the substrate. Since SGTs include a fin-shaped semiconductor layer and also a pillar-shaped semiconductor layer, how to form the pillar-shaped semiconductor layer needs to be considered.

SUMMARY OF THE INVENTION

It is accordingly an object of the invention to provide an SGT production method which overcomes the above-mentioned and other disadvantages of the heretofore-known devices and methods of this general type and which provides for an SGT production method employing a gate last process in which two masks are used to form a fin-shaped semiconductor layer, a pillar-shaped semiconductor layer, a gate electrode, and a gate line, and, as a further object, to provide the SGT structure obtained by the method.

With the foregoing and other objects in view there is provided, in accordance with the invention, a method for producing a semiconductor device according to an embodiment of the present invention includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film; and a third step of, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon so as to be left on a side wall of the first dummy gate and a side wall of the pillar-shaped semiconductor layer to form a second dummy gate.

The second dummy gate may have a top surface and a bottom surface, the top surface having a larger area than the bottom surface.

After the fourth insulating film is formed around the pillar-shaped semiconductor layer and the first dummy gate, a third resist may be formed and subjected to etch back to expose an upper portion of the pillar-shaped semiconductor layer, and a first diffusion layer may be formed in the upper portion of the pillar-shaped semiconductor layer.

The method may further include a fourth step of forming a fifth insulating film around the second dummy gate, etching the fifth insulating film so as to have a sidewall shape to form a sidewall from the fifth insulating film, forming a second diffusion layer in an upper portion of the fin-shaped semiconductor layer and a lower portion of the pillar-shaped semiconductor layer, and forming a metal-semiconductor compound on the second diffusion layer.

The method may further include a fifth step of, after the fourth step, depositing a contact stopper film, depositing an interlayer insulating film, subjecting the interlayer insulating film to chemical mechanical polishing to expose an upper portion of the second dummy gate and an upper portion of the first dummy gate, removing the second dummy gate and the first dummy gate, removing the second insulating film and the fourth insulating film, forming a gate insulating film around the pillar-shaped semiconductor layer and on an inner side of the fifth insulating film, depositing a metal, and subjecting the metal to etch back to form a gate electrode and a gate line.

A semiconductor device according to an embodiment of the present invention includes a fin-shaped semiconductor layer formed on a semiconductor substrate; a first insulating film formed around the fin-shaped semiconductor layer; a pillar-shaped semiconductor layer formed on the fin-shaped semiconductor layer; a gate insulating film formed around the pillar-shaped semiconductor layer; a gate electrode formed of metal and formed around the gate insulating film; a gate line connected to the gate electrode, extending in a direction orthogonal to the fin-shaped semiconductor layer, and formed of metal; a first diffusion layer formed in an upper portion of the pillar-shaped semiconductor layer; and a second diffusion layer formed in an upper portion of the fin-shaped semiconductor layer and in a lower portion of the pillar-shaped semiconductor layer, wherein the gate electrode has a top surface and a bottom surface, the top surface having a larger area than the bottom surface, and the gate line has a top surface and a bottom surface, the top surface having a larger area than the bottom surface.

The semiconductor device may further include the gate insulating film formed around and under the gate electrode and the gate line.

The present invention can provide an SGT production method employing a gate last process in which two masks are used to form a fin-shaped silicon layer, a pillar-shaped silicon layer, a gate electrode, and a gate line, and can provide the SGT structure obtained by the method.

A method for producing a semiconductor device according to an embodiment includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film; and a third step of, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon so as to be left on a side wall of the first dummy gate and a side wall of the pillar-shaped semiconductor layer to form a second dummy gate. As a result, use of the two masks enables formation of the fin-shaped semiconductor layer, the pillar-shaped semiconductor layer, and the first dummy gate and the second dummy gate that are to provide a gate electrode and a gate line. Thus, reduction in the number of steps can be achieved.

The first and second hard masks prevent the metal-semiconductor compound from being formed on the first and second dummy gates, so that the metal-semiconductor compound can be formed on the fin-shaped semiconductor layer alone.

The second polysilicon may be etched so as to have an inversely tapering shape, so that the second dummy gate has a top surface and a bottom surface, the top surface having a larger area than the bottom surface. As a result, when metal is deposited to fill the hole for forming a gate, the hole is prevented from being partially unfilled.

Misalignment between the pillar-shaped semiconductor layer and the gate line can be prevented.

An existing metal-gate last process can be employed in which a first dummy gate and a second dummy gate are formed from polysilicon; an interlayer insulating film is then deposited; chemical mechanical polishing is then performed to expose the first dummy gate and the second dummy gate; the polysilicon gates are etched; and metal is then deposited. Thus, metal-gate SGTs can be easily formed.

The gate insulating film formed around and under the gate electrode and the gate line enables insulation of the gate electrode and the gate line from the pillar-shaped semiconductor layer and the fin-shaped semiconductor layer.

BRIEF DESCRIPTION OF THE DRAWINGS

FIG. 2A is a plan view for explaining a method for producing a semiconductor device according to an embodiment of the present invention; FIG. 2B is a sectional view taken along line X-X' in FIG. 2A; and FIG. 2C is a sectional view taken along line Y-Y' in FIG. 2A.

FIG. 5A is a plan view for explaining a method for producing a semiconductor device according to an embodiment of the present invention; FIG. 5B is a sectional view taken along line X-X' in FIG. 5A; and FIG. 5C is a sectional view taken along line Y-Y' in FIG. 5A.

FIG. 6A is a plan view for explaining a method for producing a semiconductor device according to an embodiment of the present invention; FIG. 6B is a sectional view taken along line X-X' in FIG. 6A; and FIG. 6C is a sectional view taken along line Y-Y' in FIG. 6A.

FIG. 8A is a plan view for explaining a method for producing a semiconductor device according to an embodiment of the present invention; FIG. 8B is a sectional view taken along line X-X' in FIG. 8A; and FIG. 8C is a sectional view taken along line Y-Y' in FIG. 8A.

FIG. 9A is a plan view for explaining a method for producing a semiconductor device according to an embodiment of the present invention; FIG. 9B is a sectional view taken along line X-X' in FIG. 9A; and FIG. 9C is a sectional view taken along line Y-Y' in FIG. 9A.

FIG. 10A is a plan view for explaining a method for producing a semiconductor device according to an embodiment of the present invention; FIG. 10B is a sectional view taken along line X-X' in FIG. 10A; and FIG. 10C is a sectional view taken along line Y-Y' in FIG. 10A.

FIG. 11A is a plan view for explaining a method for producing a semiconductor device according to an embodiment of the present invention; FIG. 11B is a sectional view taken along line X-X' in FIG. 11A; and FIG. 11C is a sectional view taken along line Y-Y' in FIG. 11A.

FIG. 12A is a plan view for explaining a method for producing a semiconductor device according to an embodiment of the present invention; FIG. 12B is a sectional view taken along line X-X' in FIG. 12A; and FIG. 12C is a sectional view taken along line Y-Y' in FIG. 12A.

FIG. 13A is a plan view for explaining a method for producing a semiconductor device according to an embodiment of the present invention; FIG. 13B is a sectional view taken along line X-X' in FIG. 13A; and FIG. 13C is a sectional view taken along line Y-Y' in FIG. 13A.

FIG. 14A is a plan view for explaining a method for producing a semiconductor device according to an embodiment of the present invention; FIG. 14B is a sectional view taken along line X-X' in FIG. 14A; and FIG. 14C is a sectional view taken along line Y-Y' in FIG. 14A.

FIG. 15A is a plan view for explaining a method for producing a semiconductor device according to an embodiment of the present invention; FIG. 15B is a sectional view taken along line X-X' in FIG. 15A; and FIG. 15C is a sectional view taken along line Y-Y' in FIG. 15A.

FIG. 16A is a plan view for explaining a method for producing a semiconductor device according to an embodiment of the present invention; FIG. 16B is a sectional view taken along line X-X' in FIG. 16A; and FIG. 16C is a sectional view taken along line Y-Y' in FIG. 16A.

FIG. 17A is a plan view for explaining a method for producing a semiconductor device according to an embodiment of the present invention; FIG. 17B is a sectional view taken along line X-X' in FIG. 17A; and FIG. 17C is a sectional view taken along line Y-Y' in FIG. 17A.

FIG. 18A is a plan view for explaining a method for producing a semiconductor device according to an embodiment of the present invention; FIG. 18B is a sectional view taken along line X-X' in FIG. 18A; and FIG. 18C is a sectional view taken along line Y-Y' in FIG. 18A.

FIG. 20A is a plan view for explaining a method for producing a semiconductor device according to an embodiment of the present invention; FIG. 20B is a sectional view taken along line X-X' in FIG. 20A; and FIG. 20C is a sectional view taken along line Y-Y' in FIG. 20A.

FIG. 21A is a plan view for explaining a method for producing a semiconductor device according to an embodiment of the present invention; FIG. 21B is a sectional view taken along line X-X' in FIG. 21A; and FIG. 21C is a sectional view taken along line Y-Y' in FIG. 21A.

FIG. 24A is a plan view for explaining a method for producing a semiconductor device according to an embodiment of the present invention; FIG. 24B is a sectional view taken along line X-X' in FIG. 24A; and FIG. 24C is a sectional view taken along line Y-Y' in FIG. 24A.

FIG. 26A is a plan view for explaining a method for producing a semiconductor device according to an embodiment of the present invention; FIG. 26B is a sectional view taken along line X-X' in FIG. 26A; and FIG. 26C is a sectional view taken along line Y-Y' in FIG. 26A.

FIG. 27A is a plan view for explaining a method for producing a semiconductor device according to an embodiment of the present invention; FIG. 27B is a sectional view taken along line X-X' in FIG. 27A; and FIG. 27C is a sectional view taken along line Y-Y' in FIG. 27A.

FIG. 29A is a plan view for explaining a method for producing a semiconductor device according to an embodiment of the present invention; FIG. 29B is a sectional view taken along line X-X' in FIG. 29A; and FIG. 29C is a sectional view taken along line Y-Y' in FIG. 29A.

FIG. 30A is a plan view for explaining a method for producing a semiconductor device according to an embodiment of the present invention; FIG. 30B is a sectional view taken along line X-X' in FIG. 30A; and FIG. 30C is a sectional view taken along line Y-Y' in FIG. 30A.

FIG. 31A is a plan view for explaining a method for producing a semiconductor device according to an embodiment of the present invention; FIG. 31B is a sectional view taken along line X-X' in FIG. 31A; and FIG. 31C is a sectional view taken along line Y-Y' in FIG. 31A.

FIG. 32A is a plan view for explaining a method for producing a semiconductor device according to an embodiment of the present invention; FIG. 32B is a sectional view taken along line X-X' in FIG. 32A; and FIG. 32C is a sectional view taken along line Y-Y' in FIG. 32A.

FIG. 34A is a plan view for explaining a method for producing a semiconductor device according to an embodiment of the present invention; FIG. 34B is a sectional view taken along line X-X' in FIG. 34A; and FIG. 34C is a sectional view taken along line Y-Y' in FIG. 34A.

FIG. 35A is a plan view for explaining a method for producing a semiconductor device according to an embodiment of the present invention; FIG. 35B is a sectional view taken along line X-X' in FIG. 35A; and FIG. 35C is a sectional view taken along line Y-Y' in FIG. 35A.

FIG. 37A is a plan view for explaining a method for producing a semiconductor device according to an embodiment of the present invention; FIG. 37B is a sectional view taken along line X-X' in FIG. 37A; and FIG. 37C is a sectional view taken along line Y-Y' in FIG. 37A.

FIG. 38A is a plan view for explaining a method for producing a semiconductor device according to an embodiment of the present invention; FIG. 38B is a sectional view taken along line X-X' in FIG. 38A; and FIG. 38C is a sectional view taken along line Y-Y' in FIG. 38A.

FIG. 39A is a plan view for explaining a method for producing a semiconductor device according to an embodiment of the present invention; FIG. 39B is a sectional view taken along line X-X' in FIG. 39A; and FIG. 39C is a sectional view taken along line Y-Y' in FIG. 39A.

FIG. 40A is a plan view for explaining a method for producing a semiconductor device according to an embodiment of the present invention; FIG. 40B is a sectional view taken along line X-X' in FIG. 40A; and FIG. 40C is a sectional view taken along line Y-Y' in FIG. 40A.

FIG. 41A is a plan view for explaining a method for producing a semiconductor device according to an embodiment of the present invention; FIG. 41B is a sectional view taken along line X-X' in FIG. 41A; and FIG. 41C is a sectional view taken along line Y-Y' in FIG. 41A.

FIG. 42A is a plan view for explaining a method for producing a semiconductor device according to an embodiment of the present invention; FIG. 42B is a sectional view taken along line X-X' in FIG. 42A; and FIG. 42C is a sectional view taken along line Y-Y' in FIG. 42A.

FIG. 43A is a plan view for explaining a method for producing a semiconductor device according to an embodiment of the present invention; FIG. 43B is a sectional view taken along line X-X' in FIG. 43A; and FIG. 43C is a sectional view taken along line Y-Y' in FIG. 43A.

FIG. 44A is a plan view for explaining a method for producing a semiconductor device according to an embodiment of the present invention; FIG. 44B is a sectional view taken along line X-X' in FIG. 44A; and FIG. 44C is a sectional view taken along line Y-Y' in FIG. 44A.

DESCRIPTION OF THE PREFERRED EMBODIMENTS

Hereinafter, production steps for forming an SGT structure according to an embodiment of the present invention will be described with reference to FIGS. 2A to 44C.

A first step will be described, the first step including forming a fin-shaped semiconductor layer on a semiconductor substrate and forming a first insulating film around the fin-shaped semiconductor layer. In this embodiment, the semiconductor substrate is formed of silicon; alternatively, the semiconductor substrate may be formed of a semiconductor other than silicon.

As illustrated in FIGS. 2A to 2C, a first resist 102 for forming a fin-shaped silicon layer is formed on a silicon substrate 101.

Figure 3A:
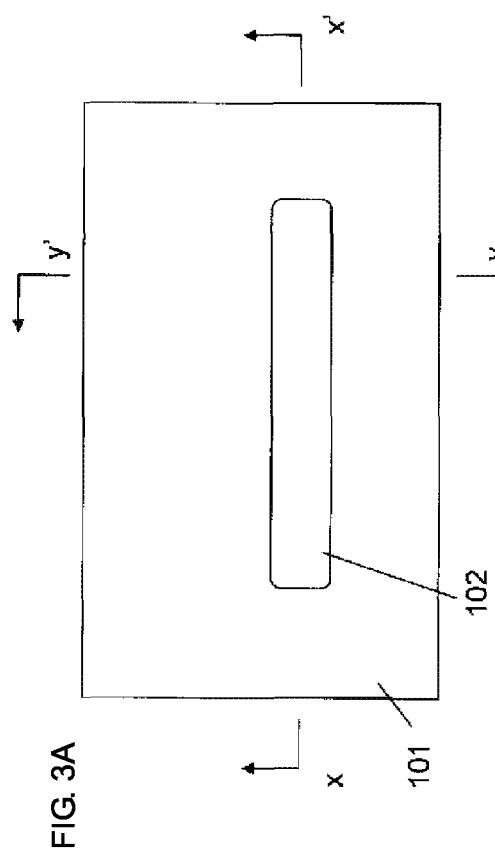
FIG. 3A is a plan view for explaining a method for producing a semiconductor device according to an embodiment of the present invention.
Figure 3C:
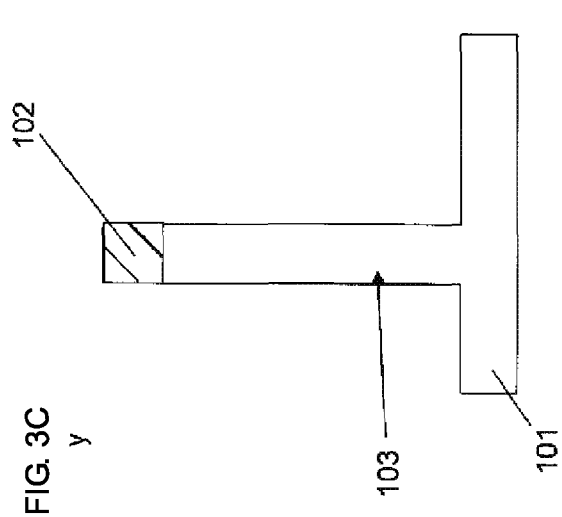
FIG. 3C is a sectional view taken along line Y-Y' in FIG. 3A.
Figure 3B:
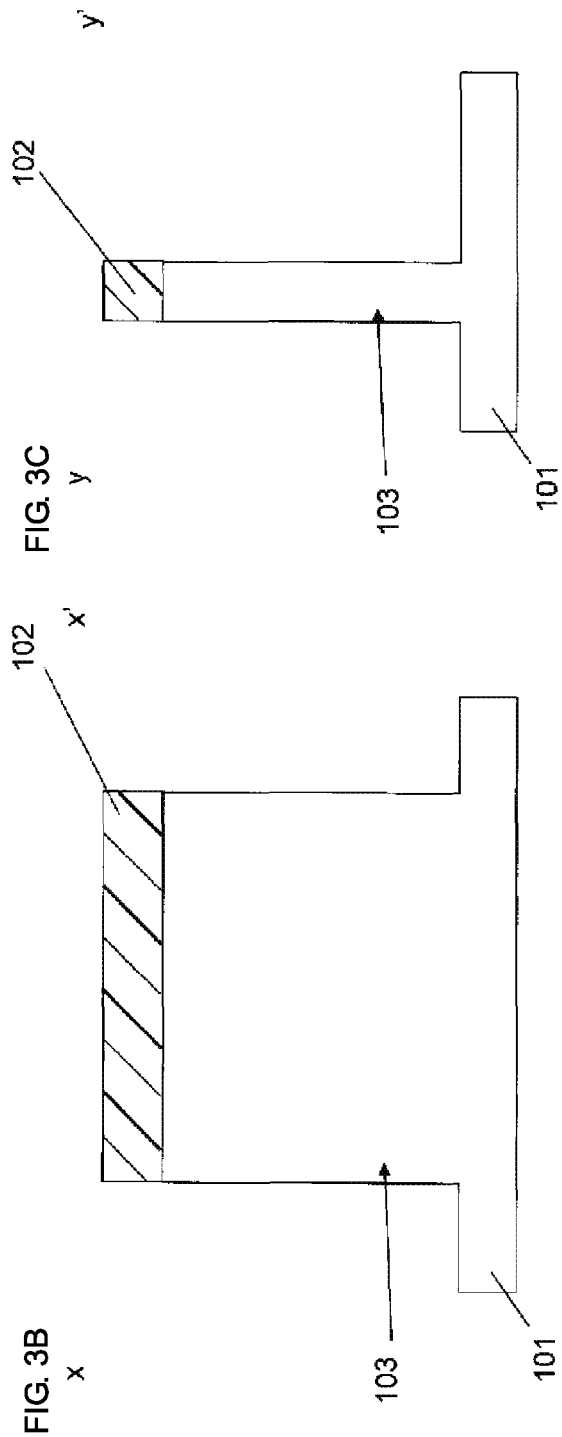
FIG. 3B is a sectional view taken along line X-X' in FIG. 3A.

As illustrated in FIGS. 3A to 3C, the silicon substrate 101 is etched to form a fin-shaped silicon layer 103. In this embodiment, the resist is used as a mask to form the fin-shaped silicon layer; alternatively, a hard mask of an oxide film or a nitride film may be used.

Figure 4C:
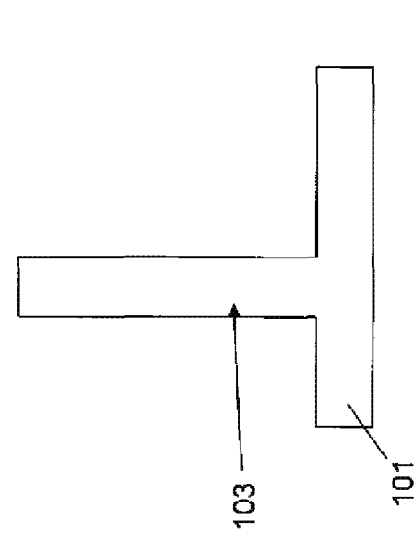
FIG. 4C is a sectional view taken along line Y-Y' in FIG. 4A.
Figure 4A:
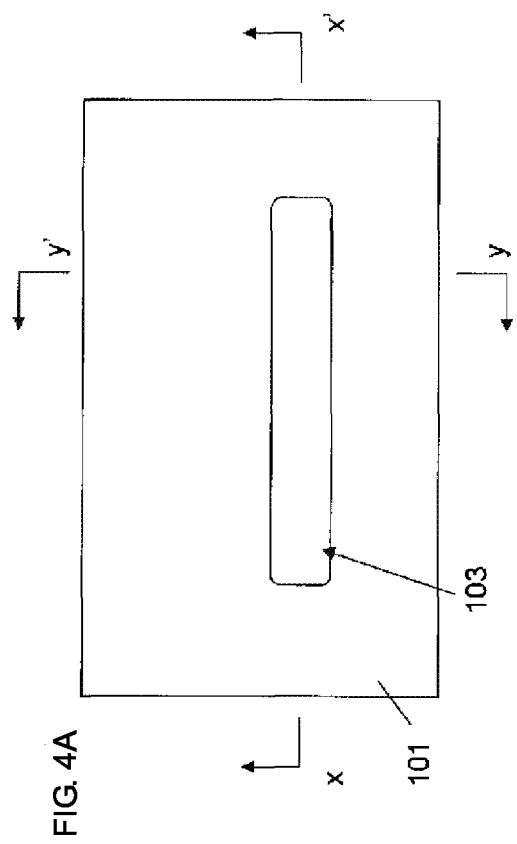
FIG. 4A is a plan view for explaining a method for producing a semiconductor device according to an embodiment of the present invention.
Figure 4B:
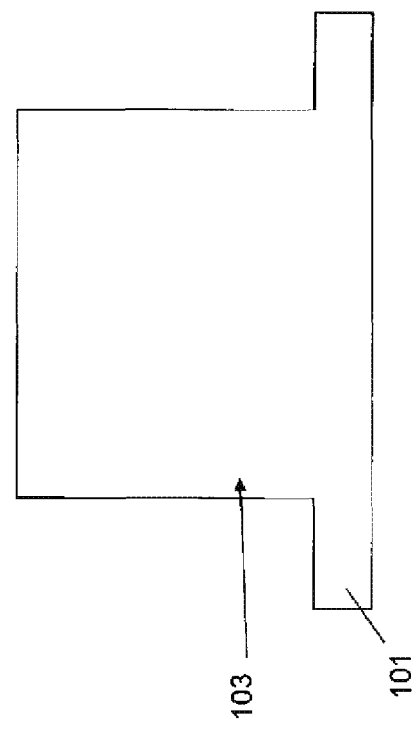
FIG. 4B is a sectional view taken along line X-X' in FIG. 4A.

As illustrated in FIGS. 4A to 4C, the first resist 102 is removed.

As illustrated in FIGS. 5A to 5C, a first insulating film 104 is deposited around the fin-shaped silicon layer 103. The first insulating film may be an oxide film formed with high-density plasma or an oxide film formed by low-pressure CVD (Chemical Vapor Deposition).

As illustrated in FIGS. 6A to 6C, the first insulating film 104 is subjected to etch back to expose an upper portion of the fin-shaped silicon layer 103. These processes having been described so far are the same as in the method for forming a fin-shaped silicon layer in IEDM2010 C C. Wu, et. al, 27.1.1-27.1.4.

Thus, the first step has been described, the first step including forming the fin-shaped silicon layer 103 on the silicon substrate 101 and forming the first insulating film 104 around the fin-shaped silicon layer 103.

Hereafter, a second step will be described, the second step including forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film.

Figure 7C:
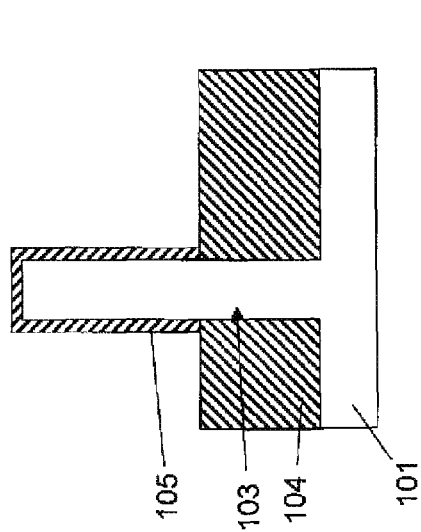
FIG. 7C is a sectional view taken along line Y-Y' in FIG. 7A.
Figure 7A:
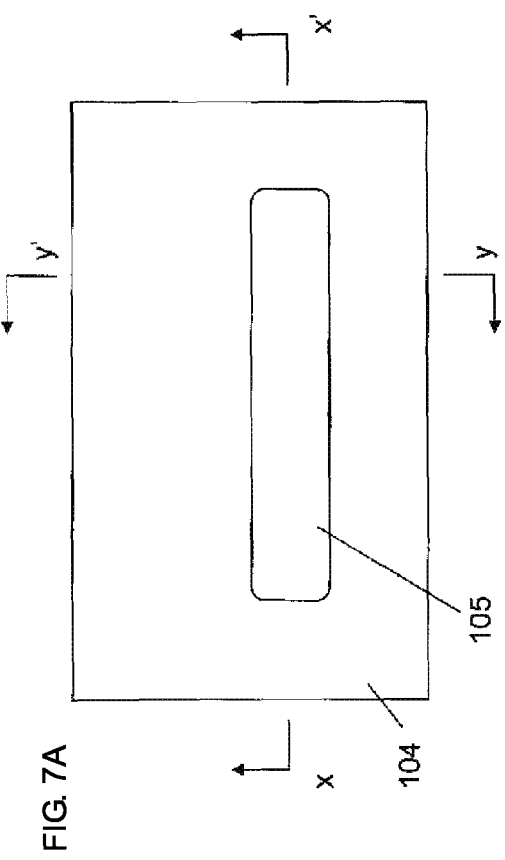
FIG. 7A is a plan view for explaining a method for producing a semiconductor device according to an embodiment of the present invention.
Figure 7B:
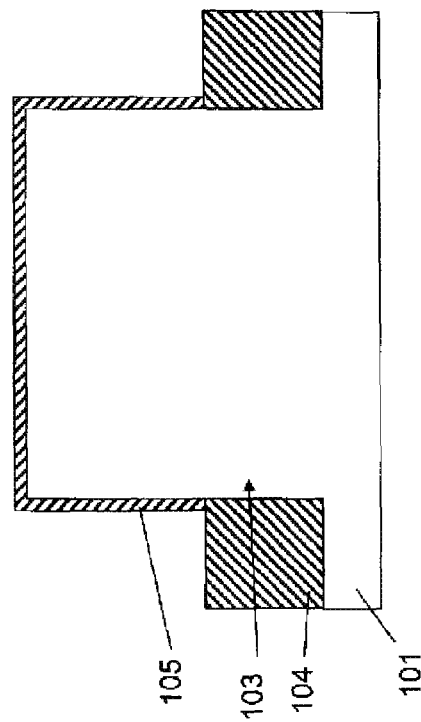
FIG. 7B is a sectional view taken along line X-X' in FIG. 7A.

As illustrated in FIGS. 7A to 7C, a second insulating film 105 is formed around the fin-shaped silicon layer 103. The second insulating film 105 is preferably an oxide film.

As illustrated in FIGS. 8A to 8C, a first polysilicon 106 is deposited on the second insulating film 105 and planarized.

As illustrated in FIGS. 9A to 9C, a third insulating film 107 is formed on the first polysilicon 106. The third insulating film 107 is preferably a nitride film.

As illustrated in FIGS. 10A to 10C, a second resist 108 for forming a gate line and a pillar-shaped silicon layer is formed so as to be perpendicular to the direction in which the fin-shaped silicon layer 103 extends.

As illustrated in FIGS. 11A to 11C, the third insulating film 107, the first polysilicon 106, the second insulating film 105, and the fin-shaped silicon layer 103 are etched to form a pillar-shaped silicon layer 109, a first dummy gate 106a formed from the first polysilicon, and a first hard mask 107a formed from the third insulating film.

As illustrated in FIGS. 12A to 12C, the second resist 108 is removed.

Thus, the second step has been described, the second step including forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film.

Hereafter, a third step will be described, the third step including, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, etching the second polysilicon so as to be left on a side wall of the first dummy gate and a side wall of the pillar-shaped semiconductor layer to form a second dummy gate.

As illustrated in FIGS. 13A to 13C, a fourth insulating film 110 is formed around the pillar-shaped silicon layer 109 and the first dummy gate 106a. The fourth insulating film 110 is preferably an oxide film.

As illustrated in FIGS. 14A to 14C, a third resist 111 is formed and subjected to etch back to expose an upper portion of the pillar-shaped silicon layer 109.

As illustrated in FIGS. 15A to 15C, an impurity is introduced to form a first diffusion layer 112 in the upper portion of the pillar-shaped silicon layer 109. When an n-type diffusion layer is formed, arsenic or phosphorus is preferably introduced. When a p-type diffusion layer is formed, boron is preferably introduced.

As illustrated in FIGS. 16A to 16C, the third resist 111 is removed.

As illustrated in FIGS. 17A to 17C, a second polysilicon 113 is deposited around the fourth insulating film 110 and planarized.

As illustrated in FIGS. 18A to 18C, the second polysilicon 113 is subjected to etch back to expose the first hard mask 107a.

Figure 19A:
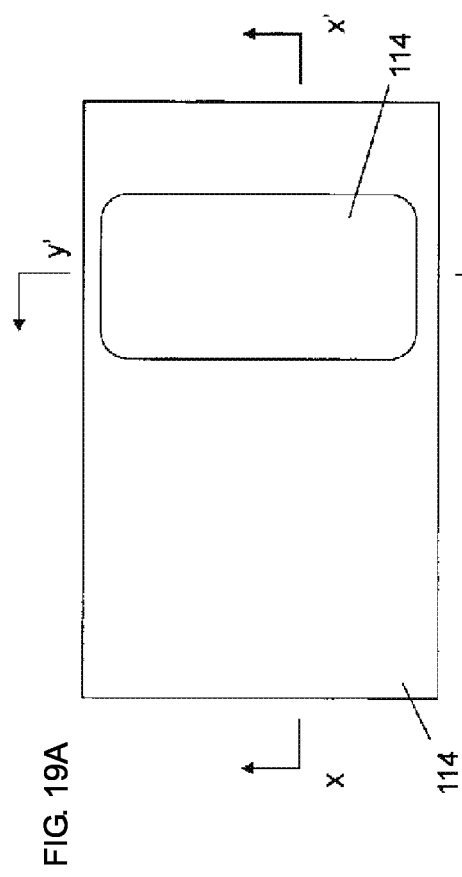
FIG. 19A is a plan view for explaining a method for producing a semiconductor device according to an embodiment of the present invention.
Figure 19C:
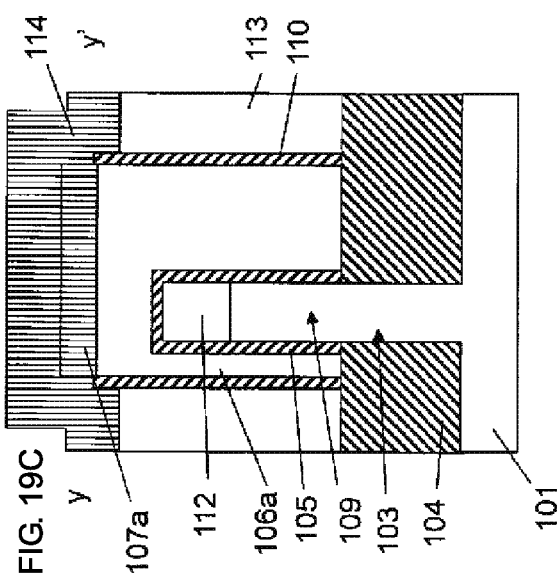
FIG. 19C is a sectional view taken along line Y-Y' in FIG. 19A.
Figure 19B:
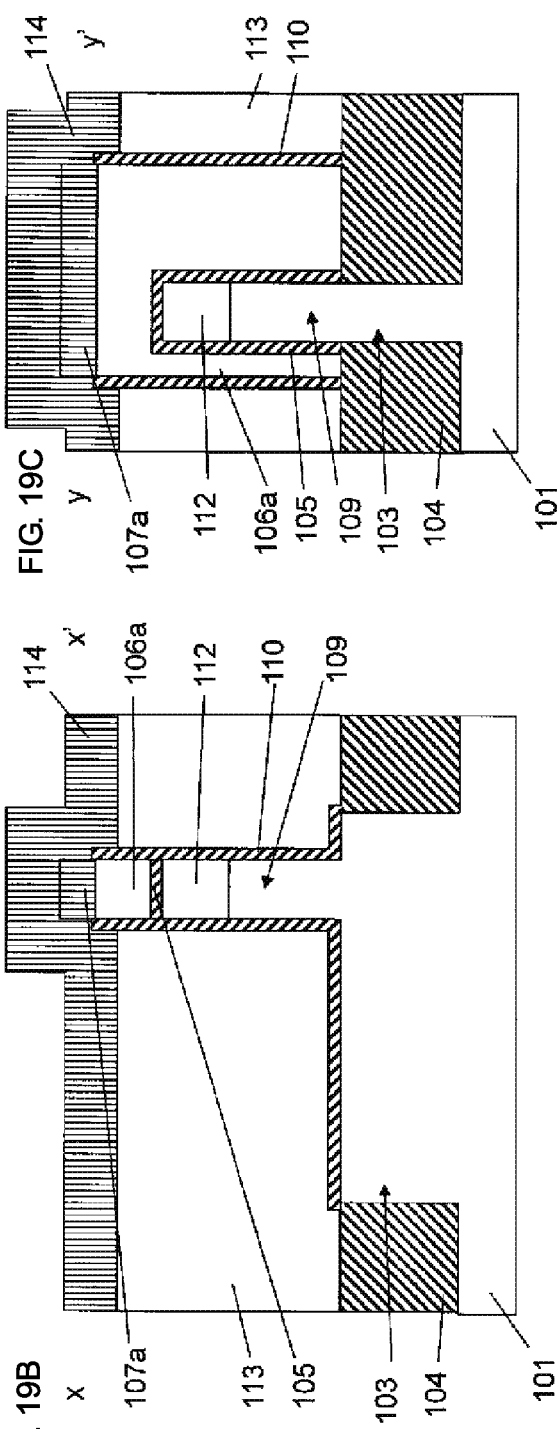
FIG. 19B is a sectional view taken along line X-X' in FIG. 19A.

As illustrated in FIGS. 19A to 19C, a sixth insulating film 114 is deposited. The sixth insulating film 114 is preferably a nitride film.

As illustrated in FIGS. 20A to 20C, the sixth insulating film 114 is etched to form a second hard mask 114a on the side wall of the first hard mask 107a.

As illustrated in FIGS. 21A to 21C, the second polysilicon 113 is etched so as to be left on the side wall of the first dummy gate 106a and on the side wall of the pillar-shaped semiconductor layer 109 to thereby form a second dummy gate 113a. The second polysilicon 113 is etched so as to have an inversely tapering shape, so that the second dummy gate 113a has a top surface and a bottom surface, the top surface having a larger area than the bottom surface. As a result, when metal is deposited to fill the hole for forming a gate, the hole is prevented from being partially unfilled.

Thus, the third step has been described, the third step including, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon so as to be left on a side wall of the first dummy gate and a side wall of the pillar-shaped semiconductor layer to form a second dummy gate.

Hereafter, a fourth step will be described, the fourth step including forming a fifth insulating film around the second dummy gate, etching the fifth insulating film so as to have a sidewall shape to form a sidewall from the fifth insulating film, forming a second diffusion layer in an upper portion of the fin-shaped semiconductor layer and a lower portion of the pillar-shaped semiconductor layer, and forming a metal-semiconductor compound on the second diffusion layer.

Figure 22A:
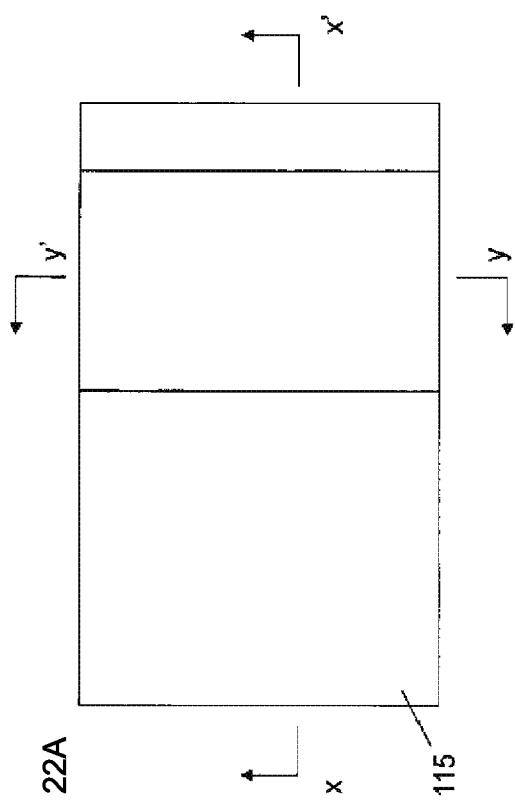
FIG. 22A is a plan view for explaining a method for producing a semiconductor device according to an embodiment of the present invention.
Figure 22C:
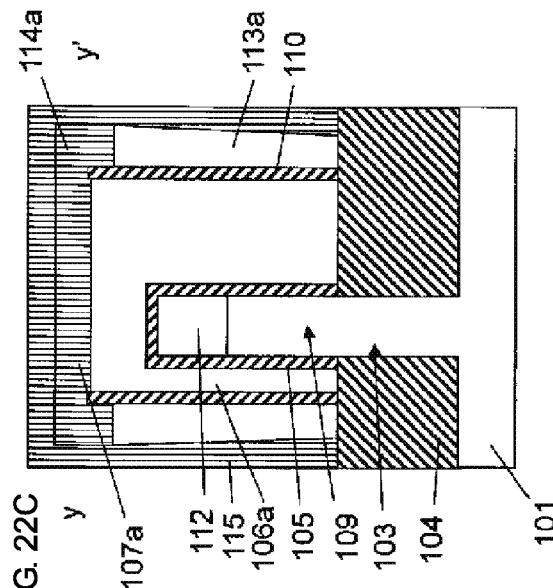
FIG. 22C is a sectional view taken along line Y-Y' in FIG. 22A.
Figure 22B:
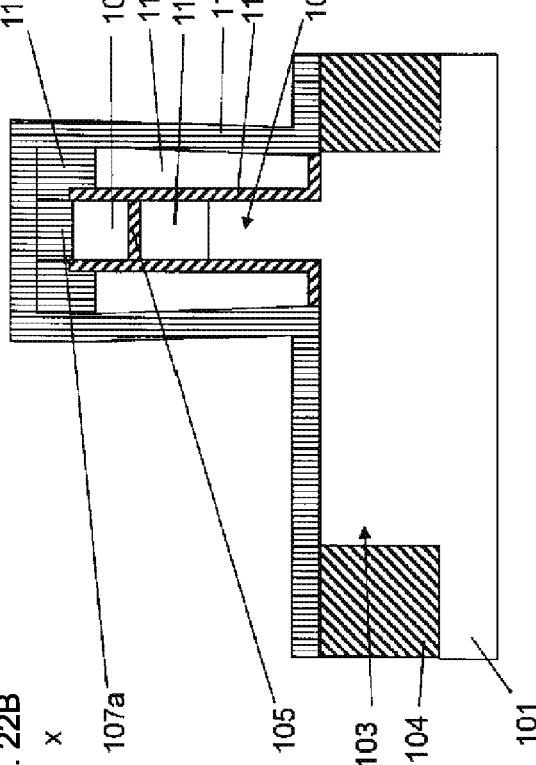
FIG. 22B is a sectional view taken along line X-X' in FIG. 22A.

As illustrated in FIGS. 22A to 22C, a fifth insulating film 115 is formed around the second dummy gate 113a. The fifth insulating film 115 is preferably a nitride film.

Figure 23A:
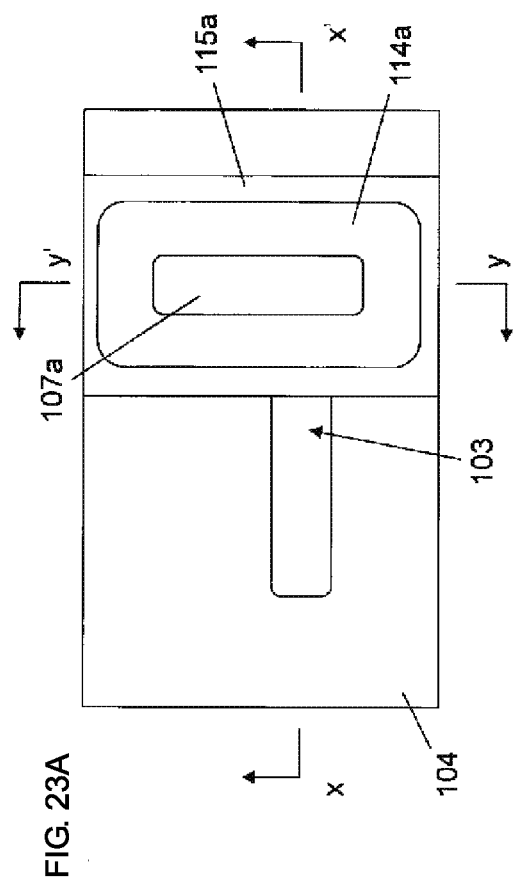
FIG. 23A is a plan view for explaining a method for producing a semiconductor device according to an embodiment of the present invention.
Figure 23B:
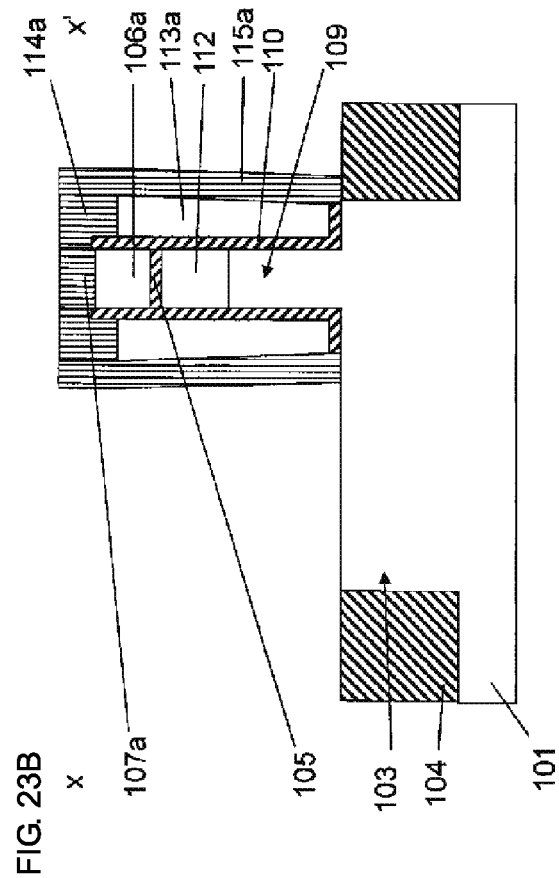
FIG. 23B is a sectional view taken along line X-X' in FIG. 23A.
Figure 23C:
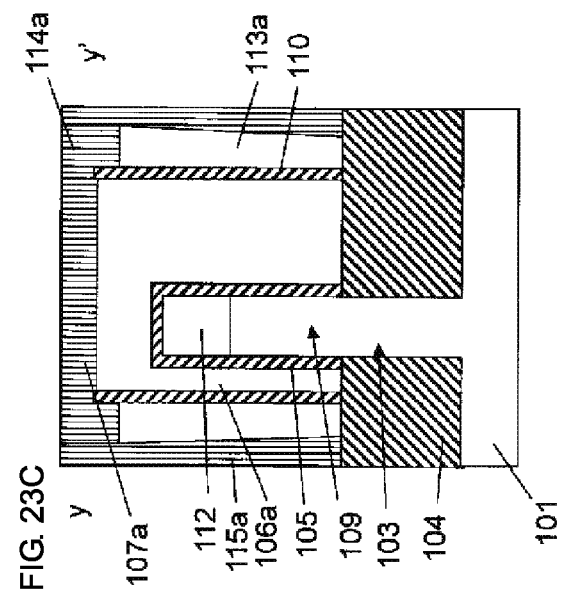
FIG. 23C is a sectional view taken along line Y-Y' in FIG. 23A.

As illustrated in FIGS. 23A to 23C, the fifth insulating film 115 is etched so as to have a sidewall shape. Thus, a sidewall 115a is formed from the fifth insulating film.

As illustrated in FIGS. 24A to 24C, an impurity is introduced to form a second diffusion layer 116 in an upper portion of the fin-shaped silicon layer 103 and in a lower portion of the pillar-shaped silicon layer 109. When an n-type diffusion layer is formed, arsenic or phosphorus is preferably introduced. When a p-type diffusion layer is formed, boron is preferably introduced.

Figure 25C:
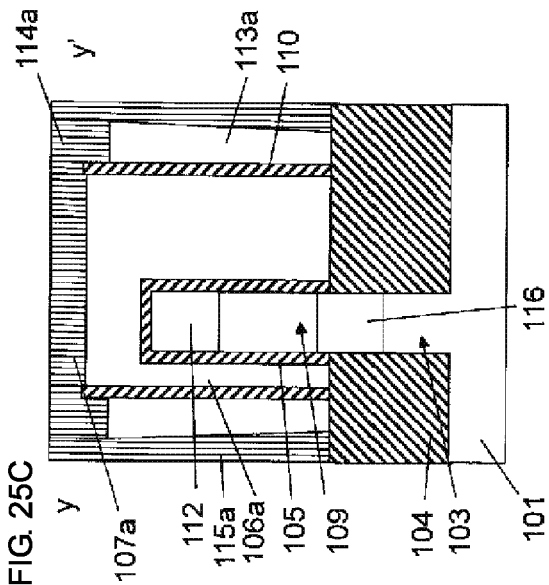
FIG. 25C is a sectional view taken along line Y-Y' in FIG. 25A.
Figure 25A:
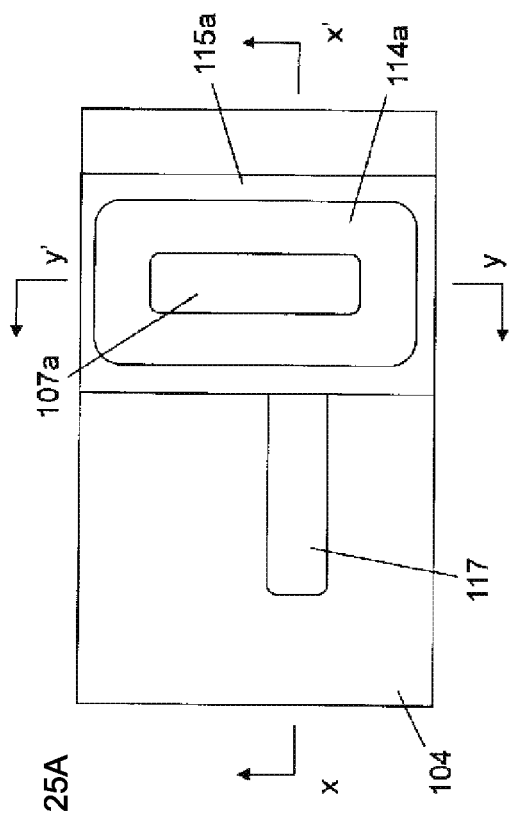
FIG. 25A is a plan view for explaining a method for producing a semiconductor device according to an embodiment of the present invention.
Figure 25B:
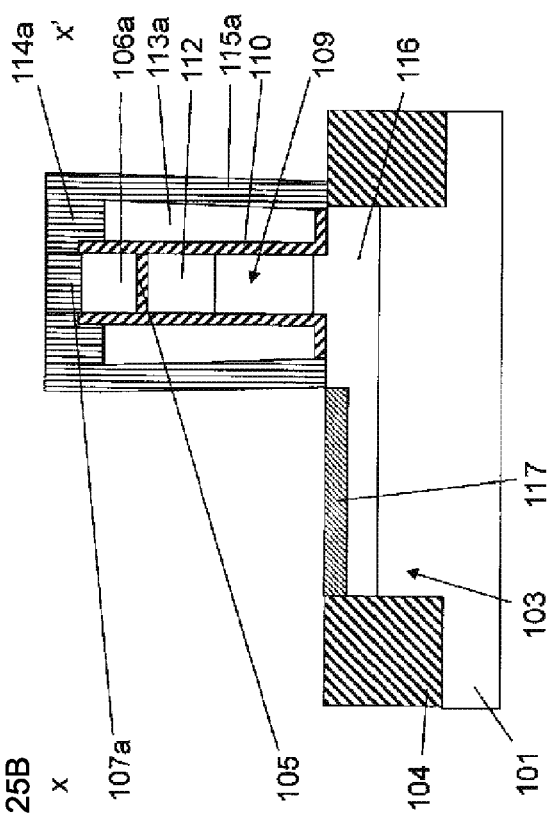
FIG. 25B is a sectional view taken along line X-X' in FIG. 25A.

As illustrated in FIGS. 25A to 25C, a metal-semiconductor compound 117 is formed on the second diffusion layer 116. During this formation, the first and second hard masks 107a and 114a prevent the metal-semiconductor compound from being formed on the first and second dummy gates 106a and 113a, so that the metal-semiconductor compound is formed on the fin-shaped semiconductor layer 103 alone.

Thus, the fourth step has been described, the fourth step including forming a fifth insulating film around the second dummy gate, etching the fifth insulating film so as to have a sidewall shape to form a sidewall from the fifth insulating film, forming a second diffusion layer in an upper portion of the fin-shaped semiconductor layer and a lower portion of the pillar-shaped semiconductor layer, and forming a metal-semiconductor compound on the second diffusion layer.

Hereafter, a fifth step will be described, the fifth step including, after the fourth step, depositing a contact stopper film, depositing an interlayer insulating film, subjecting the interlayer insulating film to chemical mechanical polishing to expose an upper portion of the second dummy gate and an upper portion of the first dummy gate, removing the second dummy gate and the first dummy gate, removing the second insulating film and the fourth insulating film, forming a gate insulating film around the pillar-shaped semiconductor layer and on an inner side of the fifth insulating film, depositing a metal, and subjecting the metal to etch back to form a gate electrode and a gate line.

As illustrated in FIGS. 26A to 26C, a contact stopper film 118 is deposited and an interlayer insulating film 119 is deposited. The contact stopper film 118 is preferably a nitride film.

As illustrated in FIGS. 27A to 27C, chemical mechanical polishing is performed to expose an upper portion of the second dummy gate 113a and an upper portion of the first dummy gate 106a.

Figure 28A:
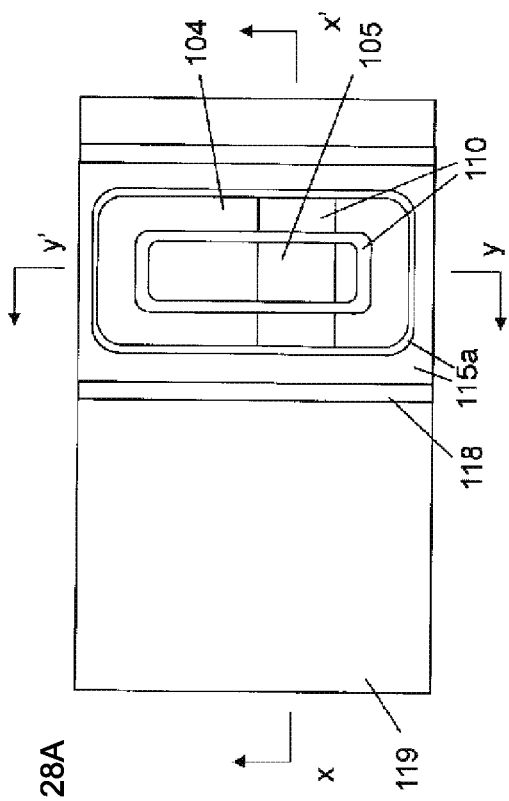
FIG. 28A is a plan view for explaining a method for producing a semiconductor device according to an embodiment of the present invention.
Figure 28C:
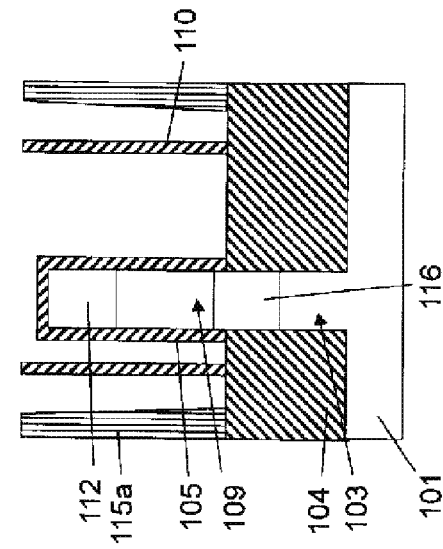
FIG. 28C is a sectional view taken along line Y-Y' in FIG. 28A.
Figure 28B:
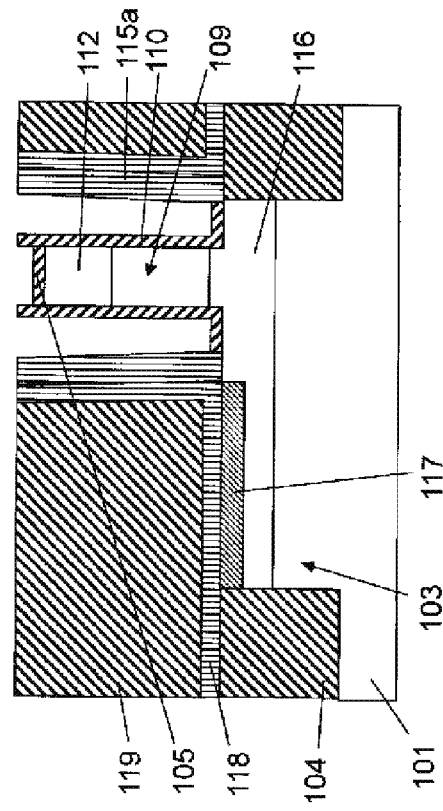
FIG. 28B is a sectional view taken along line X-X' in FIG. 28A.

As illustrated in FIGS. 28A to 28C, the second dummy gate 113a and the first dummy gate 106a are removed.

As illustrated in FIGS. 29A to 29C, the second insulating film 105 and the fourth insulating film 110 are removed.

As illustrated in FIGS. 30A to 30C, a gate insulating film 120 is formed around the pillar-shaped silicon layer 109 and on the inner side of the fifth insulating film 115a.

As illustrated in FIGS. 31A to 31C, a metal 121 is deposited.

As illustrated in FIGS. 32A to 32C, the metal 121 is subjected to etch back to expose an upper portion of the pillar-shaped silicon layer 109. Thus, a gate electrode 121a is formed around the pillar-shaped silicon layer 109 and a gate line 121b is formed. The gate insulating film 120 formed around and under the gate electrode 121a and the gate line 121b enables insulation of the gate electrode 121a and the gate line 121b from the pillar-shaped silicon layer 109 and the fin-shaped silicon layer 103.

Thus, the fifth step has been described, the fifth step including, after the fourth step, depositing a contact stopper film, depositing an interlayer insulating film, subjecting the interlayer insulating film to chemical mechanical polishing to expose an upper portion of the second dummy gate and an upper portion of the first dummy gate, removing the second dummy gate and the first dummy gate, removing the second insulating film and the fourth insulating film, forming a gate insulating film around the pillar-shaped semiconductor layer and on an inner side of the fifth insulating film, depositing a metal, and subjecting the metal to etch back to form a gate electrode and a gate line.

Figure 33C:
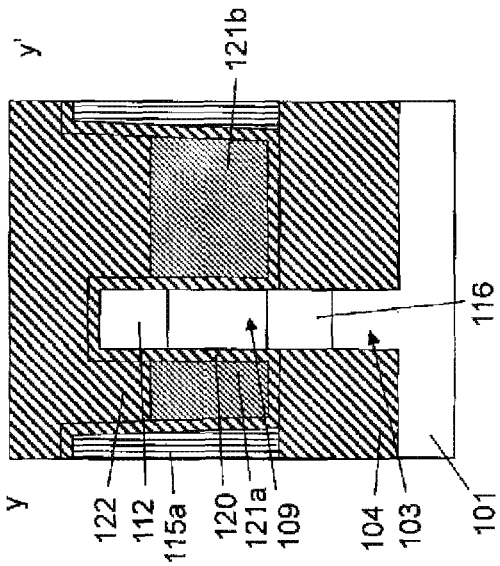
FIG. 33C is a sectional view taken along line Y-Y' in FIG. 33A.
Figure 33A:
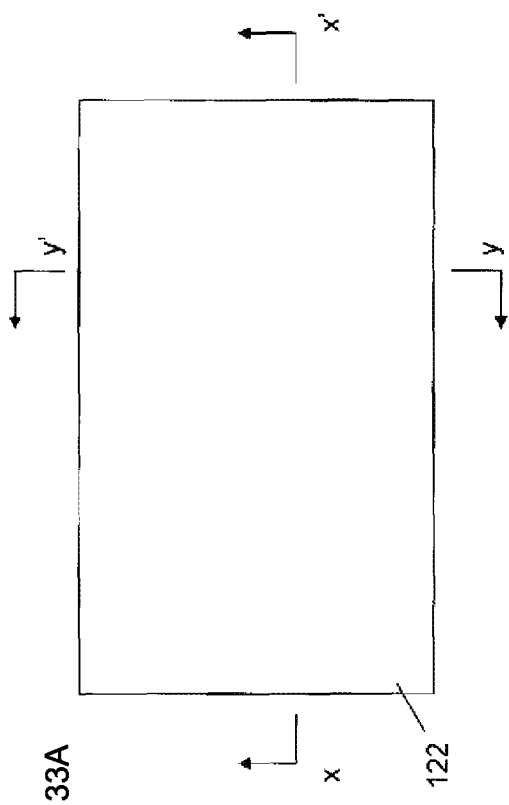
FIG. 33A is a plan view for explaining a method for producing a semiconductor device according to an embodiment of the present invention.
Figure 33B:
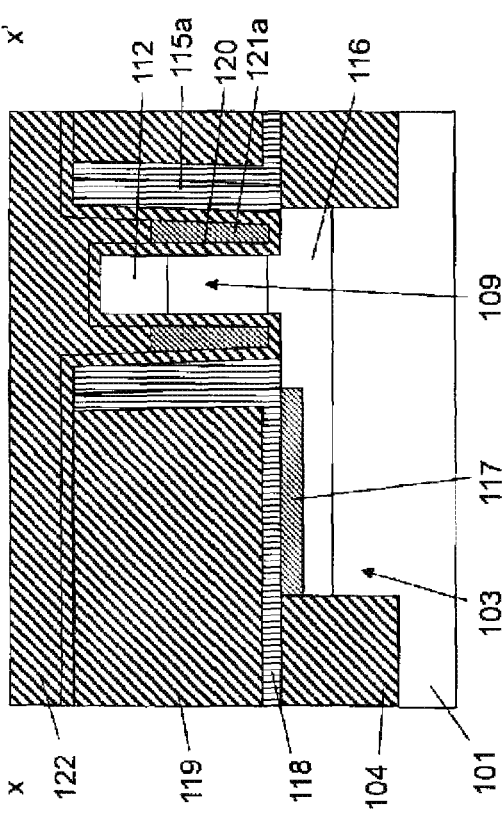
FIG. 33B is a sectional view taken along line X-X' in FIG. 33A.

As illustrated in FIGS. 33A to 33C, a second interlayer insulating film 122 is deposited.

As illustrated in FIGS. 34A to 34C, a fourth resist 123 for forming contact holes is formed.

As illustrated in FIGS. 35A to 35C, the second interlayer insulating film 122, the gate insulating film 120, and the interlayer insulating film 119 are etched to form contact holes 124 and 125.

Figure 36A:
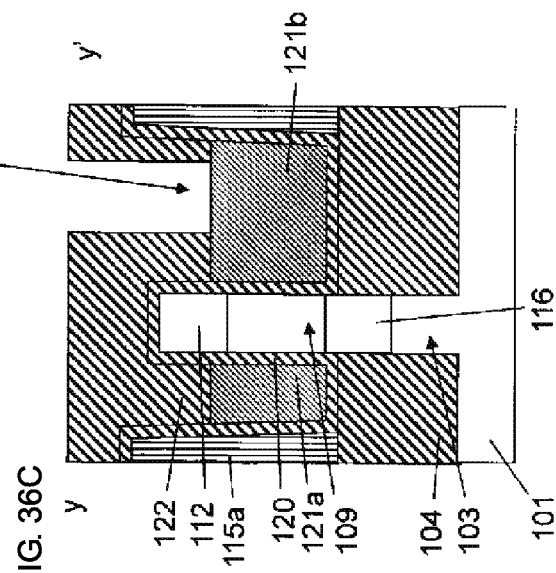
FIG. 36A is a plan view for explaining a method for producing a semiconductor device according to an embodiment of the present invention.
Figure 36B:
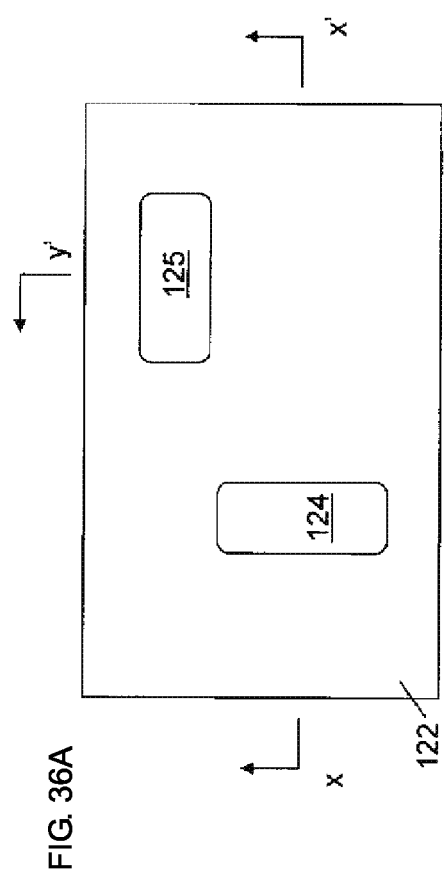
FIG. 36B is a sectional view taken along line X-X' in FIG. 36A.
Figure 36C:
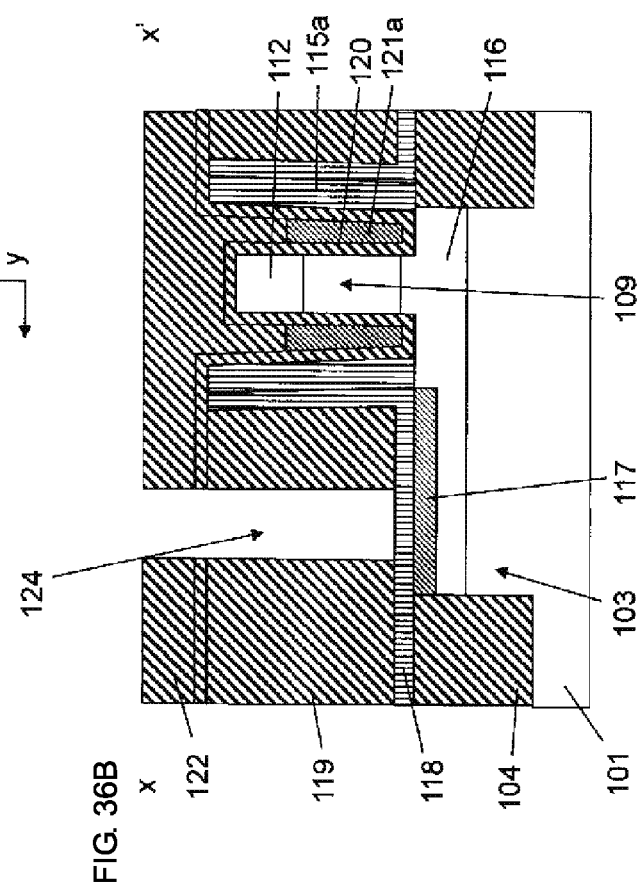
FIG. 36C is a sectional view taken along line Y-Y' in FIG. 36A.

As illustrated in FIGS. 36A to 36C, the fourth resist 123 is removed.

As illustrated in FIGS. 37A to 37C, a fifth resist 126 for forming a contact hole is formed.

As illustrated in FIGS. 38A to 38C, the second interlayer insulating film 122 and the gate insulating film 120 are etched to form a contact hole 127.

As illustrated in FIGS. 39A to 39C, the fifth resist 126 is removed.

As illustrated in FIGS. 40A to 40C, a portion of the contact stopper film 118 below the contact hole 124 is removed.

As illustrated in FIGS. 41A to 41C, a metal 128 is deposited to form contacts 129, 130, and 131.

As illustrated in FIGS. 42A to 42C, sixth resists 132, 133, and 134 for forming metal wirings are formed.

As illustrated in FIGS. 43A to 43C, the metal 128 is etched to form metal wirings 128a, 128b, and 128c.

As illustrated in FIGS. 44A to 44C, the sixth resists 132, 133, and 134 are removed.

Thus, an SGT production method has been described, the method employing a gate last process in which two masks are used to form a fin-shaped semiconductor layer, a pillar-shaped semiconductor layer, a gate electrode, and a gate line.

Figure 1C:
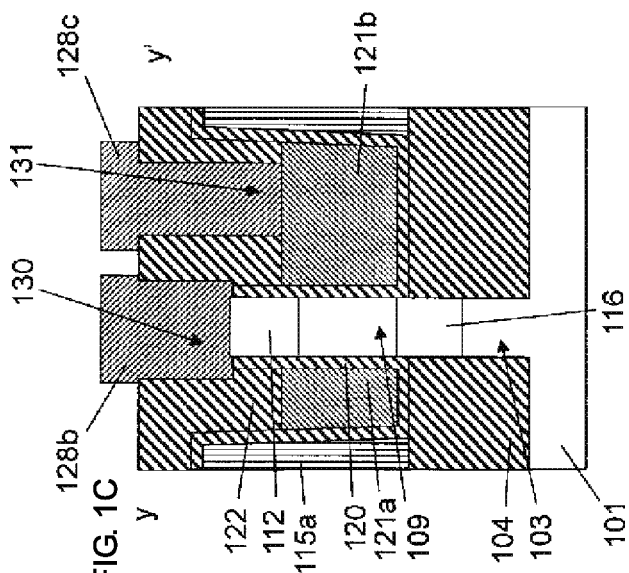
FIG. 1C is a sectional view taken along line Y-Y' in FIG. 1A.
Figure 1A:
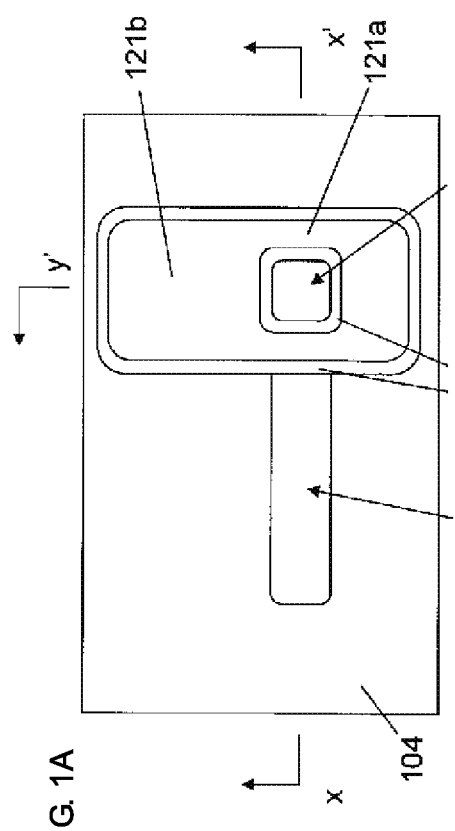
FIG. 1A is a plan view of a semiconductor device according to an embodiment of the present invention.
Figure 1B:
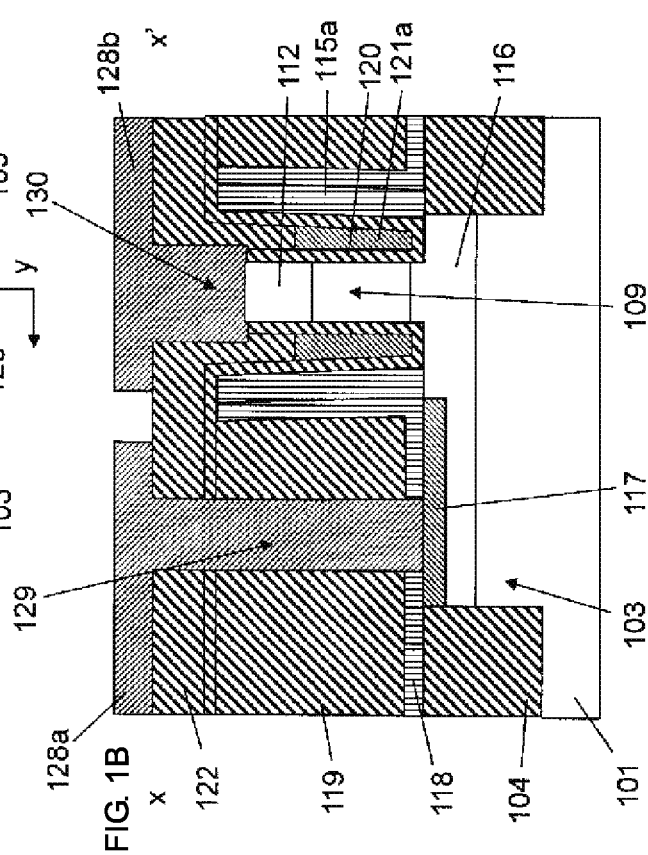
FIG. 1B is a sectional view taken along line X-X' in FIG. 1A.

FIGS. 1A to 1C illustrate the structure of a semiconductor device obtained by the above-described production method.

The semiconductor device in FIGS. 1A to 1C includes a fin-shaped silicon layer 103 formed on a silicon substrate 101; a first insulating film 104 formed around the fin-shaped silicon layer 103; a pillar-shaped silicon layer 109 formed on the fin-shaped silicon layer 103; a gate insulating film 120 formed around the pillar-shaped silicon layer 109; a gate electrode 121a formed of metal and formed around the gate insulating film 120; a gate line 121b connected to the gate electrode 121a, extending in a direction orthogonal to the fin-shaped silicon layer 103, and formed of metal; a first diffusion layer 112 formed in an upper portion of the pillar-shaped silicon layer 109; and a second diffusion layer 116 formed in an upper portion of the fin-shaped silicon layer 103 and a lower portion of the pillar-shaped silicon layer 109, wherein the gate electrode 121a has a top surface and a bottom surface, the top surface having a larger area than the bottom surface, and the gate line 121b has a top surface and a bottom surface, the top surface having a larger area than the bottom surface.

Since the pillar-shaped silicon layer 109 and the gate line 121b are formed in a self-alignment manner, misalignment therebetween is prevented.

The gate insulating film 120 formed around and under the gate electrode 121a and the gate line 121b enables insulation of the gate electrode 121a and the gate line 121b from the pillar-shaped silicon layer 109 and the fin-shaped silicon layer 103.

Note that the present invention encompasses various embodiments and modifications without departing from the broad spirit and scope of the present invention. The above-described embodiments are used to describe examples of the present invention and do not limit the scope of the present invention.

For example, a method for producing a semiconductor device in which the p-type (including p$^+$ type) and the n-type (including n$^+$ type) in the above-described embodiment are changed to the opposite conductivity types and a semiconductor device produced by this method are obviously within the technical scope of the present invention.

The invention claimed is:

1. A semiconductor device, comprising:
   a fin-shaped semiconductor layer on a semiconductor substrate and having a length extending in a first lateral direction;
   a first insulating film around the fin-shaped semiconductor layer;
   a pillar-shaped semiconductor layer on the fin-shaped semiconductor layer, the pillar-shaped semiconductor layer having a vertical sidewall;
   a gate insulating film surrounding the vertical sidewall of the pillar-shaped semiconductor layer; a metal gate electrode surrounding the vertical sidewall of the gate insulating film;
   a metal gate line connected to the gate electrode, and having a length extending in a second lateral direction perpendicular to the first lateral direction in which the fin-shaped semiconductor layer extends, wherein the gate line extends beyond the fin-shaped semiconductor later in the second lateral direction, wherein the metal gate electrode and the metal gate line comprise a metal fill structure, such that all surfaces of the metal gate electrode and the metal gate line except top surfaces thereof are surrounded by the gate insulating film;
   a first diffusion layer in an upper portion of the pillar-shaped semiconductor layer; and
   a second diffusion layer in an upper portion of the fin-shaped semiconductor layer and in a lower portion of the pillar-shaped semiconductor layer, the gate electrode and the gate line having a top surface and a bottom surface and at least one inclined side surface tapering from the top surface to the bottom surface,
   where the at least one inclined side surface of the gate electrode is on a side of the gate electrode opposite to the pillar-shaped semiconductor,
   such that the top surface of the gate electrode and the gate line have a larger area than the bottom surface of the gate electrode and the gate line.

2. A semiconductor device comprising:
   a fin-shaped semiconductor layer on a semiconductor substrate having a length extending in a first lateral direction;
   a first insulating film around the fin-shaped semiconductor layer;

a pillar-shaped semiconductor layer on the fin-shaped semiconductor layer, the pillar-shaped semiconductor layer having a vertical sidewall;

a gate insulating film surrounding and contacting the vertical sidewall of the pillar-shaped semiconductor layer and contacting the first insulating film;

a metal gate electrode surrounding the vertical sidewall of the gate insulating film;

a metal gate line connected to the gate electrode, and extending in a second lateral direction perpendicular to the first lateral direction in which the fin-shaped semiconductor layer extends, wherein the gate line extends beyond the fin-shaped semiconductor layer in the second lateral direction, the gate insulating film around outer sidewalls and underneath lower surfaces of the gate electrode and the gate line, wherein the metal gate electrode and the metal gate line comprise a metal fill structure, such that all surfaces of the metal gate electrode and the metal gate line except top surfaces thereof are surrounded by the gate insulating film;

a first diffusion layer in an upper portion of the pillar-shaped semiconductor layer; and a second diffusion layer in an upper portion of the fin-shaped semiconductor layer and in a lower portion of the pillar-shaped semiconductor layer, the gate electrode and the gate line having a top surface and a bottom surface and at least one inclined side surface tapering from the top surface to the bottom surface, where the one inclined side surface of the gate electrode is on a side of the gate electrode opposite to the pillar-shaped semiconductor, such that the top surface of the gate electrode and the gate line have a larger area than the bottom surface of the gate electrode and the gate line.

* * * * *